(12) United States Patent
Schaffer et al.

(10) Patent No.: US 8,234,778 B2
(45) Date of Patent: Aug. 7, 2012

(54) SUBSTRATE INDUCTIVE DEVICES AND METHODS

(75) Inventors: Christopher P. Schaffer, Fallbrook, CA (US); Alan Lindner, San Diego, CA (US)

(73) Assignee: Pulse Electronics, Inc., San Diego, CA (US)

( * ) Notice: Subject to any disclaimer, the term of this patent is extended or adjusted under 35 U.S.C. 154(b) by 0 days.

(21) Appl. No.: 13/185,312

(22) Filed: Jul. 18, 2011

(65) Prior Publication Data
US 2012/0011709 A1 Jan. 19, 2012

Related U.S. Application Data

(63) Continuation of application No. 12/503,682, filed on Jul. 15, 2009, now Pat. No. 7,982,572.

(60) Provisional application No. 61/135,243, filed on Jul. 17, 2008.

(51) Int. Cl.
*H01F 5/00* (2006.01)
*H01F 7/06* (2006.01)
(52) U.S. Cl. .................. 29/602.1; 336/200; 336/232
(58) Field of Classification Search .................. 336/200, 336/223, 232; 29/602.1
See application file for complete search history.

(56) References Cited

U.S. PATENT DOCUMENTS

| | | | |
|---|---|---|---|
| 3,614,554 A | 10/1971 | Shield et al. | |
| 4,253,231 A | 3/1981 | Novet | |
| 4,547,961 A | 10/1985 | Bokil et al. | |
| 4,847,986 A | 7/1989 | Meinel | |
| 5,038,104 A | 8/1991 | Wikswo et al. | |
| 5,055,816 A | 10/1991 | Altman et al. | |
| 5,126,714 A | 6/1992 | Johnson | |
| 5,220,488 A | 6/1993 | Denes | |
| 5,257,000 A | 10/1993 | Billings et al. | |
| 5,487,214 A | 1/1996 | Walters | |
| 5,736,910 A | 4/1998 | Townsend et al. | |
| 5,781,091 A | 7/1998 | Krone et al. | |
| 5,959,846 A | 9/1999 | Noguchi et al. | |
| 6,148,500 A | 11/2000 | Krone et al. | |
| 6,225,560 B1 | 5/2001 | Machado | |
| 6,332,810 B1 | 12/2001 | Bareel | |
| 6,409,547 B1 | 6/2002 | Reede | |
| 6,440,750 B1 | 8/2002 | Feygenson et al. | |
| 6,445,271 B1 | 9/2002 | Johnson | |
| 6,455,885 B1 | 9/2002 | Lin | |
| 6,642,827 B1 | 11/2003 | McWilliams et al. | |
| 6,696,910 B2 | 2/2004 | Nuytkens et al. | |
| 6,952,153 B2 | 10/2005 | Jacobson et al. | |
| 7,109,837 B2 | 9/2006 | Watts et al. | |
| 7,158,005 B2 | 1/2007 | Pleskach et al. | |
| 7,196,607 B2 | 3/2007 | Pleskach et al. | |
| 7,405,643 B2 | 7/2008 | Jeong et al. | |

(Continued)

FOREIGN PATENT DOCUMENTS
DE 12 78 006 B 9/1968
(Continued)

*Primary Examiner* — Anh Mai
(74) *Attorney, Agent, or Firm* — Gazdzinski & Associates, PC

(57) ABSTRACT

Methods and Apparatus for providing a low-cost and high-precision inductive device. In one embodiment, the inductive device comprises a plurality of vias having extended ends which replace windings disposed around a magnetically permeable core. In another embodiment, the inductive device comprises a wired center core as well as a plurality of vias having extended ends which act as windings disposed around a magnetically permeable core. In a second aspect of the invention, a method of manufacturing the aforementioned inductive devices as well as the wired core centers is disclosed.

22 Claims, 33 Drawing Sheets

U.S. PATENT DOCUMENTS

| | | |
|---|---|---|
| 7,408,434 B2 | 8/2008 | Lee et al. |
| 7,477,128 B2 | 1/2009 | Quilici et al. |
| 7,656,263 B2 | 2/2010 | Whittaker et al. |
| 2002/0158305 A1 | 10/2002 | Dalmia et al. |
| 2003/0011458 A1 | 1/2003 | Nuytkens et al. |
| 2004/0000968 A1 | 1/2004 | White et al. |
| 2004/0150502 A1 | 8/2004 | Jacobson et al. |
| 2005/0088267 A1 | 4/2005 | Watts |
| 2005/0208914 A1 | 9/2005 | Ogawa |
| 2006/0176139 A1 | 8/2006 | Pleskach et al. |
| 2006/0290457 A1 | 12/2006 | Lee et al. |
| 2007/0001796 A1 | 1/2007 | Waffenschmidt et al. |
| 2007/0063807 A1 | 3/2007 | Quilici |
| 2007/0216510 A1 | 9/2007 | Jeong et al. |
| 2008/0111226 A1 | 5/2008 | White et al. |
| 2008/0186124 A1 | 8/2008 | Schaffer |
| 2009/0002111 A1 | 1/2009 | Harrison et al. |

FOREIGN PATENT DOCUMENTS

| | | |
|---|---|---|
| EP | 0 555 994 A | 8/1993 |
| EP | 0 708 459 A | 4/1996 |
| EP | 0 756 298 A | 1/1997 |
| WO | WO 2010/065113 | 6/2010 |

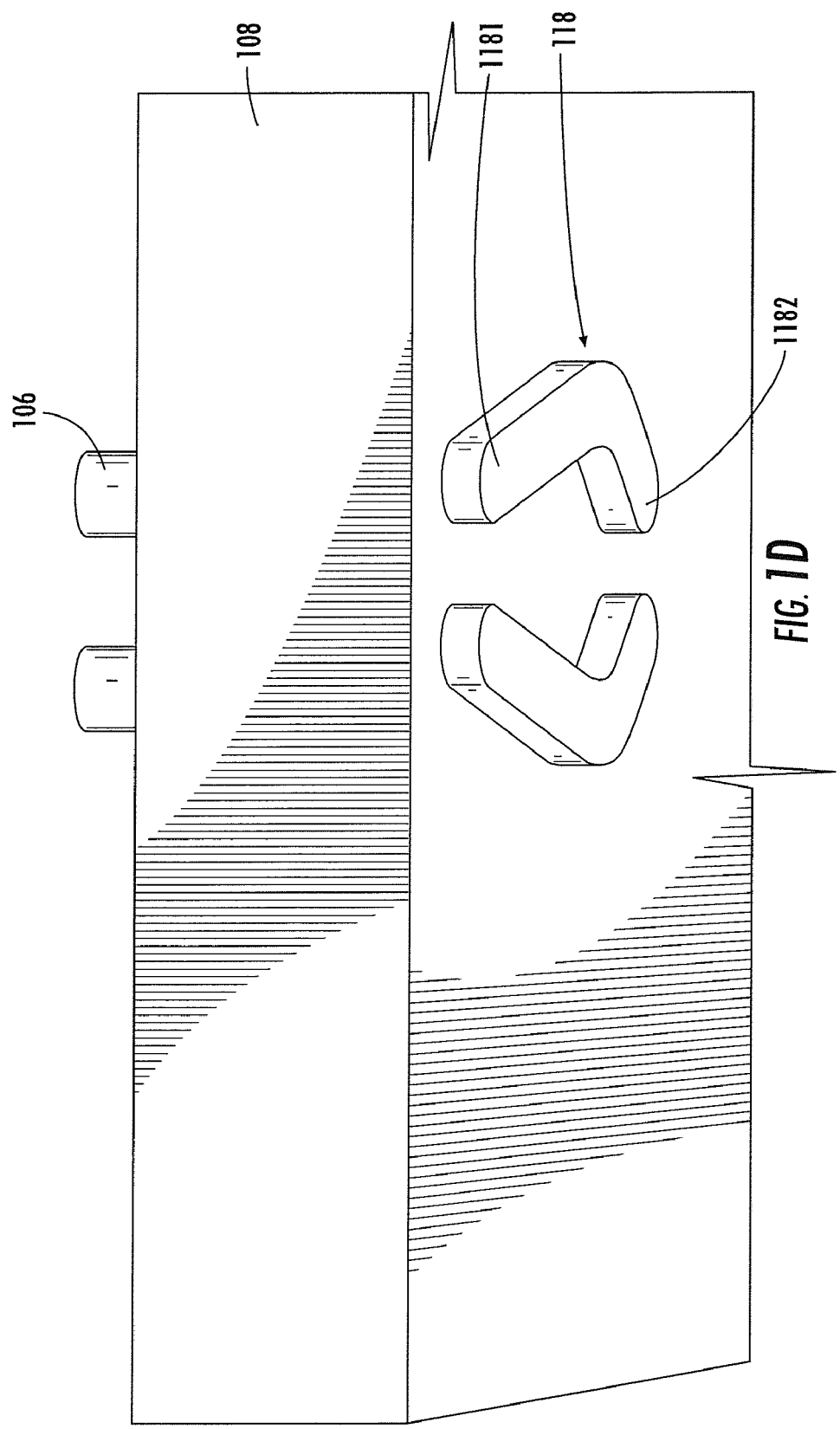

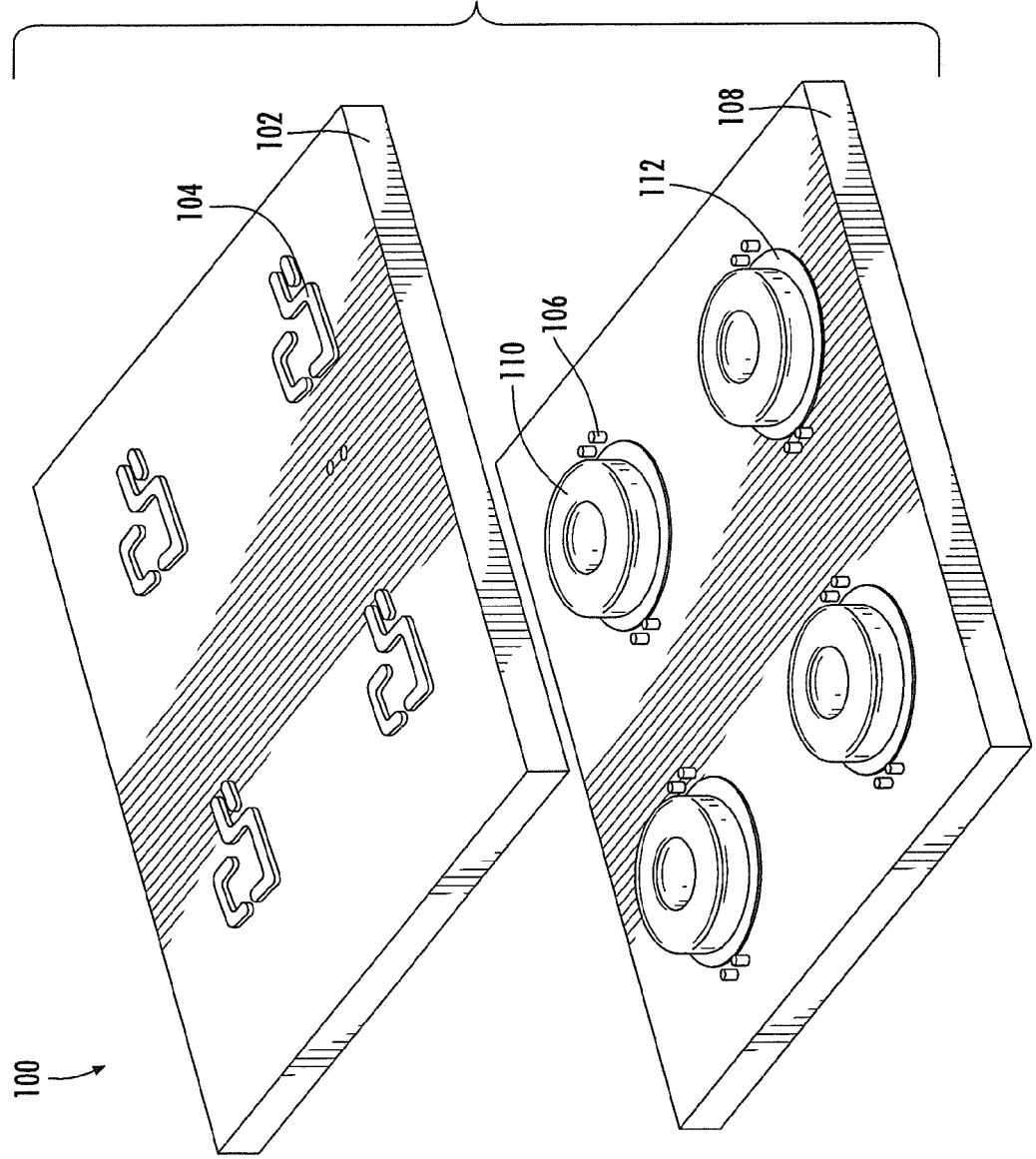

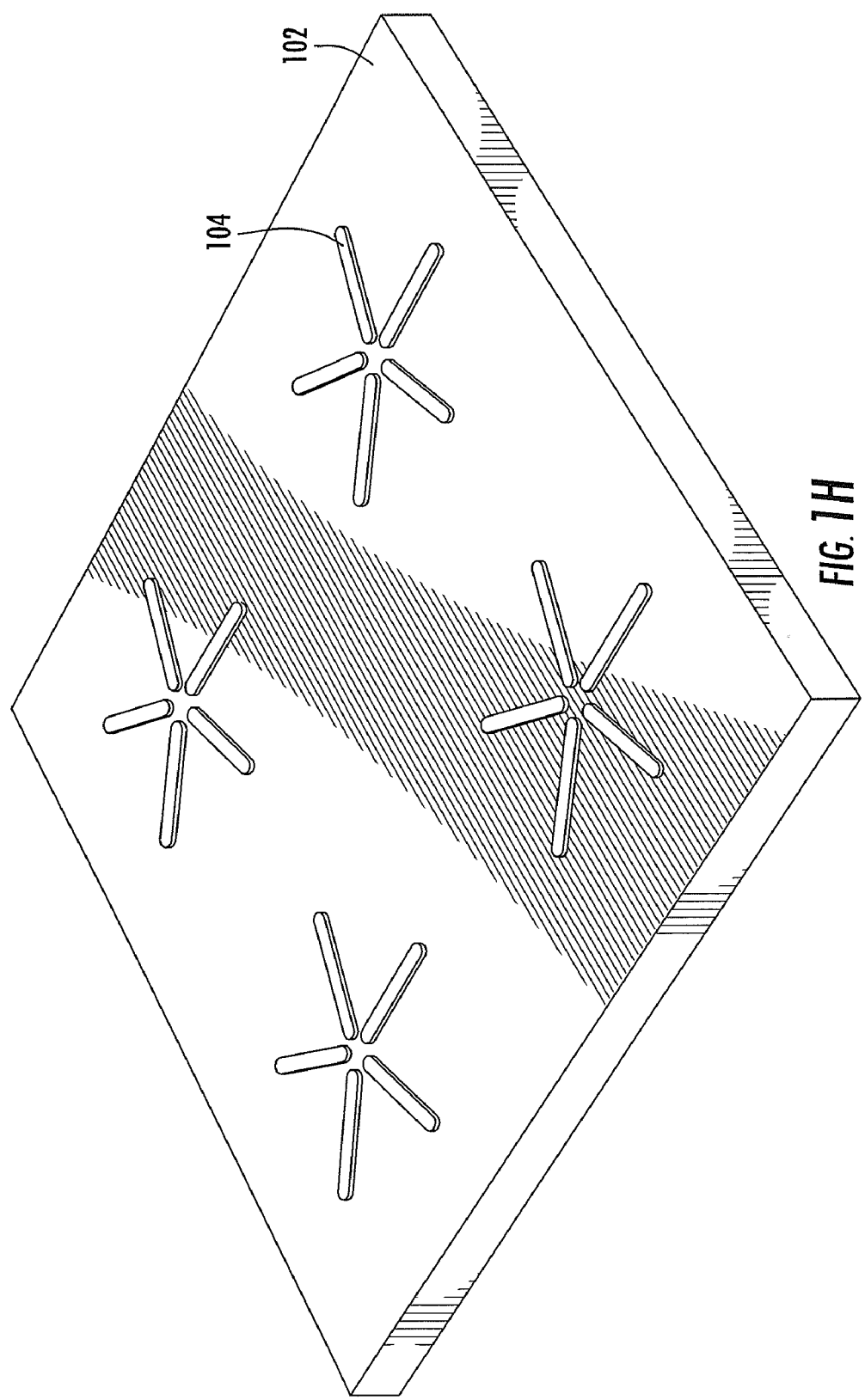

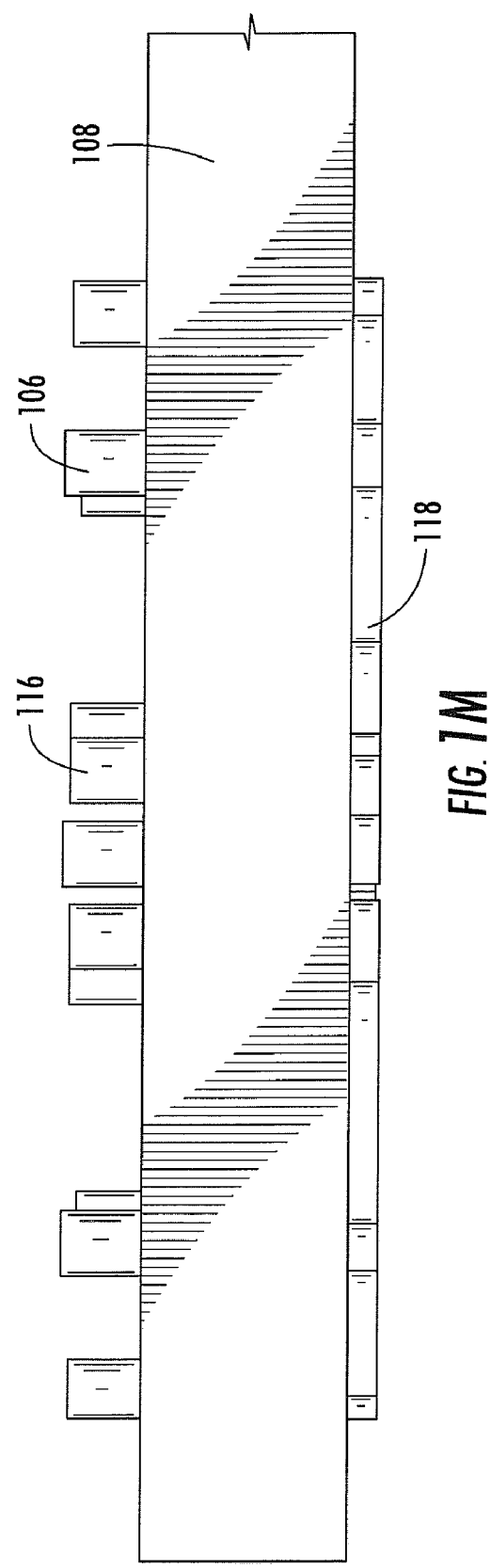

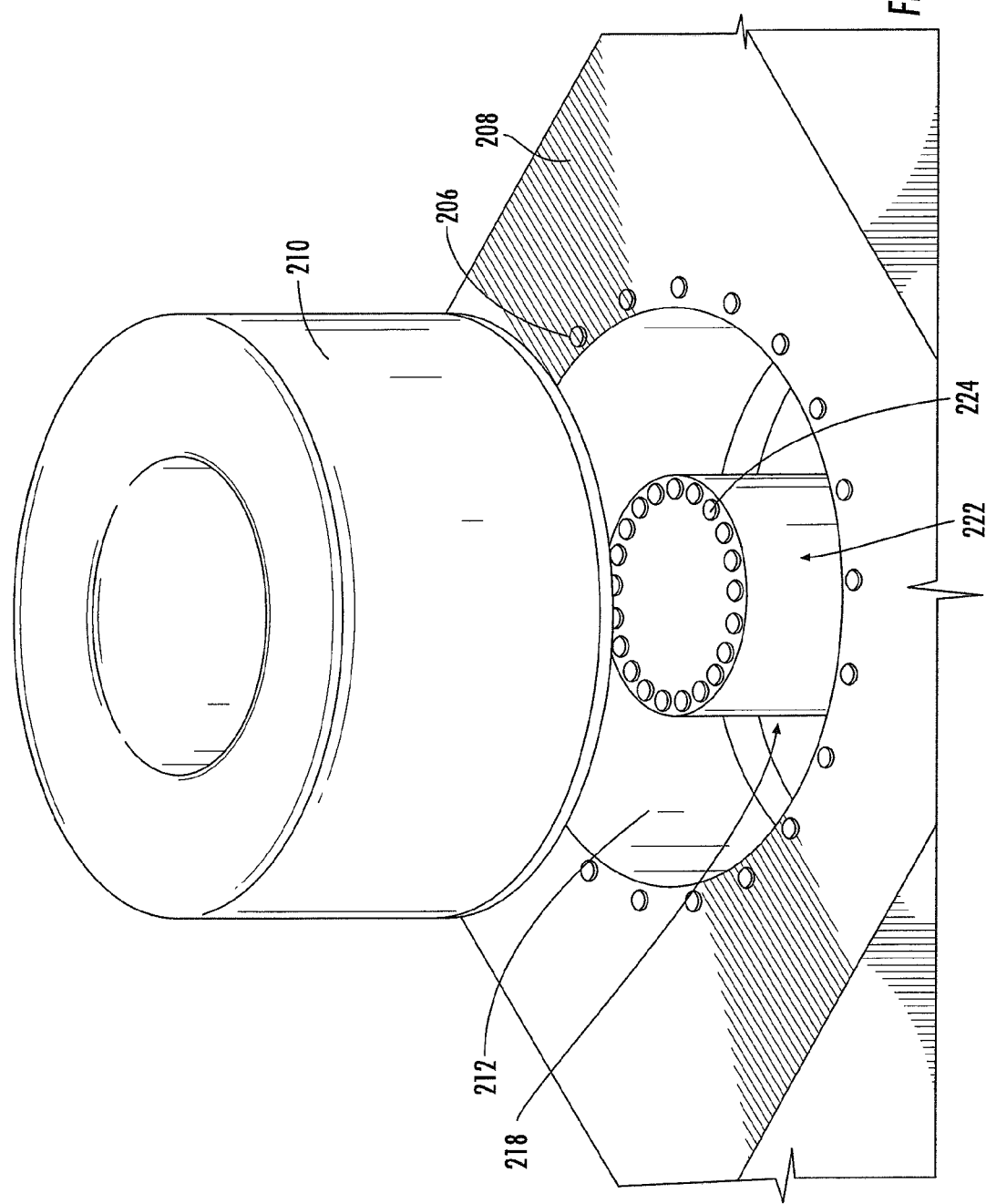

SUBSTRATE INDUCTIVE DEVICES AND METHODS

PRIORITY AND RELATED APPLICATIONS

This application claims priority to co-owned and U.S. patent application Ser. No. 12/503,682 of the same title filed Jul. 15, 2009, which claims priority to U.S. Provisional Patent Application Ser. No. 61/135,243 of the same title filed Jul. 17, 2008, each of the foregoing incorporated herein by reference in its entirety. This application is also related to co-pending and co-owned U.S. patent application Ser. No. 11/985,156 filed Nov. 13, 2007 and entitled "WIRE-LESS INDUCTIVE DEVICES AND METHODS", which claims the benefit of priority to co-owned U.S. Patent Provisional Application Ser. No. 60/859,120 filed Nov. 14, 2006 of the same title, each of the foregoing incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. FIELD OF THE INVENTION

The present invention relates generally to circuit elements and more particularly in one exemplary aspect to inductors or inductive devices having various desirable electrical and/or mechanical properties, and methods of utilizing and manufacturing the same.

2. DESCRIPTION OF RELATED TECHNOLOGY

A myriad of different configurations of inductors and inductive devices are known in the prior art. One common approach to the manufacture of efficient inductors and inductive devices is the use of a magnetically permeable toroidal core. Toroidal cores are very efficient at maintaining the magnetic flux of an inductive device constrained within the core itself. Typically these cores (toroidal or not) are wound with one or more magnet wire windings thereby forming an inductor or an inductive device.

Prior art inductors and inductive devices are exemplified in a wide variety of shapes and manufacturing configurations. See for example, U.S. Pat. No. 3,614,554 to Shield, et al. issued Oct. 19, 1971 and entitled "Miniaturized Thin Film Inductors for use in Integrated Circuits"; U.S. Pat. No. 4,253,231 to Nouet issued Mar. 3, 1981 and entitled "Method of making an inductive circuit incorporated in a planar circuit support member"; U.S. Pat. No. 4,547,961 to Bokil, et al. issued Oct. 22, 1985 and entitled "Method of manufacture of miniaturized transformer"; U.S. Pat. No. 4,847,986 to Meinel issued Jul. 18, 1989 and entitled "Method of making square toroid transformer for hybrid integrated circuit"; U.S. Pat. No. 5,055,816 to Altman, et al. issued Oct. 8, 1991 and entitled "Method for fabricating an electronic device"; U.S. Pat. No. 5,126,714 to Johnson issued Jun. 30, 1992 and entitled "Integrated circuit transformer"; U.S. Pat. No. 5,257,000 to Billings, et al. issued Oct. 26, 1993 and entitled "Circuit elements dependent on core inductance and fabrication thereof"; U.S. Pat. No. 5,487,214 to Walters issued Jan. 30, 1996 and entitled "Method of making a monolithic magnetic device with printed circuit interconnections"; U.S. Pat. No. 5,781,091 to Krone, et al. issued Jul. 14, 1998 and entitled "Electronic inductive device and method for manufacturing"; U.S. Pat. No. 6,440,750 to Feygenson, et al. issued Aug. 27, 2002 and entitled "Method of making integrated circuit having a micromagnetic device"; U.S. Pat. No. 6,445,271 to Johnson issued Sep. 3, 2002 and entitled "Three-dimensional micro-coils in planar substrates"; U.S. Patent Publication No. 20060176139 to Pleskach; et al. published Aug. 10, 2006 and entitled "Embedded toroidal inductor"; U.S. Patent Publication No. 20060290457 to Lee; et al. published Dec. 28, 2006 and entitled "Inductor embedded in substrate, manufacturing method thereof, micro device package, and manufacturing method of cap for micro device package"; U.S. Patent Publication No. 20070001796 to Waffenschmidt; et al. published Jan. 4, 2007 and entitled "Printed circuit board with integrated inductor"; and U.S. Patent Publication No. 20070216510 to Jeong; et al. published Sep. 20, 2007 and entitled "Inductor and method of forming the same".

However, despite the broad variety of prior art inductor configurations, there is a salient need for inductive devices that are both: (1) low in cost to manufacture; and (2) offer improved electrical performance over prior art devices. Ideally such a solution would not only offer very low manufacturing cost and improved electrical performance for the inductor or inductive device, but also provide greater consistency between devices manufactured in mass production; i.e., by increasing consistency and reliability of performance by limiting opportunities for manufacturing errors of the device.

SUMMARY OF THE INVENTION

In a first aspect of the invention, an improved wire-less toroidal inductive device is disclosed. In one embodiment, the inductive device comprises a plurality of vias having extended ends with these vias acting as portions of windings disposed around a magnetically permeable core. Traces located on conductive layers of a substrate are then printed to complete the windings. In yet another embodiment, the wire-less toroidal inductive device is self-leaded. In another embodiment, mounting locations for electronic components are supplied on the aforementioned inductive device.

In another embodiment, the wire-less inductive device comprises: a plurality of substrates, said substrates having one or more windings fowled thereon; and a magnetically permeable core, the core disposed at least partly between the plurality of printable substrates.

In a second aspect of the invention, a method of manufacturing the aforementioned inductive devices are disclosed.

In a third aspect of the invention, an electronics assembly and circuit comprising the wire-less toroidal inductive device are disclosed.

In a fourth aspect of the invention, an improved wire-less non-toroidal inductive device is disclosed. In one embodiment, the non-toroidal inductive device comprises a plurality of vias having extended ends which act as portions of windings disposed around a magnetically permeable core. Printed windings located on conductive layers of a substrate are then printed to complete the windings. In another embodiment, the inductive device comprises a plurality of connection inserts which act as portions of windings disposed around a magnetically permeable core. In yet another embodiment, the wire-less non-toroidal inductive device is self-leaded. In yet another embodiment, mounting locations for electronic components are supplied on the aforementioned inductive device.

In a fifth aspect of the invention, a method of manufacturing the aforementioned non-toroidal inductive device is disclosed. In one embodiment, the method comprises: disposing winding material onto a first and second substrate header; disposing a core at least partly between the first and second headers; and joining the first and second headers thereby forming said wire-less inductive device.

In a sixth aspect of the invention, an electronics assembly and circuit comprising the wire-less non-toroidal inductor is disclosed.

In a seventh aspect of the invention a partially wired toroidal inductive device is disclosed. In one embodiment, the inductive device comprises a plurality of vias having extended ends acting in concert with a wired core center to form portions of windings disposed around a magnetically permeable core. Traces located on conductive layers of a substrate are then printed to complete the windings. In yet another embodiment, the partially wired toroidal inductive device is self-leaded. In yet another embodiment, mounting locations for electronic components are supplied on the aforementioned inductive device.

In another embodiment, the partially wired inductive device comprises: a plurality of substrates, said substrates having one or more windings formed thereon; and a magnetically permeable core, the core disposed at least partly between the plurality of printable substrates.

In an eighth aspect of the invention, a method of manufacturing the aforementioned partially wired inductive devices are disclosed.

In a ninth aspect of the invention, a method of manufacturing the aforementioned wired core centers is disclosed.

In a tenth aspect of the invention, an electronics assembly and circuit comprising the partially wired toroidal inductive device are disclosed.

In an eleventh aspect of the invention, an improved partially wired non-toroidal inductive device is disclosed. In one embodiment, the non-toroidal inductive device comprises a plurality of vias having extended ends which act as portions of windings disposed around a magnetically permeable core. Printed windings located on conductive layers of a substrate are then printed to complete the windings. In another embodiment, the inductive device comprises a plurality of vias having extended ends acting in concert with a wired core center to form portions of windings disposed around a magnetically permeable core. In yet another embodiment, the partially wired non-toroidal inductive device is self-leaded. In yet another embodiment, mounting locations for electronic components are supplied on the aforementioned inductive device.

In a twelfth aspect of the invention, a wire-less inductive device is disclosed. In one embodiment, the inductive device comprises a plurality of substrates, each comprised of an exterior surface which is at least partly copper plated. The substrates have one or more windings formed thereon and further comprise a plurality of extended conductors. At least a portion of the extended conductors extend from the exterior copper plated surface and through the substrate. A magnetically permeable core is then disposed at least partly between the substrates.

In another embodiment, the extended conductors of a first substrate extend above an interior surface of the first substrate and mate with corresponding ones of the extended conductors of a second substrate.

In yet another embodiment, the windings and the extended conductors are physically separated from the magnetically permeable core.

In yet another embodiment, at least three substrates are utilized in the inductive device. These substrates comprise a top substrate, a bottom substrate and one or more middle substrates.

In yet another embodiment, at least one of the substrates further comprises an incorporated electronic component.

In yet another embodiment, the inductive device includes a second magnetically permeable core. The two cores in combination with the substrates and an incorporated electronic component form a complete filter circuit.

In yet another embodiment, a capacitive structure is disposed within at least one of the substrates. The capacitive structure comprises a number of substantially parallel capacitive plates placed in a layered configuration.

In a thirteenth aspect of the invention, a method of manufacturing a wire-less inductive device is disclosed. In one embodiment, the method comprises disposing conductive windings onto a first and second substrate header, disposing a core between the headers and joining the headers via the use of extended ends that extend from the surfaces of their respective substrate headers thereby forming the wire-less inductive device.

In another embodiment, the method further comprises forming the substrate headers such that they are substantially identical to one another so that they comprise at least two degrees of achirality.

In yet another embodiment, the windings are disposed with at least two different defined angular spacings.

In yet another embodiment, the method includes disposing a self-leaded contact on at least one of the substrate headers.

In yet another embodiment, the inductive device is underfilled to increase resistance to high potential voltages.

In a fourteenth aspect of the invention, a partially wired inductive device is disclosed. In one embodiment the inductive device comprises a plurality of substrates, each having conductive pathways formed thereon. The inductive device also includes a wired core center and a magnetically permeable core that is disposed at least partly between the printable substrates.

In another embodiment, the wired core center comprises a molded bundle of magnet wires.

In yet another embodiment, the inductive device includes outer winding vias disposed in each of the substrates. In a variant, the substrates further comprise extended vias that interconnect the substrates. In yet another variant, the outer winding vias are in electrical communication with the wired core center via the conductive pathways formed on the substrates.

In a fifteenth aspect of the invention, a method of manufacturing a partially wired inductive device is disclosed. In one embodiment, the method comprises disposing a winding material in electrical communication with a first and a second substrate header. At least a portion of the winding material comprises a wired core center. A core is disposed at least partly between the headers and headers are joined thereby forming the inductive device.

In a variant, the wired core center is formed by obtaining magnet wire, molding the magnet wires and subsequently cleaving the molded magnet wire. In yet another variant, the wired core center encases the molded magnet wires with a jacketing material.

In a sixteenth aspect of the invention, a wire-less inductive device is disclosed. In one embodiment, the inductive device comprises a first substrate comprised of an exterior surface which is at least partly conductively plated. The first substrate has one or more winding portions and extended conductors extending from the exterior of the conductively plated surface and through the substrate so as to be elevated above an interior surface of the first substrate. A second substrate comprised of an exterior surface which is at least partly conductively plated has winding portions formed thereon and further includes respective extended conductors. At least a portion of the extended conductors of the second substrate extend from the exterior conductively plated surface and through the second substrate so as to be elevated above an interior surface of the second substrate. A magnetically permeable core is also included that is disposed at least partly between the first and second substrates. When the wire-less device is assembled, the first extended conductors are each in electrical communication with corresponding ones of the second extended conductors, thereby forming electrical pathways around the core.

In another embodiment, a second magnetically permeable core is included which in combination with the substrates, an incorporated electronic component, and the first magnetically permeable core forms a complete filter circuit.

In yet another embodiment, the wire-less inductive device comprises a capacitive structure disposed within at least one of the substrates. The capacitive structure comprises capacitive plates placed substantially parallel to one another in a layered configuration.

In yet another embodiment, at least one of the first and second substrates comprises a recess adapted to receive at least a portion of the core.

In yet another embodiment, the extended conductors of both the substrates are disposed in a substantially concentric fashion both inside and outside of the radius of the recess so as to form inner and outer rings of extended conductors around the recess.

BRIEF DESCRIPTION OF THE DRAWINGS

The features, objectives, and advantages of the invention will become more apparent from the detailed description set forth below when taken in conjunction with the drawings, wherein:

FIG. 1d is a perspective view illustrating the electrical pathway connecting the windings of the inductive device of FIG. 1.

FIG. 1g is a perspective view illustrating a wire-less multi-toroidal inductive device in accordance with the principles of the present invention.

FIG. 1h is a perspective view of the top header of the multi-toroidal inductive device of FIG. 1g.

FIG. 1i is a perspective view of the bottom header of the multi-toroidal inductive device of FIG. 1g.

FIG. 1m is a side elevational view of the bottom header of the multi-toroidal inductive device of FIG. 1l.

FIG. 1n is a perspective view of the underside of the bottom header of the multi-toroidal inductive device of FIG. 1l illustrating the electrical pathways between the extended end vias.

FIG. 1o is a perspective view of the underside of the bottom header of the multi-toroidal inductive device of FIG. 1l illustrating the electrical pathways connecting the vias.

Figure 1:
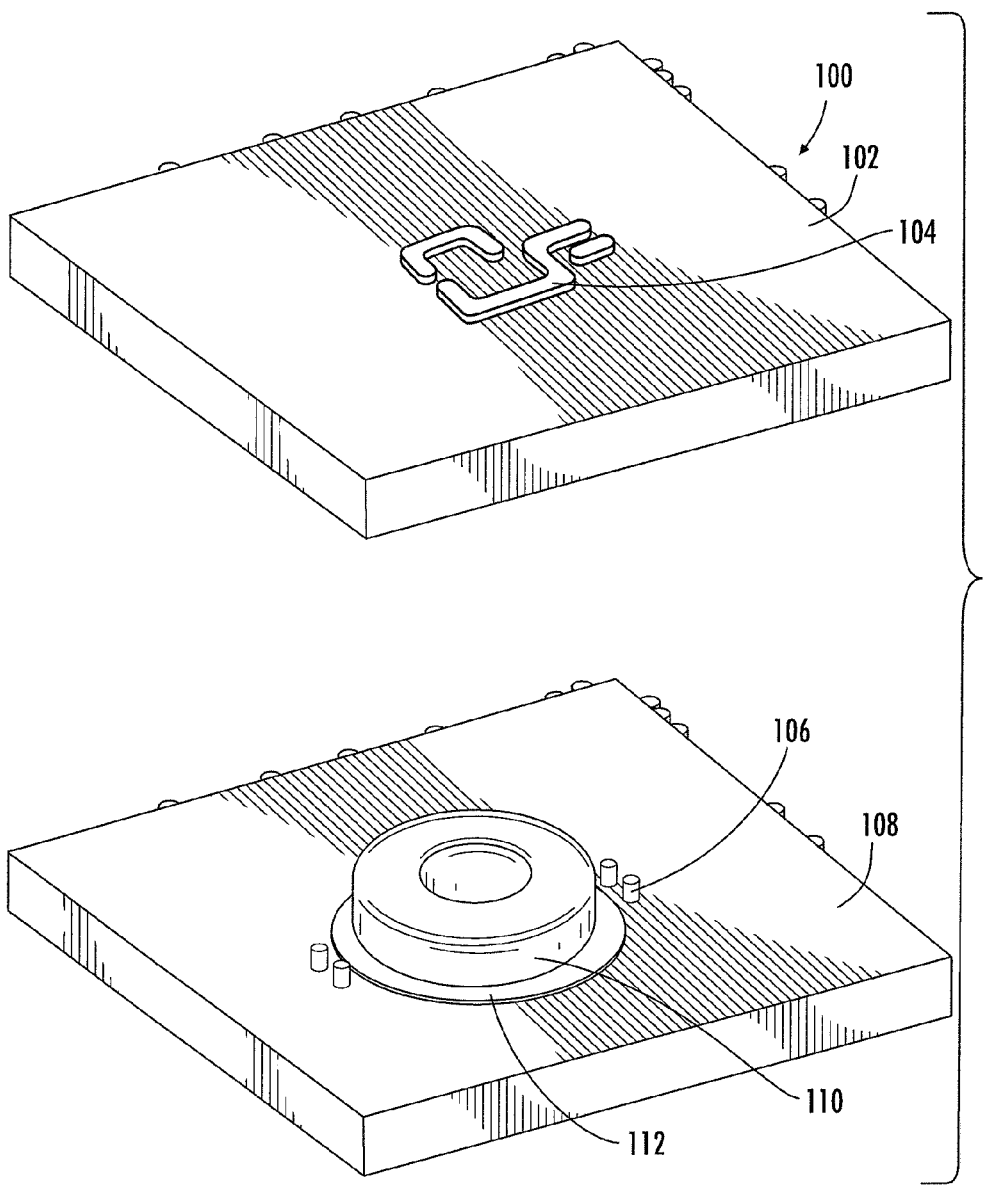
FIG. 1 is a perspective exploded view illustrating a first embodiment of a wire-less toroidal inductive device in accordance with the principles of the present invention.

All Figures disclosed herein are Copyright 2007 Pulse Engineering, Inc. All rights reserved.

DETAILED DESCRIPTION OF THE PREFERRED EMBODIMENT

Reference is now made to the drawings wherein like numerals refer to like parts throughout.

As used herein, the term "integrated circuit" shall include any type of integrated device of any function, whether single or multiple die, or small or large scale of integration, including without limitation applications specific integrated circuits (ASICs), field programmable gate arrays (FPGAs), digital processors (e.g., DSPs, CISC microprocessors, or RISC processors), and so-called "system-on-a-chip" (SoC) devices.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "magnetically permeable" refers to any number of materials commonly used for forming inductive cores or similar components, including without limitation various formulations made from ferrite.

As used herein, the terms "top", "bottom", "side", "up", "down" and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

Overview

The present invention provides, inter alia, improved low cost inductive apparatus and methods for manufacturing, and utilizing, the same.

In the electronics industry, as with many industries, the costs associated with the manufacture of various devices are directly correlated to the costs of the materials, the number of components used in the device, and/or the complexity of the assembly process. Therefore, in a highly cost competitive environment such as the electronics industry, the manufacturer of electronic devices with designs that minimize cost (such as by minimizing the cost factors highlighted above) will maintain a distinct advantage over competing manufacturers.

One such device comprises those having a wire-wound magnetically permeable core. These prior art inductive devices, however, suffer from electrical variations due to, among other factors: (1) non-uniform winding spacing and distribution; and (2) operator error (e.g., wrong number of turns, wrong winding pattern, misalignment, etc.). Further, such prior art devices are often incapable of efficient integration with other electronic components, and/or are subject to manufacturing processes that are highly manual in nature, resulting in higher yield losses and driving up the cost of these devices.

The present invention seeks to minimize costs by, inter alia, eliminating these highly manual prior art processes (such as manual winding of a toroid core), and improving electrical performance by offering a method of manufacture which can control e.g. winding pitch, winding spacing, number of turns, etc. automatically and in a highly uniform fashion. Hence, the present invention provides apparatus and methods that not only significantly reduce or even eliminate the "human" factor in precision device manufacturing (thereby allowing for greater performance and consistency), but also significantly reduce the cost of producing the device.

In one exemplary embodiment, an improved "wire-less" inductive device is disclosed. The inductive device comprises at least one header element having a plurality of through-hole vias. In a variant of the above mentioned "wire-less" inductive device embodiment, the vias advantageously comprise extended ends that are associated with the through-hole vias which, when completed, act as portions of windings disposed around a magnetically permeable core. Printed (etched) winding portions are also applied onto the header, thereby completing the "windings" disposed around a magnetically permeable core.

In yet another embodiment, substantially planar and parallel plate structures are used for, inter cilia, capacitive effects.

DETAILED DESCRIPTION OF EXEMPLARY EMBODIMENTS

Detailed descriptions of the various embodiments and variants of the apparatus and methods of the invention are now provided.

Wire-Less Toroidal Inductive Device—

Referring now to FIG. 1, a first exemplary embodiment of the present invention is shown and described in detail. It will be recognized that while the following discussion is cast in terms of an inductor, the invention is equally applicable to other inductive devices (including without limitation choke coils, inductive reactors, transformers, filters, and the like). These and other applications will be discussed more fully herein below.

The inductive device 100 of FIG. 1 comprises a magnetically permeable toroidal core 110 and two wire-less substrate headers 102, 108. As previously alluded to above, the term wire-less used in this context, refers to the fact that the inductive device 100 of the present invention does not require magnet wire windings disposed about a toroidal core, as is conventional in the prior art, and not to a complete obviation of any sort of windings as might be suggested by the terminology. It should also be noted that while primarily discussed with reference to toroidal cores (due in large part to their commonality of use throughout the industry), it is recognized that any number of core shapes (i.e. rectangular, binocular, triangular, etc.) of the type well known in the art could be readily substituted in place of the toroidal core discussed herein. In fact, it is recognized that literally any shape could be utilized, with proper adaptation, as would be understood by one of ordinary skill given the present disclosure.

The present embodiment illustrated in FIG. 1 incorporates its windings onto one or more printable and/or etchable substrate headers and in some configurations (such as that shown in FIG. 1); these windings are accomplished by way of through-hole vias comprising extended ends. A via having an "extended end" is similar to a traditional through-hole via well known in the art which comprises a plated hole (which may be electroplated or riveted) in a printed circuit board or other substrate connecting copper or other conductive material tracks or passages from one layer of the board to other layers of the substrate. However, in the "extended end" vias, the plated portions extend beyond the surface of the plated hole and penetrate the substrate surface. The extended ends provide advantages over wire wound prior art devices which will be discussed more fully herein below. It should be noted however that although the following discussion is cast primarily in terms of inductive device embodiments comprising extended end vias, the use of traditional through-hole vias is also contemplated, with such adaptations being readily implemented by one of ordinary skill given the present disclosure. The use of an extended end via configuration solves inter cilia the common problem in inductive device design where low-density vias are required to extend through an inductive device having a substrate (including a PCB) with a high aspect ratio. Low density vias are larger in size, thus limiting the quantity that may be placed on a single inductive device. Accordingly, some embodiments of the present invention seek to address this shortcoming by providing an inductive device comprised of high-density vias by extending the conductors above the surface of the substrate, i.e. extending the end of the via. The extended end vias may be placed on a substrate in a manner similar to solder bump loading, via a photo imagable material process, or yet other techniques. Other methods and materials known to those of skill in the art used could also be readily substituted.

Referring back to FIG. 1, the toroidal core 110 of the present embodiment is of the type ubiquitous in the art. The toroidal core 110 may optionally be coated using well-known coatings such as a parylene in order to improve, inter alia, isolation between the core and any adjacent windings. In addition, the toroidal core 110 may optionally be gapped (whether in part or completely) in order to improve the saturation characteristics of the core. These and other optional core configurations are disclosed in, for example, co-owned U.S. Pat. No. 6,642,827 entitled "Advanced electronic microminiature coil and method of manufacturing" issued Nov. 4, 2003, the contents of which are incorporated by reference herein in their entirety. Other toroidal core embodiments could also be readily utilized consistent with the present invention including, inter alia, those shown in and described with respect to FIGS. 13-16 of co-owned U.S. Pat. No. 7,109,837 entitled "Controlled inductance device and method" issued Sep. 19, 2006, the contents of which are incorporated by reference herein in their entirety. Moreover, the embodiments shown in FIGS. 17a-17f of co-owned and co-pending U.S. application Ser. No. 10/882,864 entitled "Controlled inductance device and method" filed Jun. 30, 2004 and incorporated herein by reference may be used consistent with the invention, such as for example wherein one or more "washers" are disposed within one or more of the headers 102, 108. Myriad other configurations will be appreciated by those of ordinary skill given the present disclosure and those previously referenced, the foregoing citations being merely illustrative of the broader principles.

The top header 102 of the device 100 may optionally comprise a circuit printable material such as, without limitation, a ceramic substrate (e.g. Low Temperature Co-fired Ceramic, or "LTCC"), a composite (e.g., graphite-based, Flex on FR-4, etc.) material, or a fiberglass-based material ubiquitous in the art such as FR-4 and the like. Fiberglass based materials have advantages over LTCC in terms of cost and world-wide availability; however LTCC has advantages as well. Specifically, LTCC technology presents advantages in that the ceramic can be fired below a temperature of approximately 900° C. due to the special composition of the material. This permits the co-firing with other highly conductive materials (i.e. silver, copper, gold and the like). LTCC also permits the ability to embed passive elements, such as resistors, capacitors and inductors into the underlying ceramic package. LTCC also has advantages in terms of dimensional stability and moisture absorption over many fiberglass-based or composite materials, thereby providing a dimensionally reliable base material for the underlying inductor or inductive device.

The top header 102 of the illustrated embodiment comprises a plurality of winding portions 104 printed or otherwise disposed directly on the top header 102 using, e.g., well known printing or stenciling techniques. While the present embodiment incorporates a plurality of printed winding portions 104, the invention is in no way so limited. For example, a single winding turn may readily be used if desired.

Figure 1A:
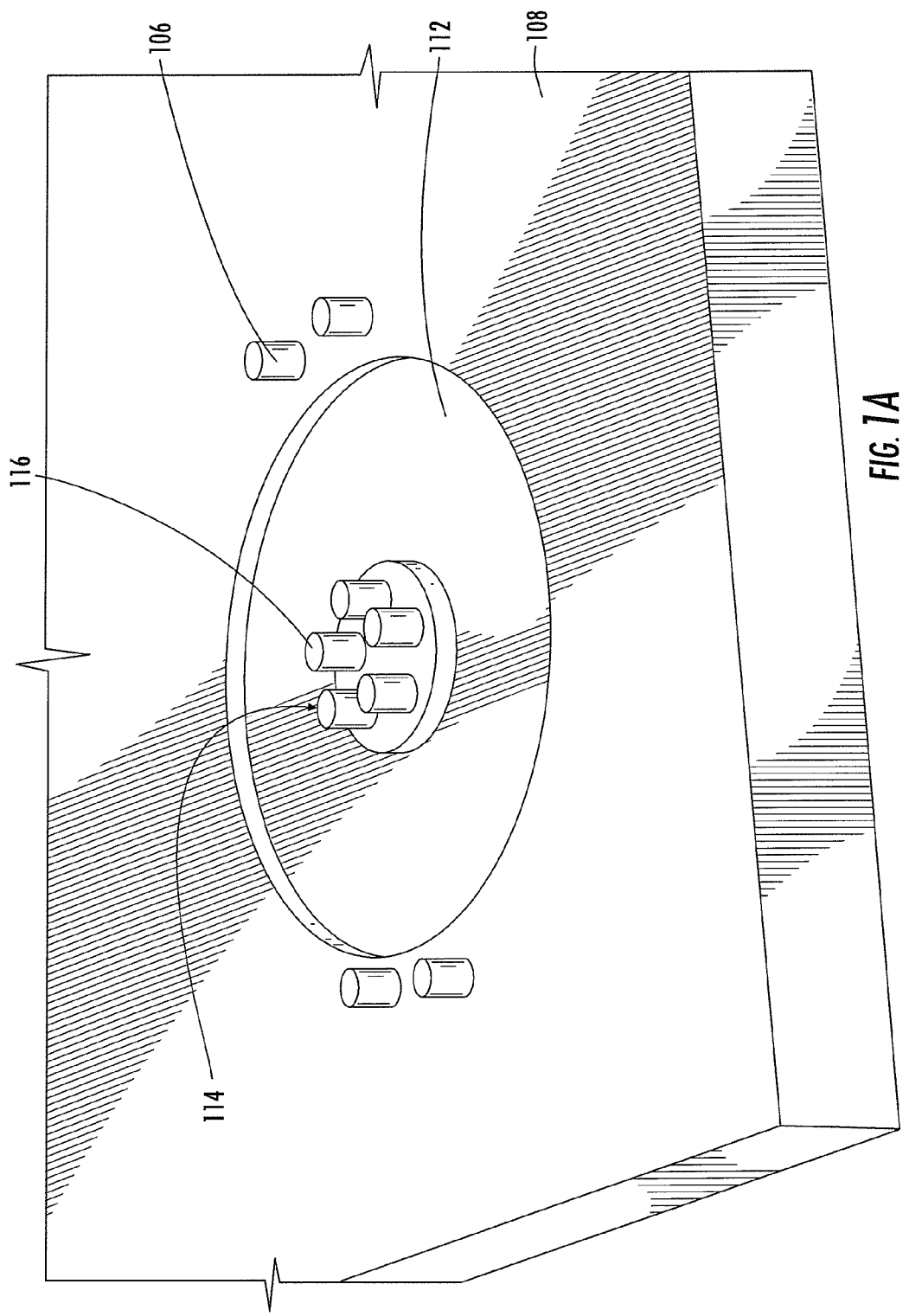
FIG. 1a is a perspective view demonstrating the extended end via windings of the bottom header of the inductive device of FIG. 1.
Figure 1B:
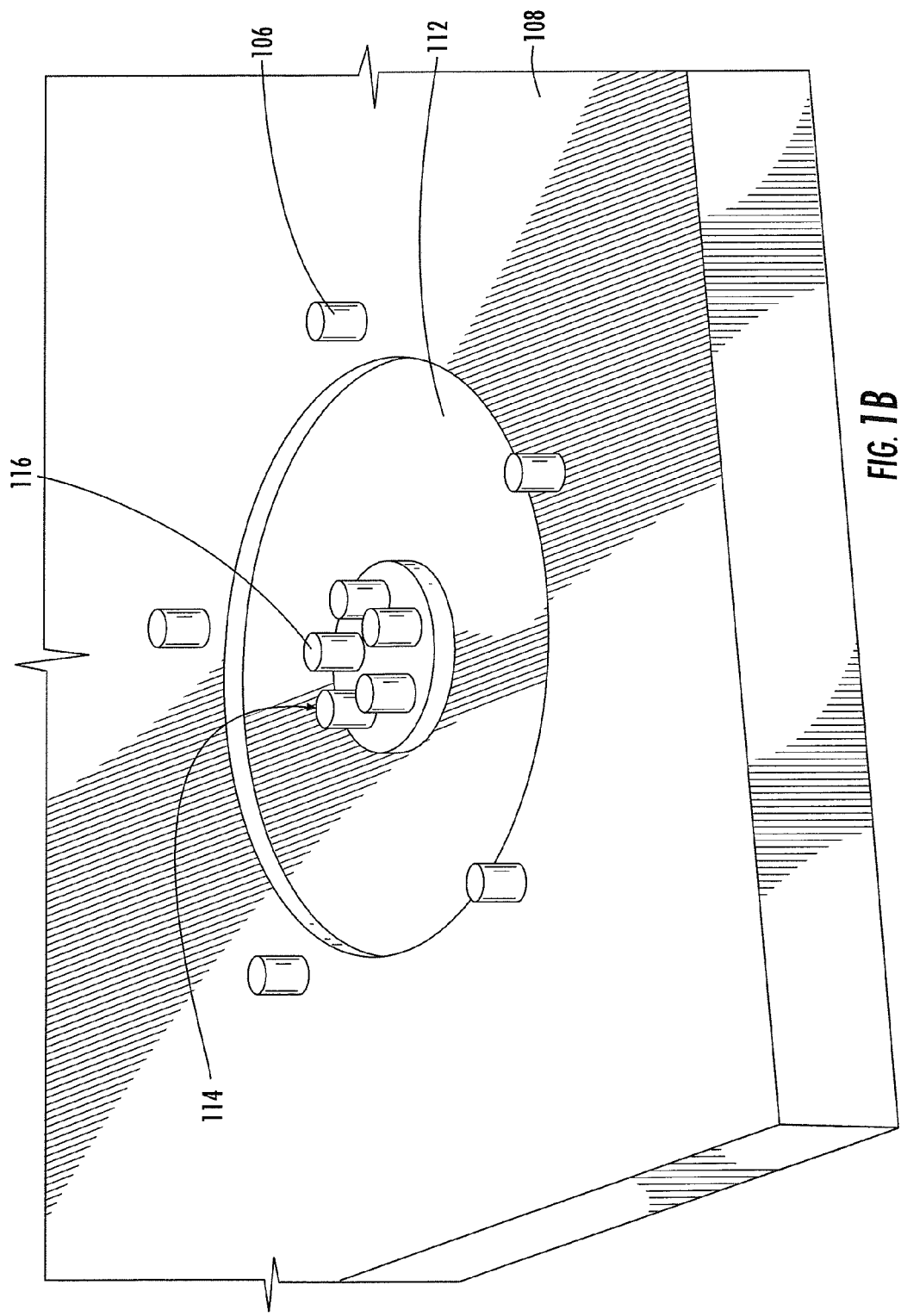
FIG. 1b is a perspective view illustrating a second configuration for the extended end via windings of the bottom header of the inductive device of FIG. 1.
Figure 1C:
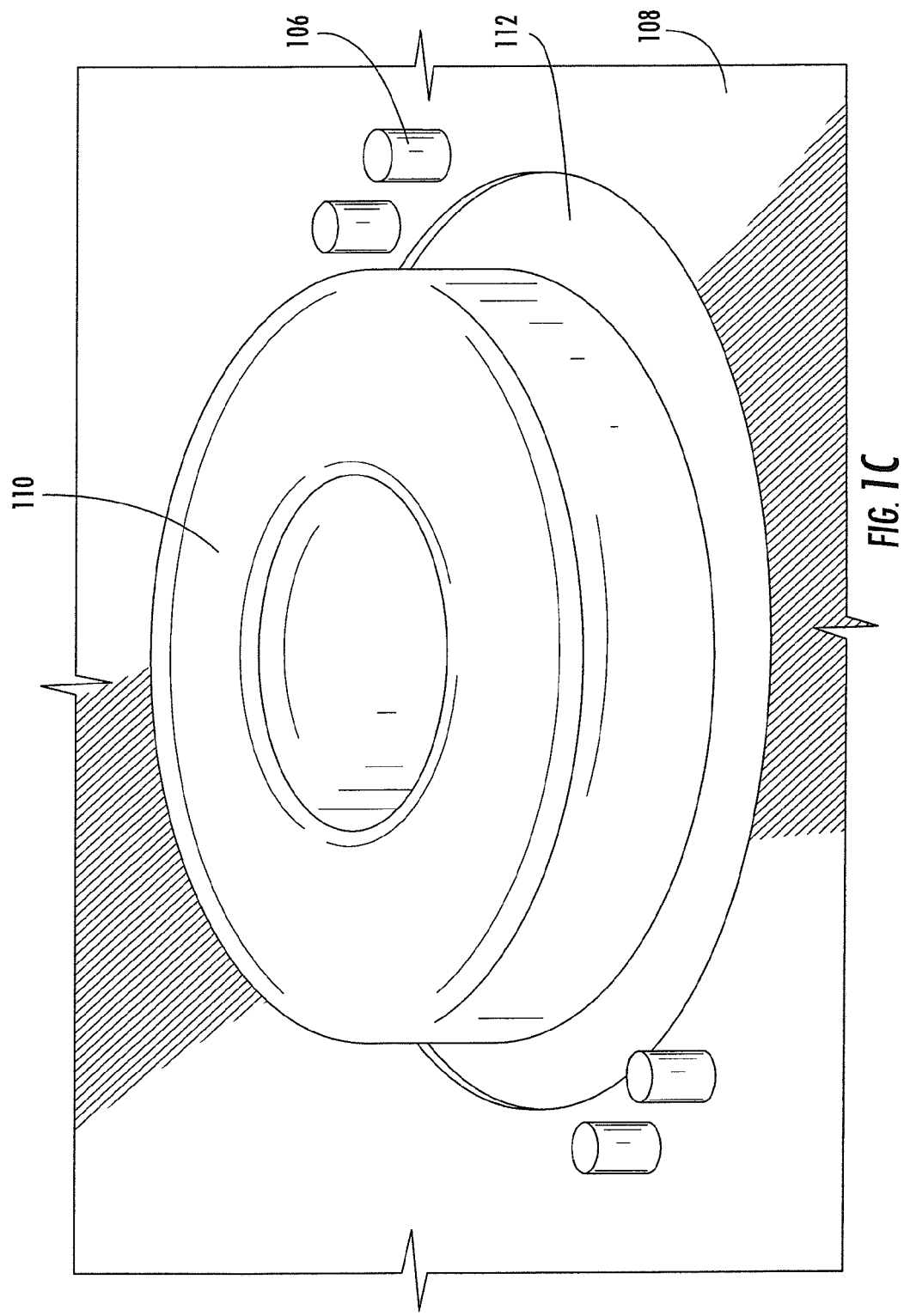
FIG. 1c is a perspective view illustrating the placement of a toroidal core within the cavity of the bottom header of the inductive device of FIG. 1.

As best illustrated by FIG. 1a, the bottom header 108 comprises a plurality of winding vias 106, 116 and an optional cavity 112 adapted to receive a toroidal core (see also FIG. 1c, 110). The winding vias may in one variant comprise extended ends, as discussed above.

The bottom header 108 of FIG. 1a further comprises a plurality of winding vias that are disposed as a plurality of outer winding vias 106 located along the outer edge of the cavity 112; and a plurality of inner winding vias 116 located in the center of the cavity 112. The illustration of FIG. 1a is intended to be exemplary in nature, and hence the exact number of winding vias 106, 116 disposed on the bottom header 108 may vary considerably depending on the electrical/magnetic characteristics desired. The cavity 112 is substantially circular in shape having a raised center 114 (effectively forming a cylindrical cavity), the raised center which is adapted to fit into the opening in the center of a toroidal core. The raised center 114 has disposed thereon the inner winding vias 116. It should also be noted that it is not always necessary that the center 114 be a raised area. Rather, the center may comprise any number of configurations consistent with the present invention, including inter alia, having the inner winding vias 116 disposed directly into the cavity 112 or bottom header 108 floor. It will be appreciated that the cavity 112 may be disposed in either or both of the top and/or bottom headers 102, 108, as desired.

For example, in one embodiment, the two headers 102, 108, comprise substantially identical components that each comprises a cavity adapted to receive approximately one-half of the toroid (vertically) 110.

In another embodiment, the toroid 110 is completely received within one of the headers 102, 108, and the other has no cavity at all (effectively comprising a flat plate). In still another embodiment, the two headers, 102, 108, each have a cavity, but the depth of each is different from the other. The inner winding vias 116 and outer winding vias 106 are then electrically interconnected (see e.g. FIG. 1f).

It will be further appreciated that the inner 116 and outer 106 winding vias may be disposed in any number of configurations around the toroidal core 110. For example, FIG. 1b illustrates a variant where the outer vias 106 are distributed completely around the cavity 112, as opposed to the paired outer via 106 configuration depicted in FIG. 1a. However, as previously noted, various other configurations of inner 116 and outer 106 winding via distribution would be readily apparent given the present disclosure. For example, the utilization of via proximity could be used to induce desired capacitive effects which could result in a non-uniform distribution of the windings.

FIG. 1c illustrates the placement of a toroidal core 110 into the receiving cavity 112 of the bottom header 108. As discussed in further detail below, the raised center comprising inner winding vias (FIG. 1a) fits into the center of the toroidal core 110 while the outer winding vias 106 are disposed just outside the edges of the toroidal core 110.

FIG. 1d illustrates the underside of the bottom header 108 described in FIG. 1. As shown, the outer winding vias 106 are electrically connected to the inner winding vias by winding portions 118. The winding portions 118 are similar to those seen with regards to the top header 102 (i.e. winding portions 104). Furthermore, an outer via 106 will extend from a first end 1181 of a winding portion 118. The winding portion 118 then connects the outer via 106 to an inner via 116 at the second end 1182 of the winding portion 118.

It is of note that the particular pathways illustrated by the bottom header winding portions 118 and the top header winding portions 104 are merely exemplary in nature and thus illustrate only one of many potential configurations for these electrical pathways. Any number of pathway configurations may be used to connect the outer and inner winding vias consistent with the present invention, such as inter alia, crossed pathways, modulated (e.g., sinusoidal) pathways, straight connect pathways, etc. It is also appreciated that these pathways may be constructed for both geometric and electrical reasons. For example, adjusting the width, spacing and/or length of the winding portion 118 may affect the capacitive and/or inductive effects of the winding portion 118.

Figure 1E:
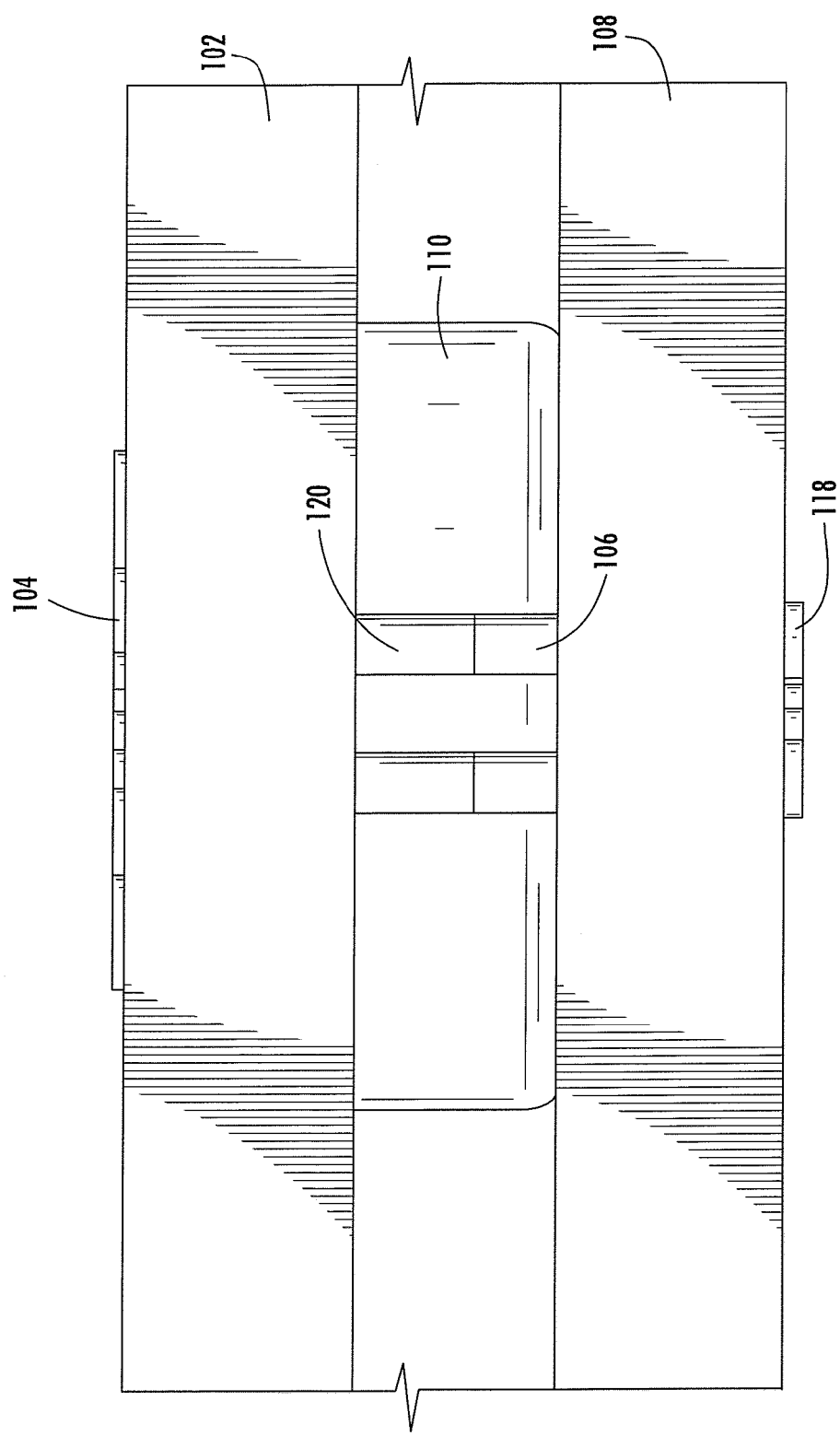
FIG. 1e is a side elevational view illustrating the mating of the top header and bottom header of the inductive device of FIG. 1.

FIG. 1e illustrates an exemplary inductive device 100 comprised of three pieces (i.e. a three-piece embodiment): (i) a top header 102, which is mated to (ii) a bottom header 108 and (iii) a magnetically permeable toroidal core 110 placed between the top 102 and bottom 108 headers. It is appreciated, however, that other configurations using more or fewer header pieces, or alternative header materials may be implemented consistent with the present invention. The top header vias 120 extend from the winding portion 104 disposed on a surface of the top header 102. The bottom header vias 106 extend from the winding portion 118 disposed on a surface of the bottom header 108. The top header vias 120 become electrically connected to the bottom header vias 106 when the top header 102 is mated to the bottom header 108. As illustrated in FIG. 1e, the electrical connection between the top 120 and bottom 106 vias completes the "winding" around the toroidal core 110.

Figure 1F:
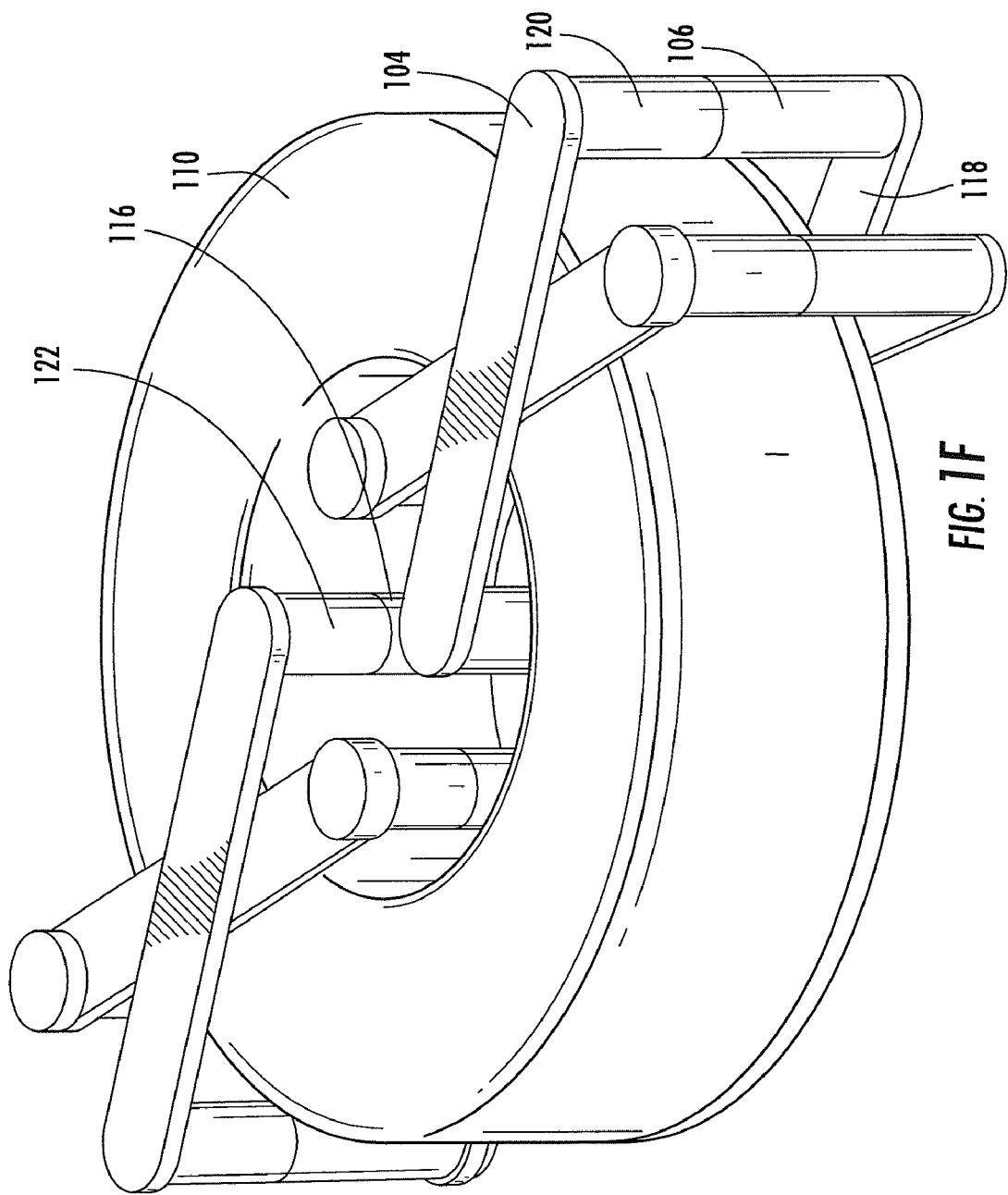
FIG. 1f is a perspective view illustrating an exemplary winding about the toroidal core of the inductive device of FIG. 1.
Figure 7I:
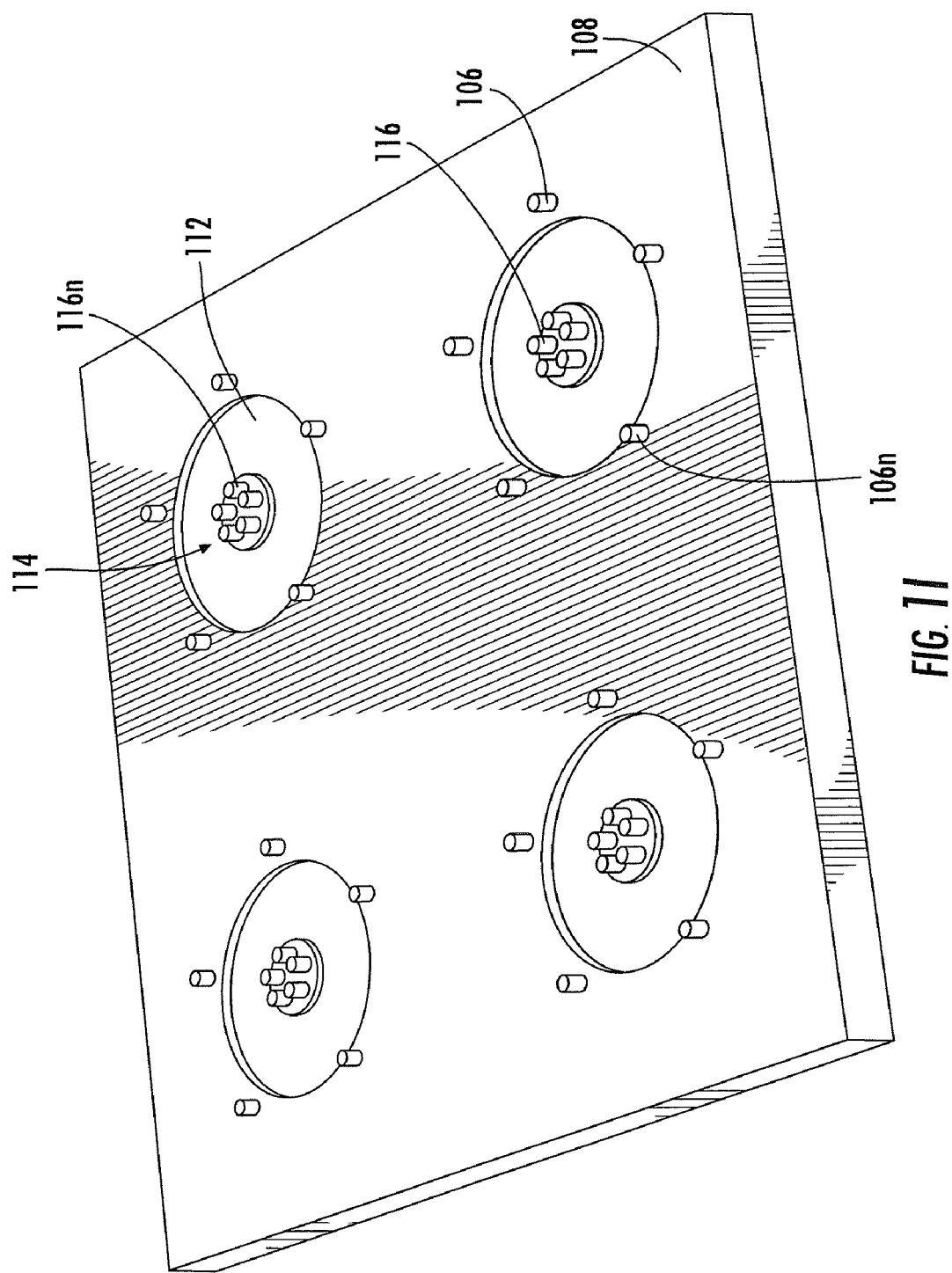
FIG. 7 is a perspective view of the top header of an exemplary toroidal inductive device illustrating electronic component receiving pads.

FIG. 1f depicts an embodiment where the encircled toroidal core 110 has been received into the cavity 112 with all of the winding vias mated. This includes the inner 122 and outer 120 top winding vias and the inner 116 and outer 106 bottom winding vias. The top and bottom headers are excluded from view for purposes of clarity. As shown, the extended ends of the lower outer winding vias 106 mate with the extended ends of the upper outer winding vias 120. The upper outer winding vias 120 are linked to the upper inner winding vias 122 by winding portions 104. The extended ends of the upper inner winding vias 122 are similarly linked to the extended ends of the lower inner winding vias 116. These, in turn, mate with the lower outer 106 winding vias by the winding portions 118. Hence, by receiving the core 110 in the cavity 112, the winding vias (the outer winding vias 106, 120 and inner winding vias 116, 122) in combination with the upper header winding portions 104 and the lower header winding portions 118 surround the core 110, thereby mimicking a prior art wire wound inductor or inductive device. While only a single turn is described, it can be seen that the aforementioned pattern may be repeated, as would be understood by one of ordinary skill given the present disclosure, in order to complete a multiple turn inductive device 100.

The winding portions 104 of FIG. 1f are illustrated to be in a crossed configuration. Each winding portion 104 of the top header 102 can be printed with a high degree of placement accuracy, which therein lies another salient advantage of this technique over magnet-wire wound inductors commonly used in the prior art. Because these windings located on both the top 102 and bottom 108 header portions are printed or otherwise disposed using highly controlled processes, the spacing and/or pitch of the windings can be controlled with a very high degree of accuracy, thereby providing electrical performance uniformity that is unmatched by prior art wire-wound inductive devices, which inherently include some degree of variation depending factors such as the type of winding machine used, person winding each individual core, etc.

It will also be recognized that the term "spacing" may refer to the distance of a winding from the outer surface of the core, as well as the winding-to-winding spacing or pitch. Advantageously, the illustrated device 100 very precisely controls the spacing of the "windings" (vias and printed header portions) from the core 110, since the cavity 112 formed in the headers 102, 108 is of precise placement and dimensions relative to the vias and outer surfaces of the headers. Hence, windings will not inadvertently be run atop one another, or have undesired gaps formed between them and the core due to, e.g., slack in the wire while it is being wound, as may occur in the prior art.

Similarly, the thickness, width and other features and dimensions of each of the winding portions 104, 118 can be very precisely controlled, thereby providing advantages in terms of consistent electrical parameters (e.g., electrical resistance or impedance, eddy current density, etc.). Hence, the characteristics of the underlying manufacturing process result in highly consistent electrical performance across a large number of devices. For example, under solutions available in the prior art, electrical characteristics such as inter-winding capacitance, leakage inductance, etc. would be subject to substantial variations due to the manual and highly variable nature of prior art winding processes. In certain applications, these prior art winding processes have proved notoriously difficult to control. For instance, across large numbers of manufactured inductive devices, it has proven difficult to consistently regulate winding pitch (spacing) in mass production.

Further, the present embodiment of the inductive device 100 has advantages in that the number of turns is also precisely controlled by the header configuration and the use of an automated printing process, thereby eliminating operator dependent errors that could result in e.g. the wrong number of turns being applied to the core.

While in numerous prior art applications, the aforementioned variations proved in many cases not to be critical, with ever-increasing data rates being utilized across data networks, the need for more accurate and consistent electrical performance across inductive devices has become much more prevalent. While customer demands for higher performance electronic components has steadily increased in recent years, these requirements have also been accompanied by increasing demands for lower cost electronic components. Hence, it is highly desirable that any improved inductive device not only improves upon electrical performance over prior art wire-wound devices, but also provide customers with a cost-competitive solution. The automated processes involved in the manufacture of the inductive device 100 are in fact cost competitive with prior art wire-wound inductive devices. These automated manufacturing processes are discussed in greater detail subsequently herein with regards to exemplary methods of manufacture and FIGS. 9a-10.

The present invention further allows for physical separation of the windings and the toroid core, so that the windings are not directly in contact with the core, and variations due to over winding of other turns, etc. are avoided. Moreover, damage to the toroid (including said coatings such as parylene) is avoided since no conventional windings are wound onto the core, thereby avoiding cuts by the wire into the surface of the toroid or its coating. The exemplary embodiment also physically decouples the toroid core 110 from the headers 102, 108 and the winding portions 104, 116 such that the components can be separated or treated separately.

Conversely, the use of a "separated" winding and toroid may obviate the need for additional components or coatings in some instances. For example, there may be no need for a parylene coating, silicone encapsulant, etc. in the exemplary embodiment (as are often used on prior art wire-wound devices), since the relationship between the windings and the core is fixed, and these components separated.

The present invention also affords the opportunity to use multi-configuration headers. For example, in one alternative embodiment, the headers 102, 108 can be configured with any number (N) of vias, such that a device utilizing all N vias for "windings" can be formed therefrom, or a device with some fraction of N (e.g., N/2, N/3, etc.) windings formed. In the exemplary case, when forming the N/2 winding device, the unused extended end vias advantageously require no special treatment during manufacture. Specifically, they can be plated and placed the same as the via to be used for windings, yet simply not "connected-up" to a matching via on another header surfaces or, if matched up to another via, not electrically connected by winding portions. Alternatively, if N windings are desired, all of the vias (which are plated under either circumstance) are connected-up as shown in FIG. 1. This may be useful, for example, in standardizing header platforms across multiple electrical configurations.

In yet another embodiment (not shown), the inductive device 100 assembly may be comprised of two pieces: (i) a lower header 108 element and (ii) a toroidal core 110, as opposed to the three-piece embodiment described above. According to this embodiment, the lower header may optionally comprise a circuit printable material such as, without limitation, a ceramic substrate (e.g. Low Temperature Co-fired Ceramic, or "LTCC"), a composite (e.g., graphite-based) material, or a fiberglass-based material ubiquitous in the art such as FR-4. This embodiment is comprised of lower winding portions 118 and a plurality of inner 116 and outer 106 lower vias with extended ends, similar to those described above and disposed on the lower header element. To complete the "winding" created by the extended ends of the inner 116 and outer vias 106 winding portions are disposed directly on the toroidal core 110 surface.

Alternatively, in another variant, the winding portions are comprised of a copper trace or other conductive material band which is run across the top of the toroidal core 110.

In yet another embodiment, a multiplicity (e.g., three or more) of header elements (not shown) may be stacked in order to form an enclosure for the core(s). For example, in one variant, a top, middle and bottom header are used to form the toroid core enclosure.

Moreover, it will be appreciated that the materials used for the header components need not be identical, but rather may be heterogeneous in nature. For example, in the case of the "flat top header" previously described, the top header may actually comprises a PCB or other such substrate (e.g., FR-4), while the lower header comprises another material (e.g., LTCC, PBT Plastic, etc.). This may be used to reduce manufacturing costs and also allow for placement of other electronic components (e.g., passive devices such as resistors, capacitors, etc.) to be readily disposed thereon.

Wire-Less Multi-Toroidal Inductive Device—

Referring now to FIG. 1g, an exemplary embodiment of the present invention utilizing a multi-toroidal design is shown and described in detail. It will be recognized, as with the embodiments discussed previously herein, that while the following discussion is cast in terms of an inductor, the invention is equally applicable to other inductive devices (including without limitation choke coils, inductive reactors, transformers, filters, and the like).

The inductive device 100 of FIG. 1g comprises a plurality of magnetically permeable toroidal cores 110 and two wire-less substrate headers 102, 108. The illustration is exemplary in nature and although only four (4) toroidal cores are depicted, any number (n) of toroidal cores may be utilized consistent with the present invention. Further, as previously discussed, the term wire-less refers to the fact that the inductive device 100 does not require magnet wire windings disposed about the toroidal cores 110, but rather, incorporates its windings onto one or more printable and/or etchable substrate headers and vias having extended ends. It will be noted that in an alternative embodiment (not shown), through-hole vias may be incorporated as well. Also, any number of the wire-less substrate headers 102, 108 may be utilized consistent with the present invention, including two, or more, or fewer. Moreover, it will be appreciated that the materials used for the header components need not be identical, but rather may be heterogeneous in nature. For example, one or more of the wire-less substrate headers 102, 108 may comprise a printed circuit board, LTCC, or a polymer-based material.

The top header 102 of the device 100, similar to that described with regard to FIGS. 1-1f above, may optionally comprise a circuit printable material such as, without limitation, a ceramic substrate (e.g. LTCC), a composite (e.g., graphite-based) material, or a fiberglass-based material ubiquitous in the art such as FR-4 or Flex on FR-4.

The top header 102 of the illustrated embodiment comprises a plurality of winding portions 104 printed or otherwise disposed directly on the top header 102 using, e.g., well known printing or stenciling techniques. As depicted in FIG. 1g, the number of winding portions 104, N, disposed on the top header 102 will vary directly with the number of toroidal cores 100 (N) present in any particular embodiment. In this figure, as there are depicted four (4) toroidal cores, thus four (4) winding portions are seen. Further, the particular pathways created by the winding portions in the embodiment depicted in FIG. 1g are merely illustrative; a myriad of other pathway configurations are possible. For example, an embodiment of the top header 102 utilizing direct pathways 104x may be seen in FIG. 1h. Other pathway configurations (not shown), including inter alia crossed pathways, and multiple crossed pathways, may also be utilized with the present invention.

Referring again to FIG. 1g, the disposition of toroidal cores 110 into the receiving cavities 112 of the bottom header 108 is illustrated. As discussed in further detail below, the receiving cavities 112 in one exemplary embodiment comprise raised centers (not shown) having inner winding vias (also not shown) which are adapted to fit into the center of the toroidal cores 110; the outer winding vias 106 are disposed just outside of the toroidal cores 110 on the bottom header 108.

As best shown in FIG. 1*i*, the bottom header 108 of this embodiment comprises a plurality of winding vias and several cavities 112 adapted to receive the toroidal cores 110 (as depicted in FIG. 1*g*). The winding vias comprise extended ends which have salient advantages over magnet-wire wound inductors commonly used in the prior art, as described above. The number of cavities 112 (N) on the bottom header 108 corresponds with the number of toroidal cores 110, N, to be received therein.

Several winding vias are disposed on the bottom header 108 and comprise outer winding vias 106 and inner winding vias 116. Several outer winding vias 106 are disposed along the outer edges of each cavity 112. Any number (N) of outer winding vias 106*n* may be disposed around a single cavity 112 as was previously discussed with regards to the single toroidal inductive devices. The pattern of distribution of the outer winding vias 106 around the cavities 112 may likewise vary. In fact, it will be appreciated that the inner winding vias 116 and outer winding vias 106 may be disposed in any manner of configurations around the toroidal core 110. The extended ends of the inner winding vias 116 and the extended ends of the outer winding vias 106 are electrically interconnected. This electrical connection is illustrated in FIG. 1*j*.

Figure 1J:
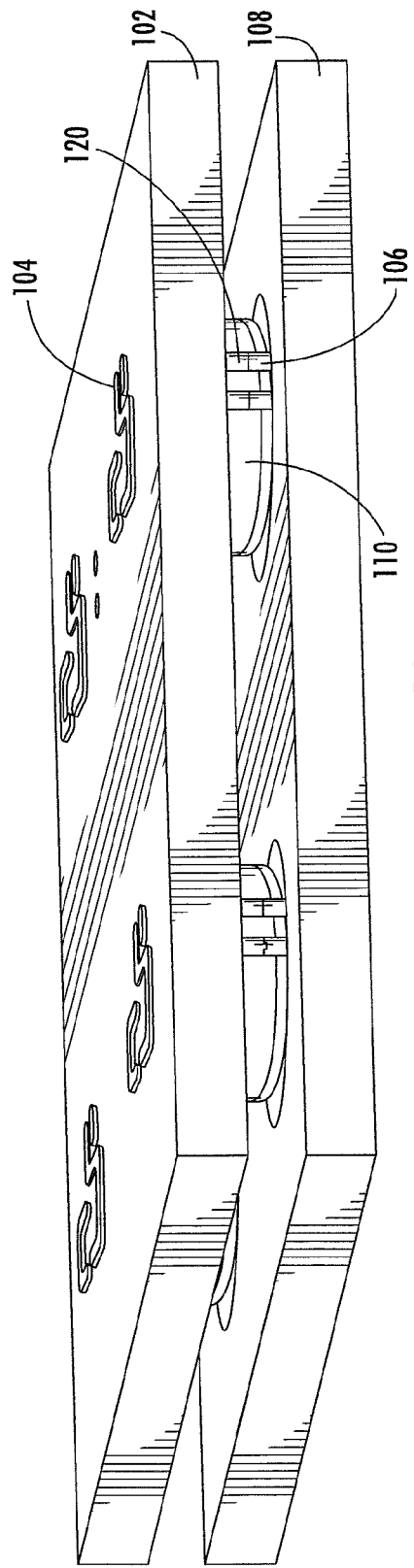
FIG. 1j is a perspective view of the multi-toroidal inductive device of FIG. 1g, illustrating the mating of the top and bottom headers.
Figure 1K:
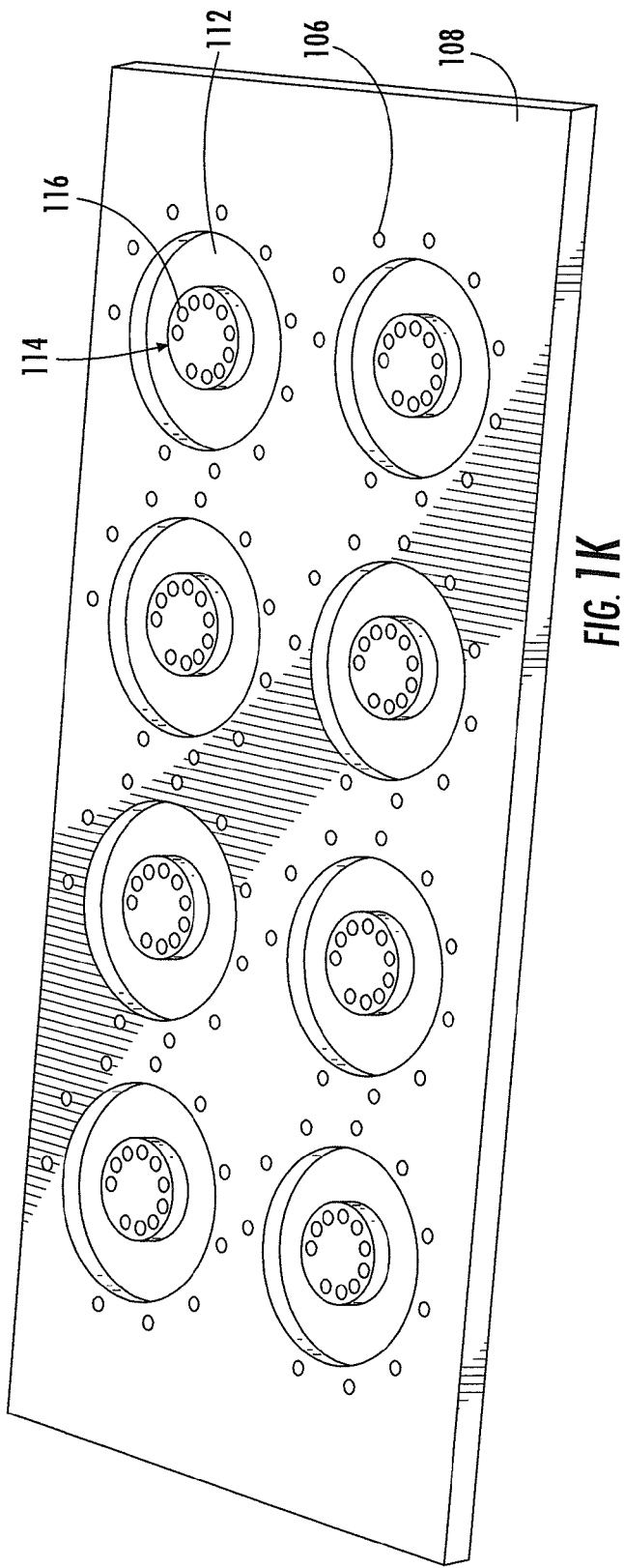
FIG. 1k is a perspective view of the bottom header of a second configuration of a multi-toroidal inductive device in accordance with the principles of the present invention.

FIG. 1*j* illustrates an exemplary multi-toroidal inductive device 100 comprised of three pieces: (i) a top header 102 mated to (ii) a bottom header 108, and (iii) a plurality of magnetically permeable toroidal cores 110 placed between the top 102 and bottom 108 headers. As discussed above, it is appreciated that other configurations using more or fewer header pieces or toroids, or alternative header materials, may be implemented consistent with the present invention. For example, FIG. 1*k* depicts the invention practiced using eight (8) toroids 110, and other numbers are possible.

In yet another embodiment, illustrated in FIGS. 1*l*-1*o*, the multiple inductive device 100 assembly is comprised of two components ("two-piece embodiment"), rather than the three discussed with regard to FIG. 1*g* above. These two pieces being: (i) a bottom header 108 and (ii) a plurality toroidal cores (not shown, although similar to those discussed above 110).

Figure 1L:
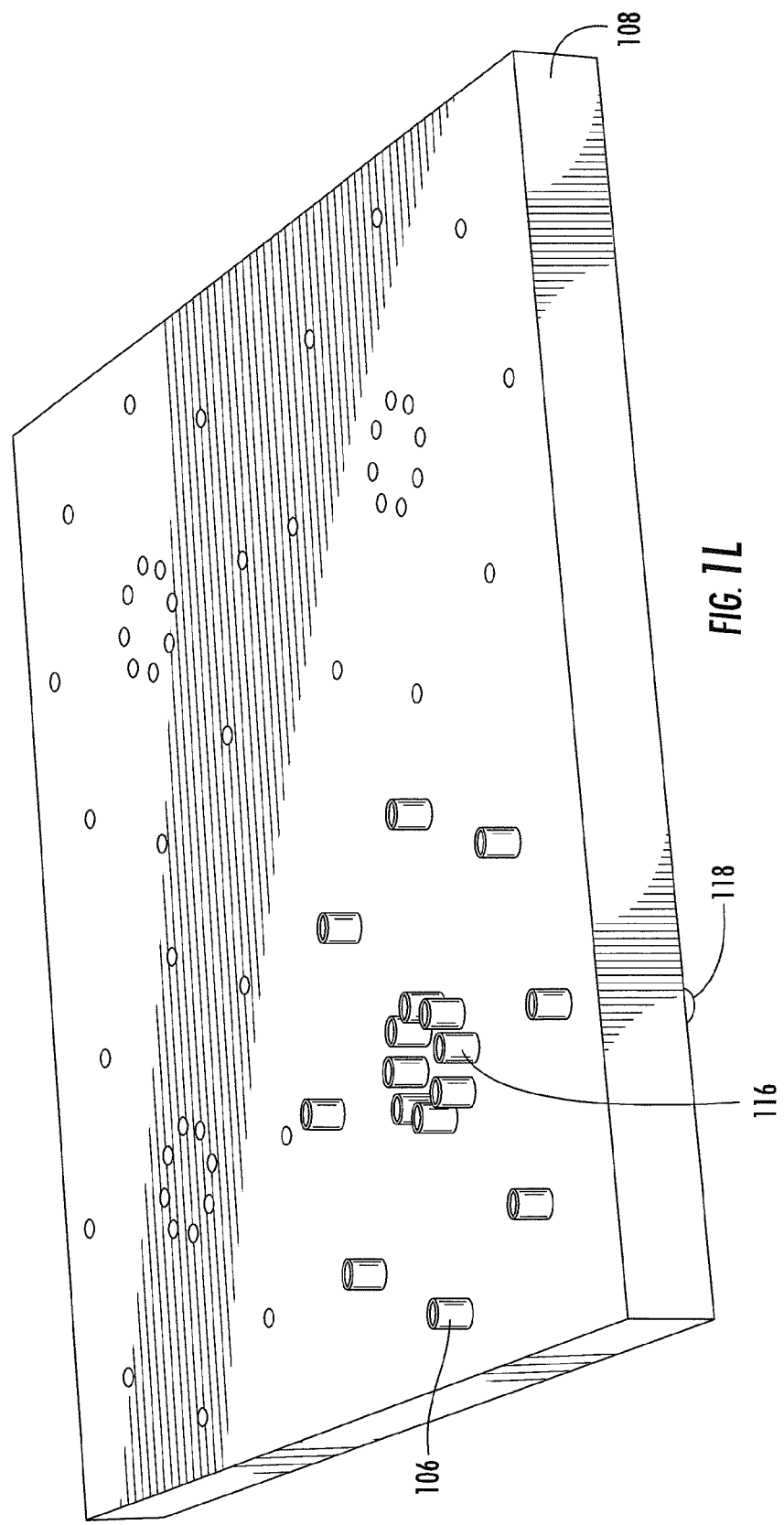
FIG. 1l is a perspective view of a bottom header of a third configuration of a multi-toroidal inductive device in accordance with the principles of the present invention.
Figure 7N:
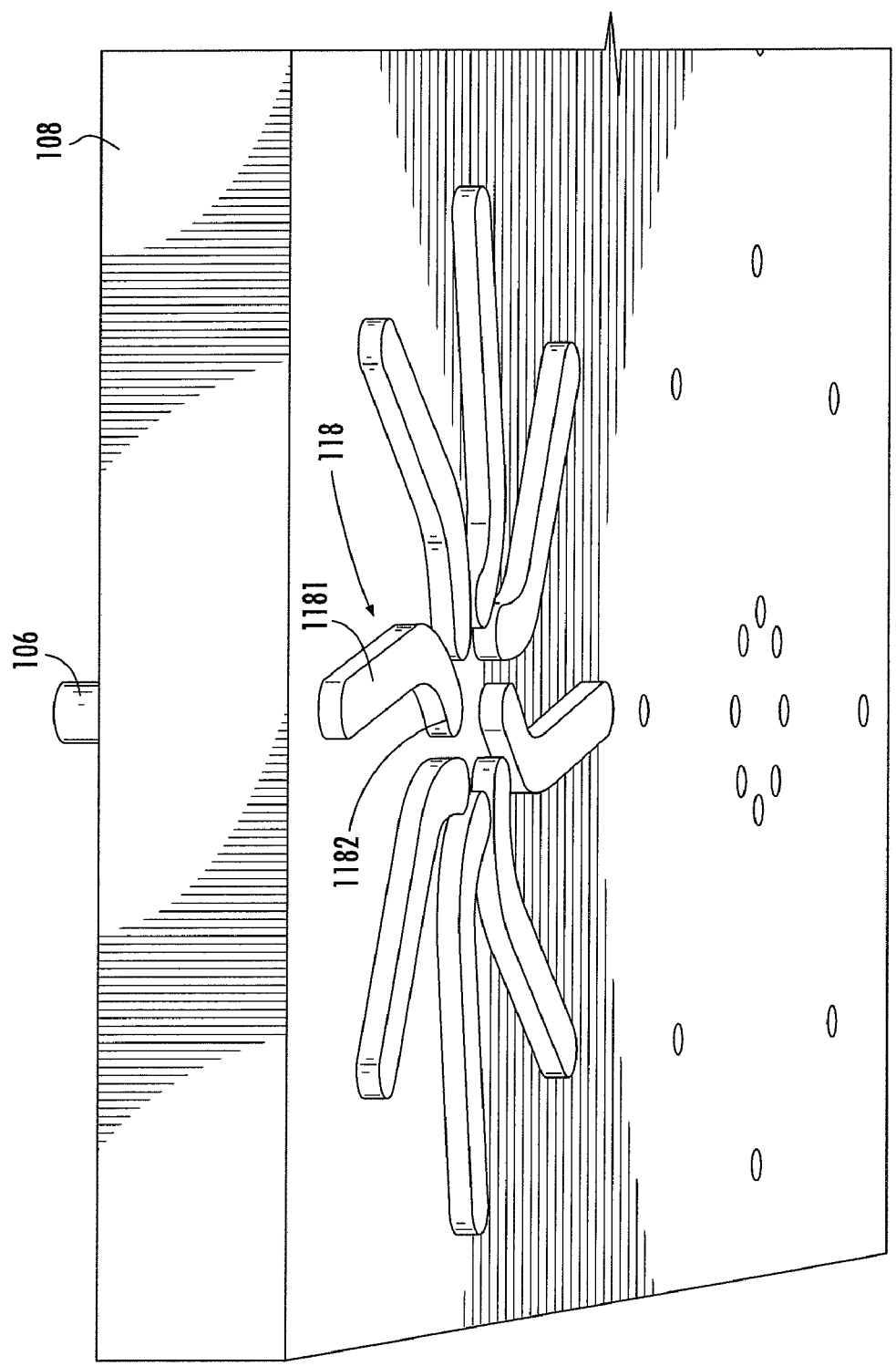

FIG. 1*l* depicts the bottom header element 108 of the two-piece embodiment. It is appreciated that although the bottom header element 108 of FIG. 1*l* incorporates placement for four (4) toroidal cores, any number (N) of toroidal cores (not shown) may be utilized consistent with the present invention.

The bottom header element 108 of the two-piece embodiment is comprised of a substrate of material as discussed above. The bottom header element 108 will be further comprised of a plurality of inner 116 and outer 106 winding vias having extended ends. As discussed above, the use of vias having extended ends may be supplanted by the use of through-hole vias in another embodiment (not shown). The inner winding vias 116 are electrically connected to the outer winding vias 106 by a winding portions 118 disposed on a surface of the bottom header 108 (See FIGS. 1*n* and 1*o*). The inner winding vias 116 and outer winding vias 106 may be disposed in a myriad of configurations on the bottom header 108 surface provided adequate space is maintained for the disposal of toroidal cores (not shown). The placement of the inner winding vias 116 and the outer winding vias 106 will be such that the inner winding vias 116 are disposed within the hollow center of the toroids (not shown) and the outer winding vias 106 are disposed outside the toroid structure (not shown). Thus, the outer winding vias 106 will generally form an outline of a toroidal core, while the inner winding vias 106 generally form a toroidal core center. Other configurations may be utilized with the present invention.

A "winding" is completed in one embodiment by the displacement of a copper trace or other similarly conductive material band across the top of the toroidal core, as discussed previously herein. In another embodiment (not shown), the winding is completed by displacement of electrical pathways on the surface of the toroid core itself, which when placed on the bottom header 108 electrically connect with the inner 116 and outer 106 winding vias.

Figure 1P:
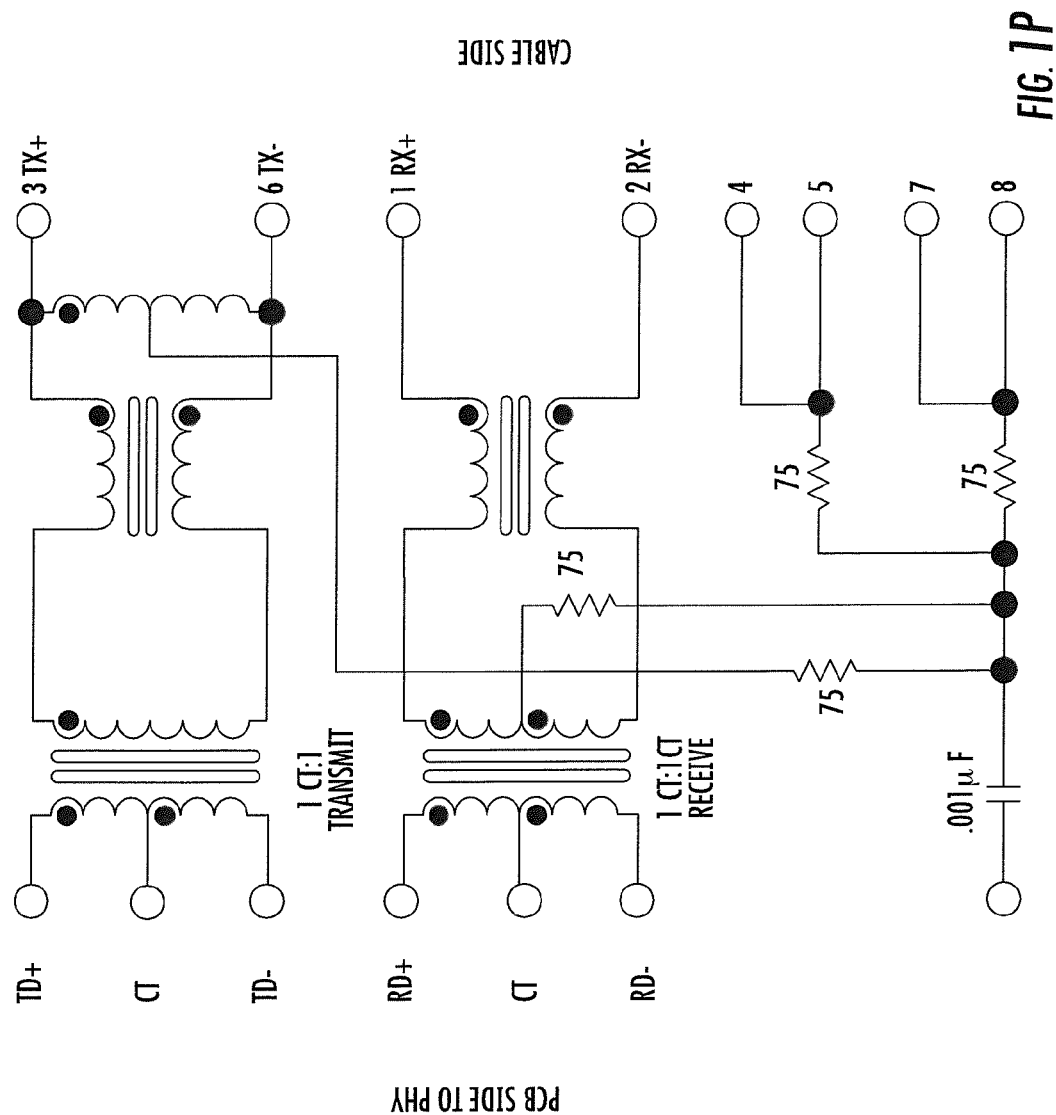
FIG. 1p illustrates an electronic circuit that may readily be implemented in a multi-toroidal inductive device in accordance with the principles of the present invention

Yet another salient advantage of using a multi-core inductive device as described above is that individual inductive devices within the multi-core inductive device can be made in any number of varied configurations. As seen in FIG. 1*p*, the use of magnetics is useful in telecommunications applications such as for example, filtering voice and data signals over twisted pair cabling. Utilizing a multi-core inductive device, one may readily implement an entire circuit (as shown in FIG. 1*p*) into a single device. For example, in the circuit shown in FIG. 1*p*, the circuit shown could be implemented utilizing an upper and lower header and four (4) toroidal cores. The resistors and capacitors could then be modeled into the headers themselves, or alternatively, the headers could utilize discrete mounting locations for discrete electronic components. In this way complete circuits (such as that shown in FIG. 1*p*) could readily implemented in a precise and cost-effective manner utilizing the techniques discussed above. This approach also has the advantage of minimizing conductor run length (e.g., having to run traces or additional wiring out to discrete components mounted at more distant locations), thereby mitigating EMI, eddy current effects, and other deleterious effects associated with such longer conductor runs.

Partially Wired Toroidal Inductive Device—

Figure 2:
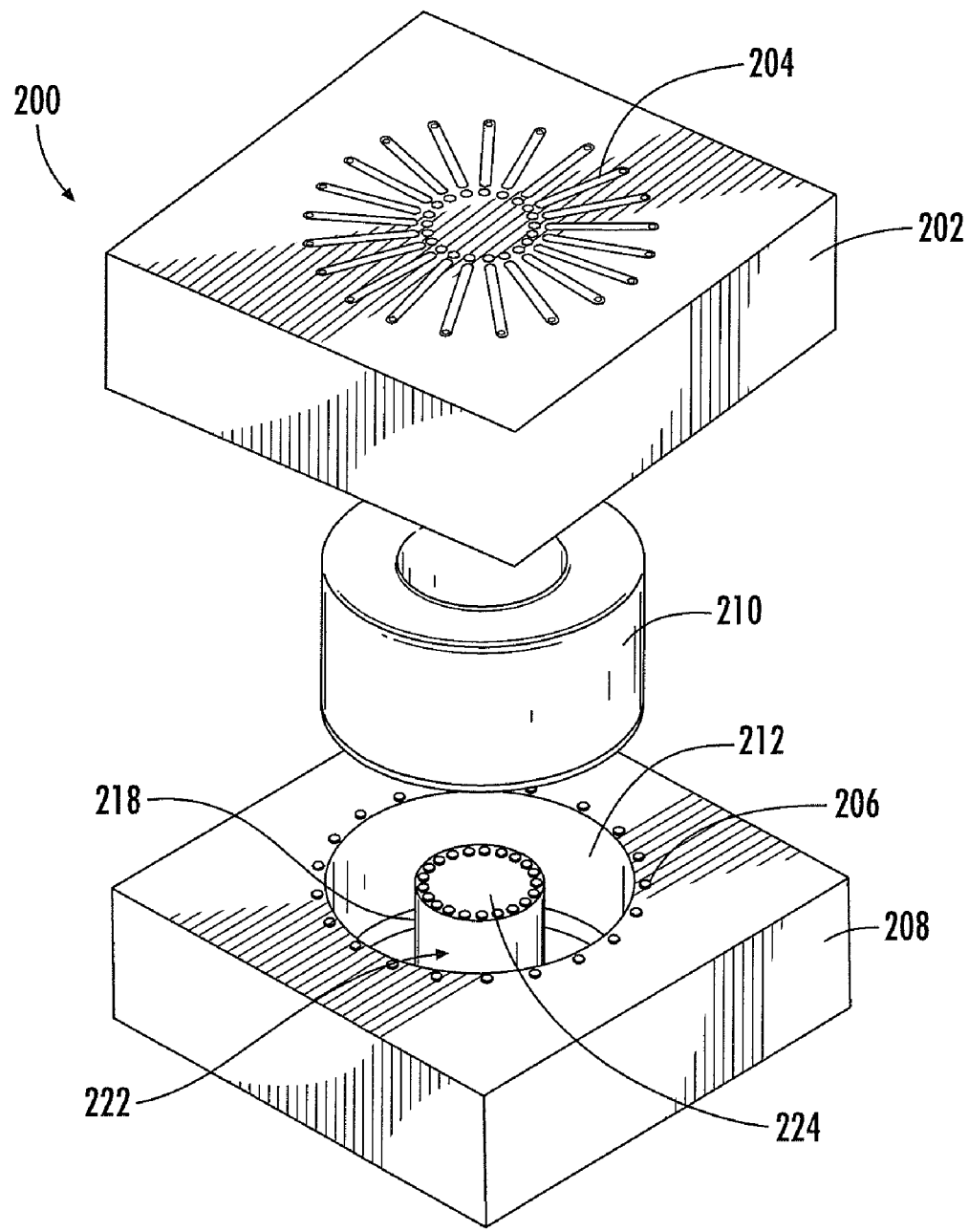
FIG. 2 is a perspective exploded view illustrating a first configuration of a partially wired toroidal inductive device in accordance with the principles of the present invention.

Referring now to FIG. 2, another exemplary embodiment of the present invention is shown and described in detail. It will be recognized that while the following discussion is cast in terms of an inductor, the invention is equally applicable to other inductive devices (including without limitation choke coils, inductive reactors, transformers, filters, and the like).

The inductive device 200 of FIG. 2 comprises a magnetically permeable toroidal core 210 and two partially wired substrate headers 202, 208. The term "partially wired" in this specific context refers to the fact that the inductive device 200 of the present embodiment utilizes windings disposed about a toroidal core which are partially comprised of magnet wires, one or more printable and/or etchable substrate headers and vias. In the embodiment of FIG. 2, the vias advantageously comprise extended ends. This approach provides significant advantages over fully wire-wound prior art devices, which will be discussed more fully subsequently herein. In another embodiment (not shown), the vias comprise traditional or through-hole vias.

The toroidal core 210 of the present embodiment is of the type ubiquitous in the art, thus it will not be discussed in further detail. Other configurations may be utilized consistent with the present invention, for example, the toroidal core may be flattened (discussed in detail below), may be coated, or may be gapped (whether in part or completely). Myriad other configurations, including those disclosed in co-owned U.S. Pat. Nos. 6,642,827, 7,109,837, and co-owned and co-pending U.S. application Ser. No. 10/882,864 which are each herein incorporated by reference in their entirety, will be appreciated by those of ordinary skill given the present disclosure.

The top header 202 of the device 200 may optionally comprise a circuit printable material such as, without limitation, a ceramic substrate (e.g. LTCC), a composite (e.g., graphite-based, Flex on FR-4, etc.) material, or a fiberglass-based material such as FR-4, the relative advantages of each having been previously discussed. The top header 202 of the illustrated embodiment is comprised of a plurality of winding portions 204 printed or otherwise disposed directly on the top header 202 using, e.g., well known printing or stenciling techniques. While the present embodiment incorporates a plurality of printed winding portions 204, the invention is in no way so limited. For example, a single winding turn may readily be used if desired. Further, the electrical pathway illustrated in the present embodiment is merely exemplary of the myriad of possible electrical pathways.

As best appreciated by FIG. 2a, the bottom header 208 comprises a plurality of winding vias (described below) and a cavity 212 adapted to receive a toroidal core 210. The bottom header 208 may optionally comprise a circuit printable material such as, without limitation, a ceramic substrate or a fiber-glass-based material. Further, the winding vias may advantageously comprise extended ends (not shown) as discussed above.

FIG. 2a also illustrates the placement of the toroidal core 210 into the receiving cavity 212 of the bottom header 208. The cavity 212 is circular in shape having a wired core center 222 which is adapted to fit into the opening in the center of a toroidal core 210. As discussed in further detail below, the wired core center 222 is comprised essentially of a molded bundle of magnet wires 224. A plurality of outer winding vias 206 are disposed just outside the edges of the cavity 212 such that they remain outside the toroidal core 210 when it is placed within the receiving cavity 212.

Figure 2B:
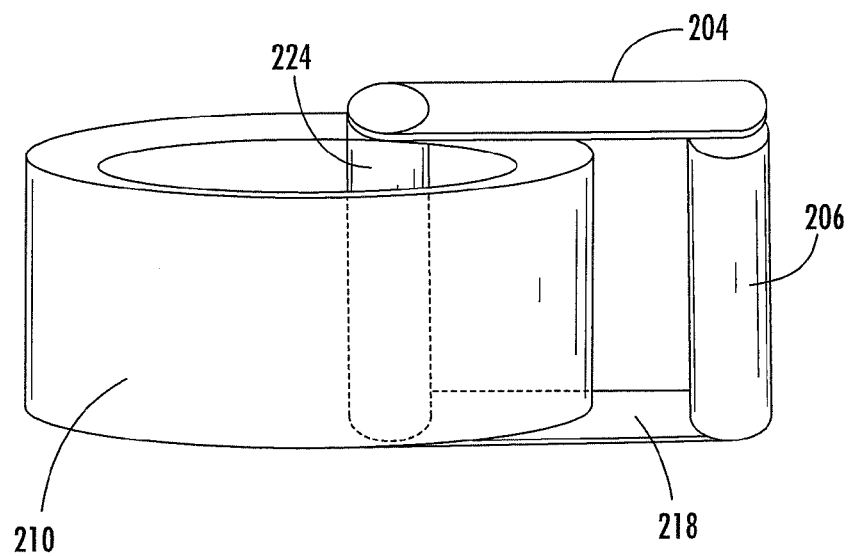
FIG. 2a is a perspective view of the bottom header and torpid of the partially wired toroidal inductive device of FIG. 2.
FIG. 2h is a perspective view illustrating an exemplary winding about the toroidal core of the partially wired inductive device of FIG. 2.
FIG. 2c is a perspective view of a single wired core center utilized in the partially wired toroidal inductive device of FIG. 2.
FIG. 2d is a perspective view illustrating a first configuration of a partially wired multi-toroidal inductive device in accordance with the principles of the present invention.
FIG. 2e is a perspective view of the substrate header of the partially wired multi-toroidal inductive device of FIG. 2d.
FIG. 2f is an exploded perspective view of the partially wired multi-toridal inductive device of FIG. 2 illustrating the placement of the toroidal cores within the substrate header.

The outer winding vias 206 are electrically interconnected to the magnet wires 224 of the wired core center 222 by electrical pathways 218 on the bottom header 208 surface. The electrical pathways 218 may be formed by etching, or other similar methods of electrically connecting which are known to a person of ordinary skill in the art. Further, when the bottom header 208 is mated to the top header 202, the "winding" about the toroidal core 210 disposed within the mated top 202 and bottom 208 headers is completed. FIG. 2b typifies one such winding. While only a single turn is illustrated, it will be understood that the aforementioned pattern may be repeated as necessary in order to produce a multiple-turn inductive device 200.

As depicted in FIG. 2b, a magnet wire 224 of the wired core center (not shown) is electrically connected to an outer winding via 206 by an electrical pathway 218 disposed on the bottom header 208. The outer winding via 206 is electrically connected back again to the same magnet wire 224 by the electrical pathway 204 disposed on the top header 202. Hence, by receiving the core 210 in the cavity 212, the magnet wires 224 of the wired core center 222 and the outer winding vias 206 in combination with the upper header winding portions 204 and the lower header winding portions 218 surround the core 210, thereby mimicking a prior art wire wound inductor or inductive device, but having notable advantages as described elsewhere herein. Here, a single turn embodiment is illustrated for purposes of simplicity; however, modifications to the configuration to achieve a desired electrical configuration would be readily understood by one of ordinary skill given the present disclosure.

In another embodiment, (not shown) at least one end of the electrical pathways 204, 218 terminates in an extended end via. The extended end via (not shown) aids in the mating of the top 202 and bottom 208 headers, as well as providing the above mentioned advantages over the prior art.

Referring again to FIG. 2a, it will be further appreciated that the outer 206 winding vias may be disposed in any number of configurations around the toroidal core 210. This includes, inter alia, having the vias distributed evenly and completely around the cavity, or being in a paired configuration. Various other via configurations are envisioned consistent with the present disclosure. Further, as will be discussed in greater detail below with regard to the manufacture of the wired core center 222, the magnet wires 224 may also be disposed in a wide variety of configurations with regard to one another, enabling improved electrical characteristics in some implementations.

Figure 2C:
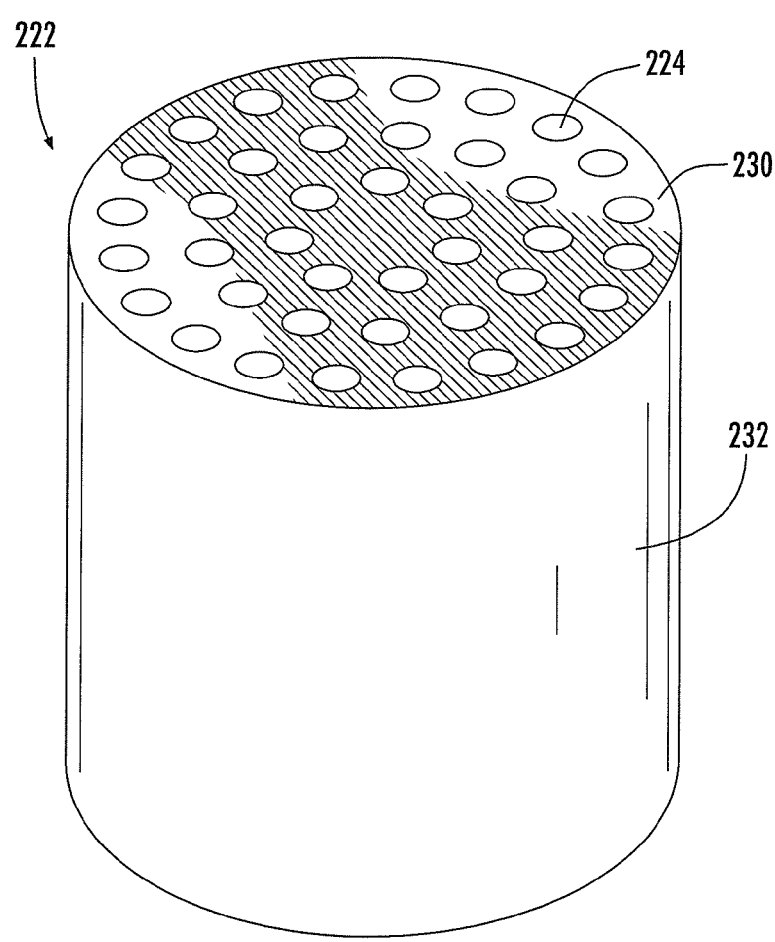

One exemplary embodiment of the wired core center 222 is illustrated in FIG. 2c. This wired core center 222 comprises a plurality of magnet wires 224 disposed in a substantially parallel orientation. The wired core center 222 may comprise any number, N, of magnet wires 224n. Further, the magnet wires 224 are bundled into a common structure by injection of a plastic or other suitable polymeric material molding 230 between each wire. Alternatively, a myriad of different processes could be readily substituted such as cable, heat-shrink, pourable thermoset, extruded, etc. The wire bundle is then optionally encased by a jacket 232 comprising either the same interior bundling material, or some other suitable material. The method by which the wired core center 222 is manufactured described in detail below. The wired core centers may be mated directly onto the bottom substrate (in some embodiments a PCB) by e.g., any surface-mount technology method including, without limitation a ball grid array, solder bump loading, or stencil printing followed by reflow.

Referring back to FIG. 2, it will also be appreciated with respect to top 204 and bottom 218 winding portions that the particular electrical pathways illustrated can take any number of configurations. Any number of different pathway configurations may be formed to connect the outer winding vias 206 to the magnet wires 224 consistent with the present invention, such as inter alia, crossed pathways, straight connect pathways, etc.

Additionally, while the embodiment of FIG. 2 illustrates an exemplary inductive device 200 comprised of three pieces (i.e., a top header 3202, which is mated to a bottom header 208 and a magnetically permeable toroidal core 210 placed between the top 202 and bottom 208 headers), other configurations including using more or fewer header pieces may be implemented consistent with the present invention. For example, the device may comprise two pieces, or, alternatively, the device may comprise more than two header elements substantially encasing the toroidal core. Moreover, the materials used for the header components may be heterogeneous in nature including, for example, the use of a PCB or other such substrate (e.g., FR-4) as one header, while the other(s) comprise(s) another material (e.g., LTCC, PBT Plastic, etc.). Such approaches may be used to reduce manufacturing costs and also allow for placement of other electronic components (e.g., passive devices such as resistors, capacitors, etc.) thereon.

It will also be appreciated that in embodiments comprising two or more headers, the cavity 212 may be disposed in either/both/all of the headers, as desired (depending on the number of headers utilized). For example, in an embodiment with two headers 202, 208, these may each comprise a cavity adapted to receive approximately one-half of the toroid (vertically) 210. In another embodiment, the toroid 210 is completely received within one of the headers, and the other(s) have no cavity at all (effectively comprising a flat plate(s)). In still another embodiment, each of the headers has a cavity, but the depth of each is different.

In yet another embodiment (not shown), the partially wired inductive device 200 assembly may comprise two pieces (the two-piece embodiment): (i) a lower header 208 element (containing a wired core center 222) and (ii) a toroidal core 210, as opposed to the three-piece embodiment described above. According to this two-piece embodiment, the lower header 208 may optionally comprise a PCB or other such substrate (e.g., FR-4), lower winding portions 218 and a plurality of and outer 206 vias and a wired core center 222. In another embodiment, the outer winding vias 206 have extended ends, similar to those described above. To complete the "winding" created by the magnet wires 224 of the wired core center 222 and the outer winding vias 206, winding portions (not shown) may be disposed directly on the toroidal core 210 surface. As another alternative, the winding portions (not shown) are comprised of a copper trace, wire or band which is run across the top of the toroidal core 210.

Partially Wired Multi-Toroidal Inductive Device—

Figure 2D:
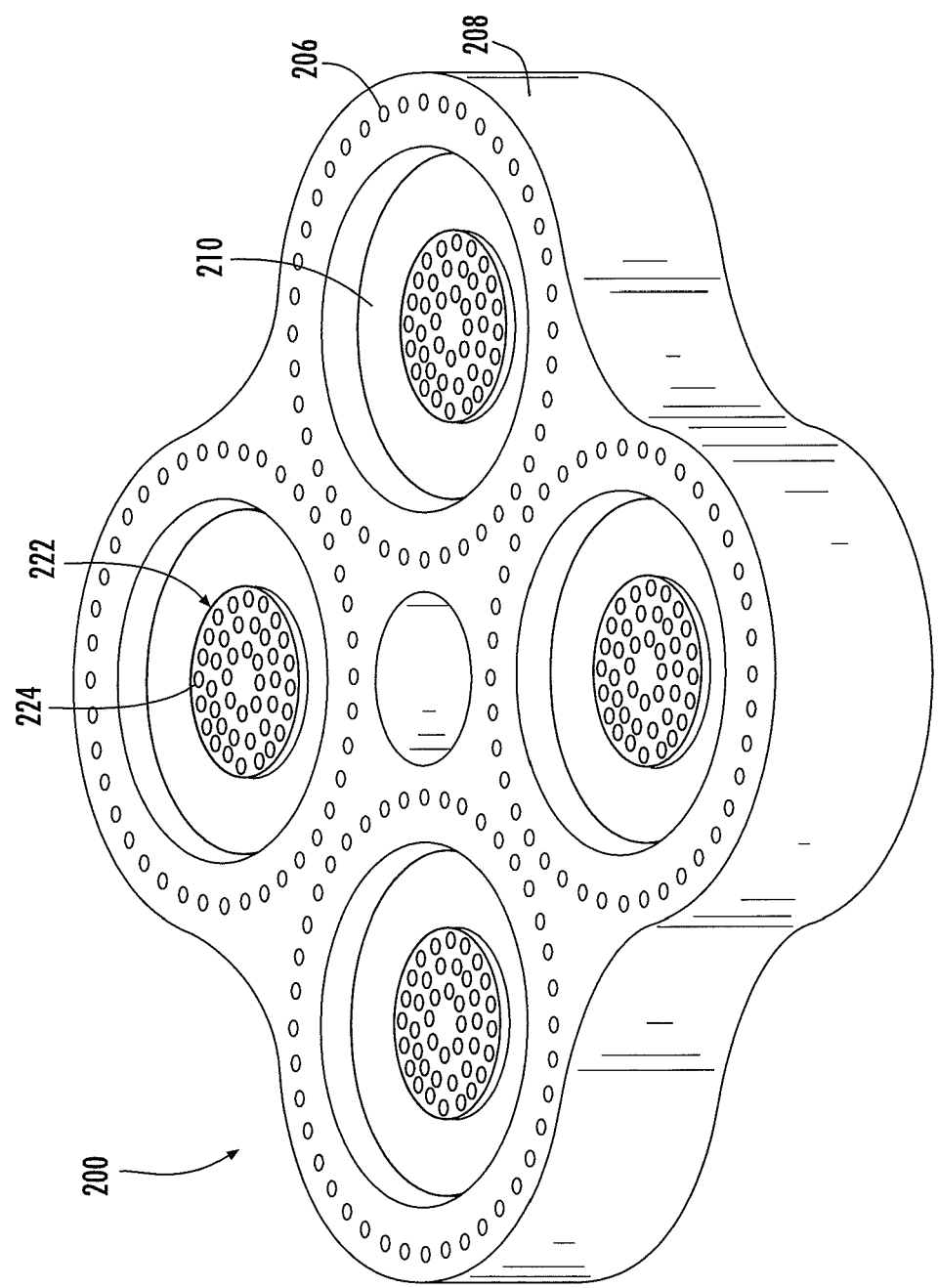

FIG. 2d illustrates an exemplary embodiment of the present invention utilizing a plurality of the aforementioned wired core centers 222 to create a partially wired device. This embodiment also features a plurality of toroidal cores. It will be recognized that the embodiment here described is applicable to a variety of inductive devices (including without limitation choke coils, inductive reactors, transformers, filters, and the like).

The inductive device 200 of FIG. 2d comprises a plurality of magnetically permeable toroidal cores 210 and a partially wired center header 208. The number of wired core centers 222n will vary proportionately with the number of toroidal cores 210n utilized.

The toroidal cores 210 of the present embodiment, as in other embodiments described above, are of the type ubiquitous in the art, and thus it will not be discussed in further detail herein. It will be appreciated that although the embodiment of FIG. 2d comprises four toroidal cores, any number may be utilized consistent with the present invention.

Figure 2E:
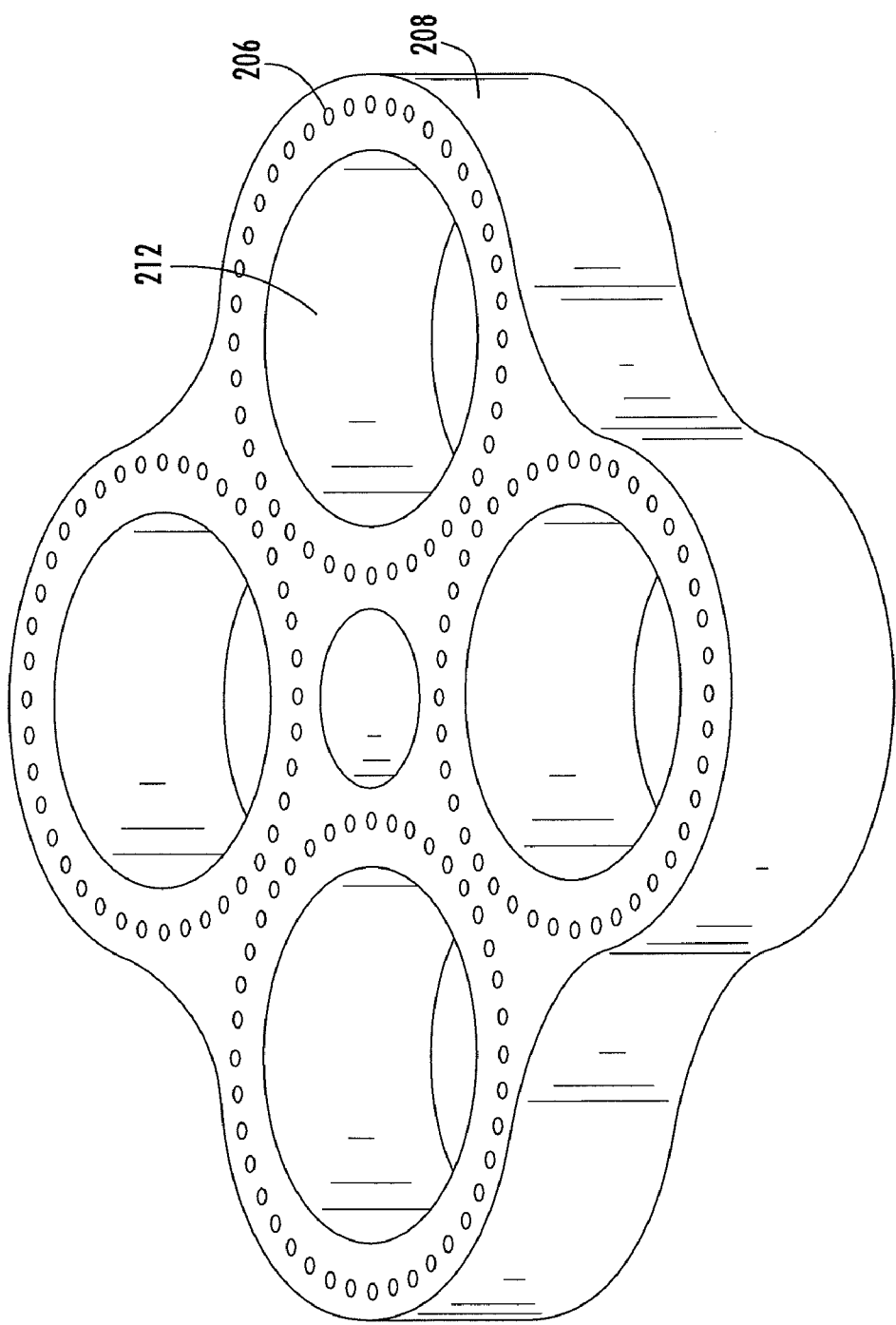

As best illustrated by FIG. 2e, the center header 208 comprises a plurality of winding vias (described below) and a plurality of cavities 212 adapted to receive a plurality of toroidal cores (not shown) and a plurality of wired core centers (not shown). The number of cavities 212 (as well as the number of wired core centers 222) will vary directly with the number of toroidal cores 210. The bottom header 208 may optionally comprise a circuit printable material such as, without limitation, a ceramic substrate or a fiberglass-based material. Further, the winding vias may comprise extended ends (not shown) which have salient advantages over magnet-wire wound inductors commonly used in the prior art, as discussed above.

A plurality of outer winding vias 206 are disposed along the edge of each of the plurality of cavities 212 such that they remain outside of the respective toroidal cores 210 when the cores are placed within their respective receiving cavities 212. The outer winding vias 206 may be placed in any number of different configurations with respect to one another and with respect to the cavities 212; FIG. 2d is merely exemplary of one embodiment for such placement.

Figure 2F:
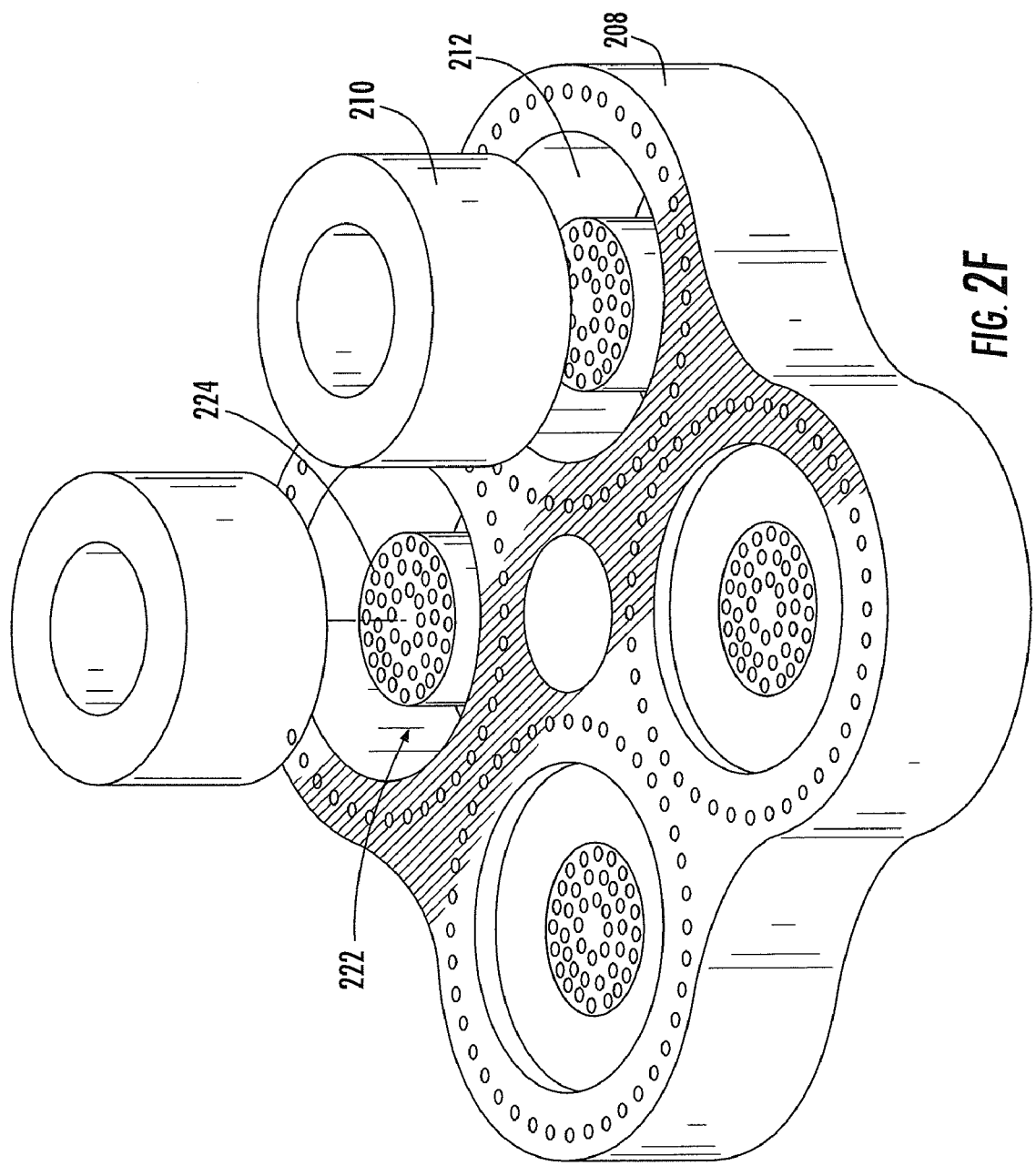

FIG. 2f illustrates the placement of the wired core centers 222 and the toroidal cores 210 into the receiving cavities 212 of the bottom header 208. The cavities 212 of this embodiment are circular in shape and of a size large enough to accommodate both the wired core centers 222 and the toroidal cores 210.

The wired core centers 222 are similar to that depicted in FIG. 2c above, having a plurality of magnet wires 224 bundled by a plastic (or other material) molding 230 and optionally encased by a jacket 232 comprised of either the same interior bundling material, or some other material depending on the desired properties. The wired core centers 222 of FIGS. 2d-2f may also comprise any number of magnet wires 224 and may be placed in a multitude of configurations with respect to one another. The method by which the wired core centers 222 are manufactured is described in greater detail below.

As depicted in FIG. 2f, each wired core center 222 is individually adapted to fit within the center hollow of a respective toroidal core 210. In the embodiment illustrated, the wired core centers 222 are placed into the center of the cavities 212 of the bottom header 208 prior to the placement of the toroidal cores 210. In another embodiment (not shown) the wired core centers 222 are first placed within the toroidal cores 210, then each core assembly (not shown) is placed within a respective receiving cavity 212 of the bottom header 208.

The outer winding vias 206 are electrically interconnected to the magnet wires 224 of the wired core centers 222 by electrical pathways (not shown) on the center header 208 lower surface. The electrical pathways may be formed by etching, or other similar methods of electrically connecting which are generally known to those of ordinary skill in the art. It is again noted that any number of pathway configurations may be formed to connect the outer winding vias 206 to the magnet wires 224 consistent with the present invention, such as inter alia, crossed pathways, straight connect pathways, etc. A "winding" is formed when the magnet wires 224 of the wired core centers 222 are electrically connected back to the outer winding vias 206 over the top of the toroidal cores 210. Alternatively the center header could be stacked between two substrates such that the electrical pathways on the center header 208 are obviated.

In one embodiment, this formation is accomplished by mating the bottom header 208 with a top header (not shown). Further, when bottom header 208 is mated to the top header, a winding portion disposed on the top header electrically connects the magnet wires 224 to the outer winding vias 206. As discussed above, the electrical pathways may be placed on the top header by etching or by a similar method of note in the field. Thus, in this three-piece embodiment, a prior art wire wound inductor or inductive device is substantially mimicked by a "winding" about the toroidal core 210 comprising a magnet wire, top header winding portion, outer winding via, and bottom header winding portion as depicted above. However, the winding of the present embodiment has noteworthy advantages (as discussed above). Further, it will be appreciated that while only a single turn is illustrated in the Figure, a multiple-turn inductive device 200 may be formed by repetition of the aforementioned pattern.

In another embodiment (not shown), to complete the "winding" created by the magnet wires 224 of the wired core center 222 and the outer winding vias 206, winding portions may be disposed directly on the surfaces of the toroidal cores 210. In yet another alternative, a copper wire band comprising winding portions (not shown) is run across the top of each toroidal core 210.

In yet another embodiment, (not shown) at least one end of the electrical pathways terminate in an extended-end via. The extended-end via (not shown) aids in the mating of the top header and bottom header 208 in the three-piece embodiment previously described, or aids in the mating of the electrical pathway disposed on the toroidal core and/or on the bottom header 208 with the magnet wires 224 and/or outer winding vias 206, depending on which approach is used.

It will be further appreciated that other embodiments using more than one header piece may be likewise be implemented consistent with the present invention. For example, such a device may comprise two or more header elements substantially encasing the toroidal core. These header elements may be alternatively designed such that one or more of them contains cavities 212 adapted to receive the toroidal cores 210. Moreover, it will also be appreciated that the materials used for the header components may be heterogeneous in nature as previously discussed. As noted above, this approach may be used to inter alia reduce manufacturing costs and also allow for placement of other electronic components (e.g., passive devices such as resistors, capacitors, etc.) thereon.

As discussed with respect to the embodiments of FIGS. 1-1*f* and 2-2*h* above, each winding portion can be printed with a high degree of placement accuracy, which underscores another salient advantage over magnet-wire wound inductors commonly used in the prior art. This is true for winding portions disposed on the bottom header 208, on the top header (in the three-piece embodiment, not shown), on a copper band (not shown), or on the surface of the toroidal core(s). Because these windings are printed or otherwise disposed using highly controlled processes, the spacing and/or pitch of the windings can also be controlled with a very high degree of accuracy, thereby providing electrical performance uniformity that is unmatched by prior art wire-wound inductive devices.

The term "spacing" as used in the present context may refer to both the distance of a winding from the outer surface of the core, as well as the winding-to-winding spacing or pitch. Advantageously, in the embodiments described above, the spacing of the "windings" is very precisely controlled, because the cavity is of precise placement and dimensions relative to the vias. Hence, windings will not inadvertently be run atop one another, or have undesired gaps or irregularities formed between them and the core due to, e.g., slack in the wire while it is being wound, as may occur in the prior art. Similarly, the thickness and dimensions of each of the winding portions can be very precisely controlled, thereby providing advantages in terms of consistent electrical parameters (e.g., electrical resistance or impedance, eddy current density, etc.). Hence, the characteristics of the underlying manufacturing process result in highly consistent electrical performance across a large number of devices.

Further, the abovementioned embodiments of the partially wired inductive device 200 (being single toroidal, multi-toroidal) have advantages in that the number of turns is also precisely controlled by the header configuration and the use of an automated printing process, thereby eliminating operator dependent errors that could result in e.g. the wrong number of turns being applied to the core.

The present invention further advantageously allows for physical separation of the windings and the toroid core, so that the windings are not directly in contact with the core, and variations due to overwinding of other turns, etc. are avoided. Thus, damage to the toroid is averted since no conventional windings are wound onto the core, thereby avoiding cuts by the wire into the surface of the toroid or its coating (if present; the use of a "separated" winding and toroid may obviate the need for additional components or coatings in some instances). For example, there may be no need for a parylene coating, silicone encapsulant, etc. in the exemplary embodiment (as are often used on prior art wire-wound devices), since the relationship between the windings and the core is fixed, and these components separated. This feature saves cost in terms of both materials and labor.

The present invention also affords the opportunity to use multi-configuration headers. For example, in one alternative embodiment, the bottom header 208 can be configured with any number of vias, such that a device utilizing all of the vias for "windings" can be formed therefrom, or a device with some fraction of the number N of vias (e.g., N/2, N/3, etc.) windings may be formed.

Connection Spacing—

Figure 3:
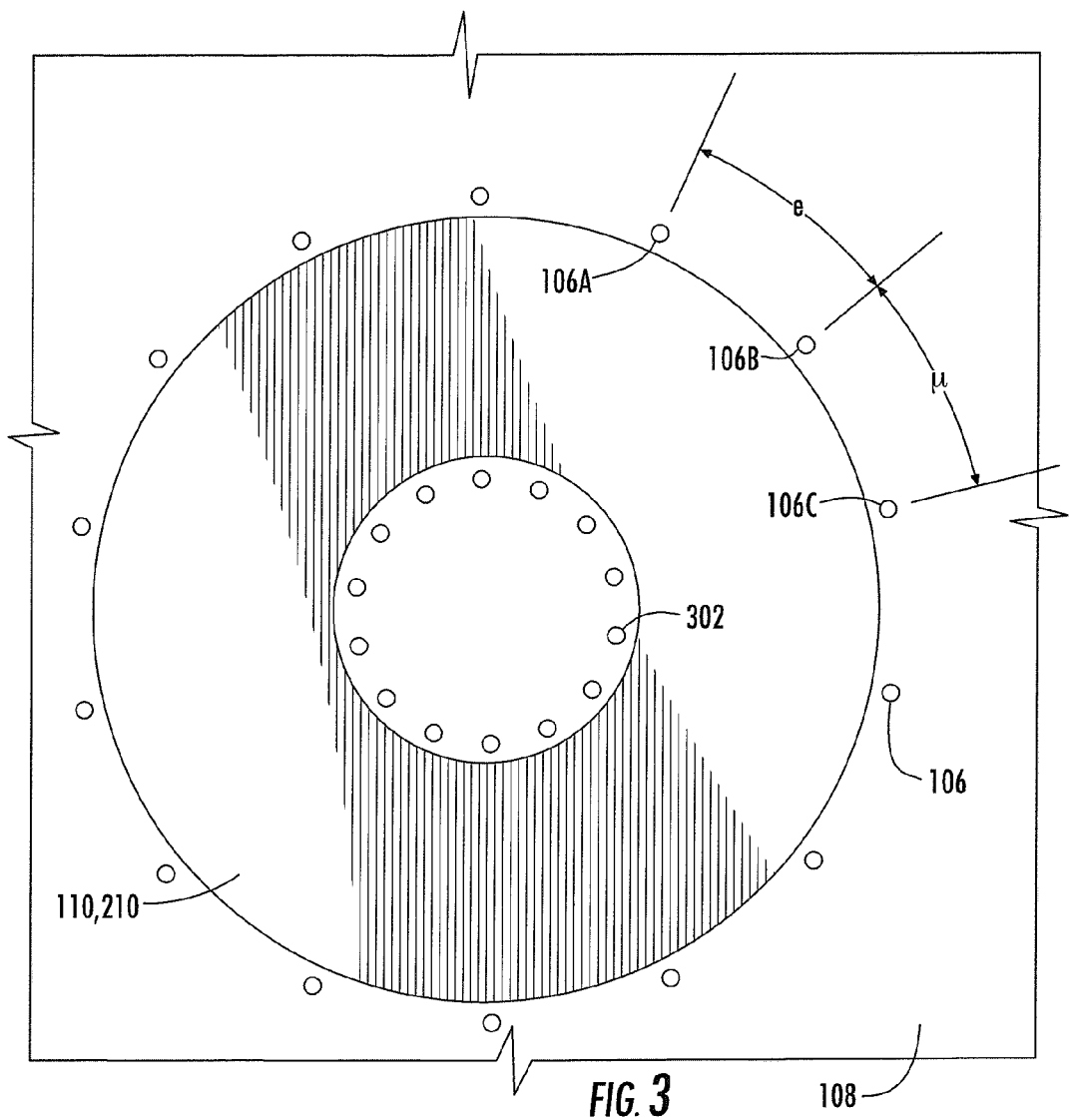
FIG. 3 is a top plan view of a bottom header of an exemplary toroidal inductive device illustrating the placement of the winding vias about the toroidal core cavity in accordance with the principles of the present invention.

Referring now to FIG. 3, another salient advantage of the inductive device 100, 200 of the above described embodiments is described. Looking down from the top at the bottom header 108, a plurality of connections 302, 106 corresponding to the inner and outer diameter of the toroidal core 110, 210, respectively result in a defined angular spacing. The bottom header 108, 208 of this embodiment may comprise a partially wired or wireless device, thereby making the inner connections 302 either specific vias 116 (whether through-hole or extended end) in the wireless embodiment; or specific magnet wires 224 in the partially wired embodiment. The outer connections 106 may be vias (whether through-hole or extended end) in both the partially wired and wireless embodiments. As previously discussed, controlling the angular spacing between windings is, in certain applications, critical to the proper operation of the inductor or inductive device 100, 200. As shown in FIG. 3, a set of three (3) outer winding vias 106*a*, 106*b*, 106*c* are shown to define the angular spacing of θ and φ, respectively. Hence, another salient advantage of the inductive device 100, 200 of the present invention over the prior art wire wound devices is that these angular spacings, θ and φ, can be tightly controlled according to any number of representative functions, such as those shown in equations (1) through (3).

$$\text{angle } \theta = \text{angle } \phi; \quad \text{Eqn. (1):}$$

$$\text{angle } \theta < \text{angle } \phi; \text{ and} \quad \text{Eqn. (2):}$$

$$\text{angle } \theta > \text{angle } \phi \quad \text{Eqn. (3):}$$

Hence, literally any number of predefined angular spacings may be utilized consistent with the principles of the various embodiments of the present invention, unlike the prior art wire-wound approaches. Such ability to control spacing and disposition of the windings allows for control of the electrical and/or magnetic properties of the device (such as where the toroid is gapped, and the placement of the windings relative to the gap can be used to control flux density, etc.).

Multiple Turn Inductive Devices—

While a single winding inductive devices 100, 200 have been primarily shown and described in the aforementioned embodiments for purposes of illustration, the principles of the present invention are equally applicable to multiple winding embodiments such as those described in FIGS. 1*d* and 1*e* of co-owned and co-pending U.S. patent application Ser. No. 11/985,156 entitled "WIRE-LESS INDUCTIVE DEVICES AND METHODS", which is incorporated by reference herein in its entirety. Specifically the application describes forming secondary windings by using multiple layer printed substrates in order to run traces between the inner and outer vias and/or wires. The use of three (3) or more windings is also disclosed.

Self-Leaded Inductive Devices

Figure 4:
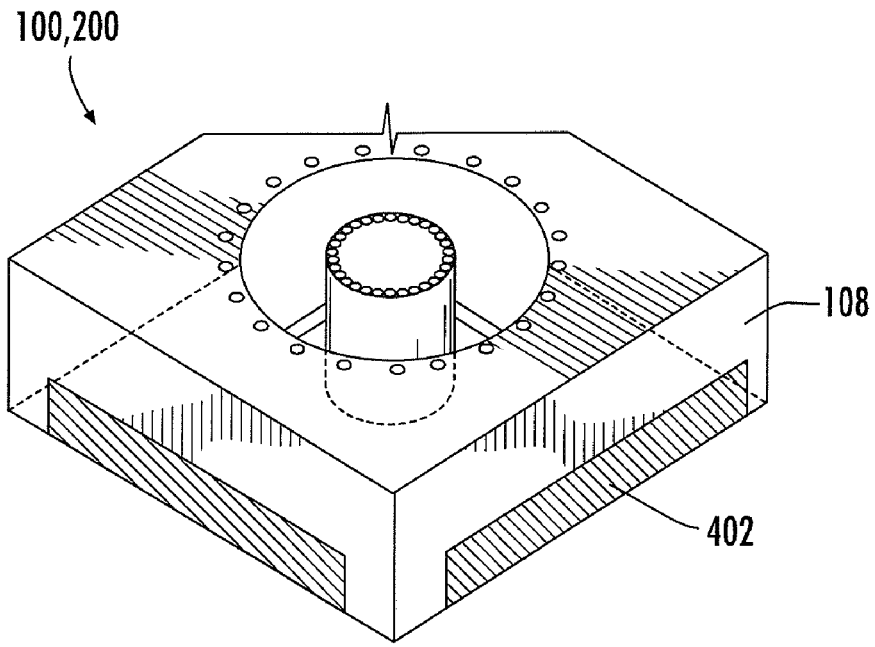
FIG. 4 is a perspective view an exemplary self-leaded toroidal inductive device in accordance with the principles of the present invention.

FIG. 4 depicts yet another embodiment of the inductive device 100, 200 wherein the bottom header 108, 208 utilizes two (2) plated pads 402 in order to surface-mount the inductive device 100, 200 to an external device (not shown). In effect, the pads 402 of the present embodiment make the inductive device 100, 200 a self-leaded device. The pads 402 act as an interface between the external device (not shown) and the ends of the windings of the inductor. These pads 402 comprise plated tracing similar to that used with regards to e.g. the top header windings 104 shown on the top header 102. The inductive device 100, 200 may then be surface mounted to an external device using well known soldering techniques (such as IR reflow) now ubiquitous in the electronic arts.

Further, it will be appreciated that any number and shape of pads may be readily utilized consistent with the present invention. Additionally, the pads 402 may comprise a single pad, or may be placed entirely or partially on an edge (or edges) of the device 100, 200, or entirely or partially on a surface of the device 100, 200. These variations in pad layout are well within the knowledge of one of ordinary skill given the present disclosure provided herein, and hence not described further.

Moreover, although the features of FIG. 4 are depicted on an embodiment which generally resembles the embodiment described with respect to the single toroidal, partially-wired embodiment of FIG. 2 above, any of the aforementioned embodiments (including without limitation multi-toroidal and/or wireless embodiments) may be utilized consistent with the present invention.

Twisted Pair Windings—

Figure 5:
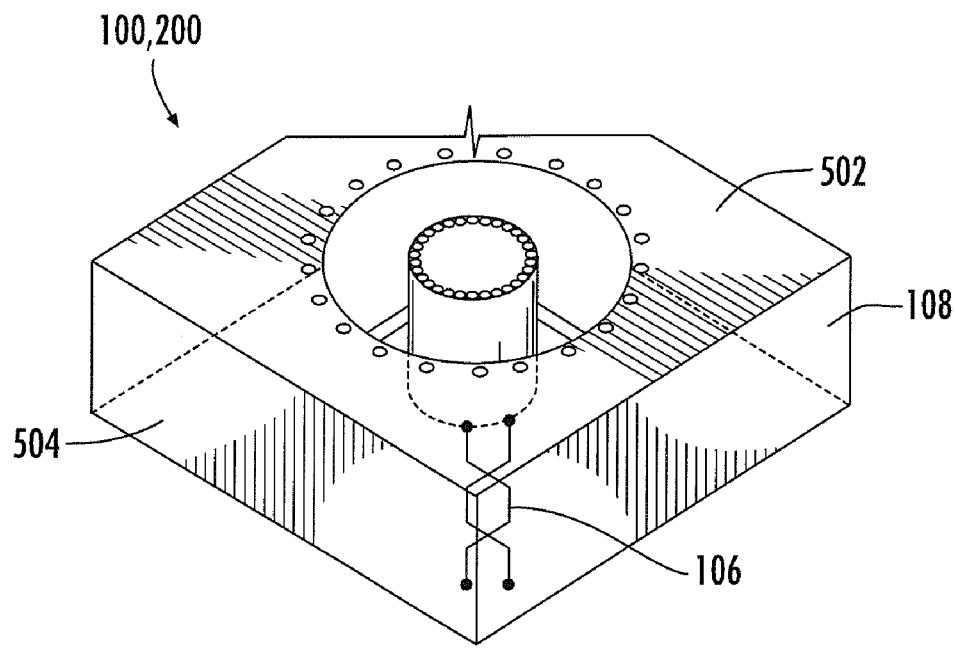
FIG. 5 is a perspective view of an exemplary toroidal inductive device illustrating twisted pair windings.

Referring now to FIG. 5, still another embodiment of an inductive device 100, 200 is shown and described in detail. In the embodiment of FIG. 5, twisted pair windings are integrated into one or more headers of inductive device 100, 200. As is known in the prior art, twisted pair winding is a form of wiring in which two or more conductors are wound around each other for the purposes of, inter alia, canceling out electromagnetic interference ("EMI") from external sources and/or crosstalk between neighboring conductors. This configuration can also provide capacitive coupling. The twist rate of a winding (usually defined in twists per meter or twists per inch) makes up part of the specification for any given class of twisted pair winding. Generally, the greater the number of twists, the more that adverse electrical interference such as crosstalk is reduced. Twisting wires decreases interference in relation to the loop area between the wires, which in turn determines the magnetic coupling introduced into the underlying signal. For example, in networking applications, there are often two conductors which carry equal and opposite signals which are combined by subtraction at the destination. The noise signals introduced or received onto the two wires cancel each other in this destination subtraction operation because the two wires have been exposed to similar levels of electromagnetic interference noise.

Similarly, the two "windings" can merely be run substantially parallel yet proximate one another to produce a desired degree of capacitive and/or electromagnetic coupling between them. For example, in a transformer implementation, the proximity of the "windings" could be use to couple electromagnetic energy between the primary and secondary of the transformer. This is true of any two or more traces on the device 100,200; i.e., by placing them in a desired disposition (e.g., parallel) and distance, a desired level of coupling between the windings can be accomplished. Moreover, this coupling approach can be used on multiple layers or levels of the device.

FIG. 5 illustrates one example of the twisting of bottom header 108 outer winding vias 106. It will be appreciated however, that a multitude of other embodiments including, without limitation, embodiments in which the outer winding vias 102 of the top header, the inner windings of the top header, and/or the inner windings of the bottom header where appropriate (i.e., in the wireless embodiments) comprise twisted windings. As can be seen in FIG. 5, adjacent outer winding vias 106 of the bottom header will collectively form a twisted pair between the top surface 502 and the bottom surface 504 of the header 108, 208. At intermediate levels of the header 108, 208 (or in embodiments where multiple headers are stacked), traces are formed which effectively 'spiral' about one another thereby providing a twisted pair effect in the individual vias 106. While primarily discussed with reference to a bifilar twisted pair, it will be recognized that trifilar/quadfilar windings, etc. could be added to the inductive device design (not shown). Such modifications and adaptation are within the skill of an ordinary artisan given the present disclosure provided herein, and hence not described further herein.

It will also be appreciated that although the features of FIG. 5 are depicted on an embodiment which generally resembles the embodiment described with respect to the single toroidal, partially-wired embodiment of FIG. 2 above, any of the aforementioned embodiments (including without limitation multi-toroidal and/or wireless embodiments) may be utilized consistent with the present invention.

PCB Mountable Inductive Devices—

Figure 6:
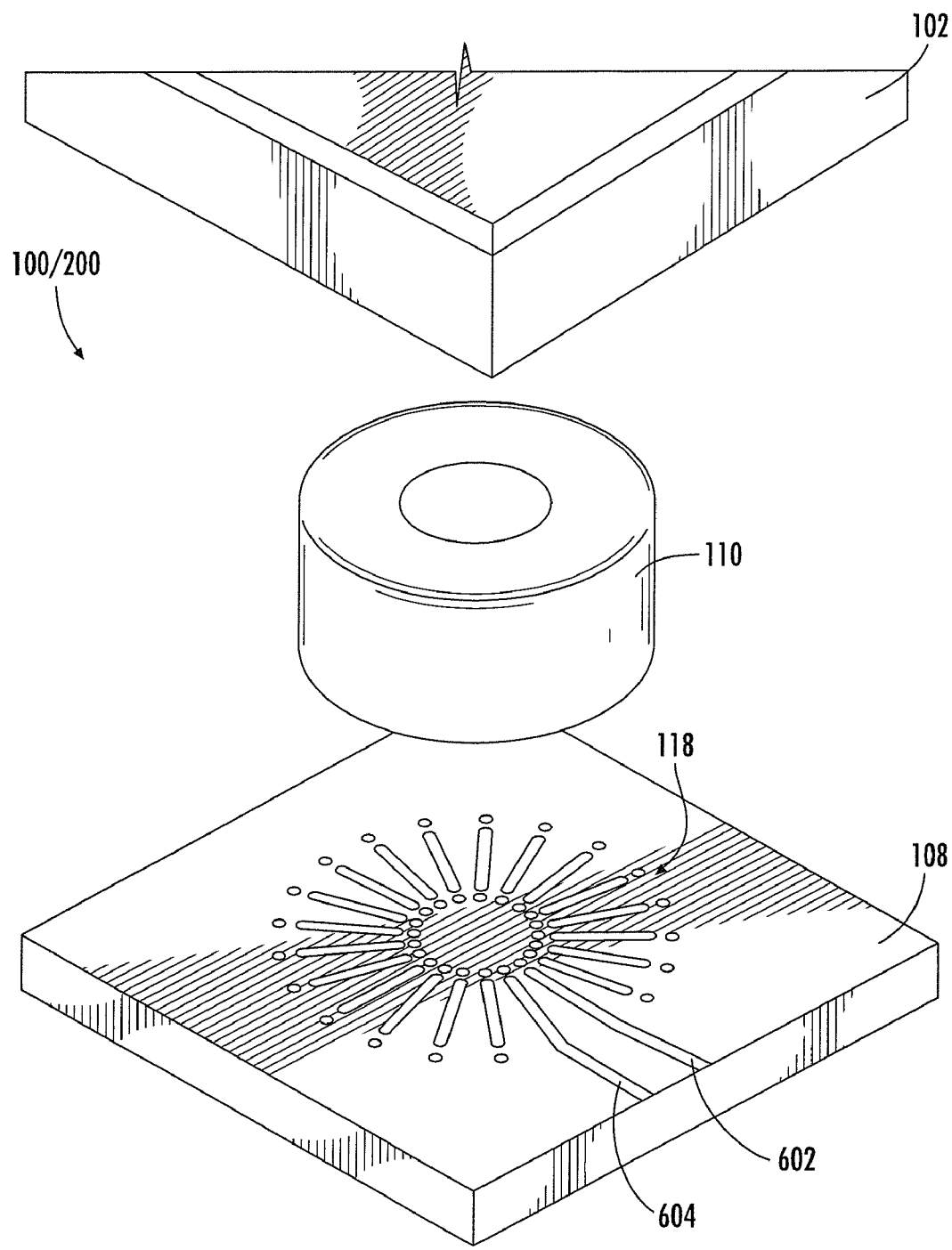
FIG. 6 is a perspective exploded view of an exemplary toroidal inductive device illustrating windings implemented on a printed substrate.

Referring now to FIG. 6, another embodiment of the inductive device 100, 200 is shown and described in detail. It will be appreciated however, that although a single toroidal embodiment is illustrated, a multitude of other embodiments including e.g., multi-toroidal, partially wired, and/or wireless embodiments may be employed consistent with the features presented in FIG. 6. Further, the present embodiment may also be practiced with vias having extended-ends, the advantages of which having been described in detail previously herein.

As can be seen in FIG. 6, the bottom windings 118 which were previously incorporated onto a bottom header (as depicted in, for example, FIG. 1*d*—see the bottom header 108) are now implemented directly on the parent (e.g., customer's) printed circuit board 602. Input 604 and output 602 traces are routed between the inductive device 100/200 and other electronic components present on the circuit board 602. In this embodiment, the top header 102 is illustrative of an embodiment where the windings (i.e., windings 104 on FIG. 1) are no longer visible or electrically exposed on the top surface of the inductive device 100, 200. This can be accomplished by, e.g., depositing a layer of non-conductive material over the top surface of the header 102 after the windings 104 are formed. This "covered" approach allows the device 100, 200 to be surface mounted using automated processes such as a pick-and-place machine without potentially causing damage to the underlying printed windings.

Identical Header Inductive Devices—

In the two-header embodiments discussed above (i.e., those with three pieces) the two headers may be substantially identical. In one variant, the two substantially identical headers have substantially identical winding portions disposed on their respective outer surfaces so that the finished (and printed) headers are substantially identical as well. This produces a set of interspersed or "inter-wound" windings, effectively comprising a loosely helical or bifilar arrangement. This approach has the advantage of being able to construct the resulting device 100, 200 using headers which are identical; i.e., the top and bottom headers can be identical, thereby obviating the need for different components. This significantly reduces manufacturing cost, since there is no need to make, stock and handle differing configurations of headers.

These substantially identical components (not shown) may also have at least two degrees of achirality (i.e., non-handedness), thereby allowing them to be substantially orientation-agnostic during assembly. For example, a machine could place the "top" header in a random rotational (angular) orientation, and then place the second, bottom header in an inverted orientation, yet also random with respect to angle. If the headers are, for example, square in profile, then all that would be required is for the corners of the tops and bottom headers to align, thereby guaranteeing that the vias of each would align as well. It is appreciated that manufacturing the headers in other shapes may accomplish the same achirality described above as well. This greatly improves manufacturing flexibility and reduces cost, since e.g., the machines used to manufacture these devices need only have sufficient intelligence to pick two headers, place one in inverted orientation to the other, and then align the corners.

Integrated Inductive Devices—

Figure 7:
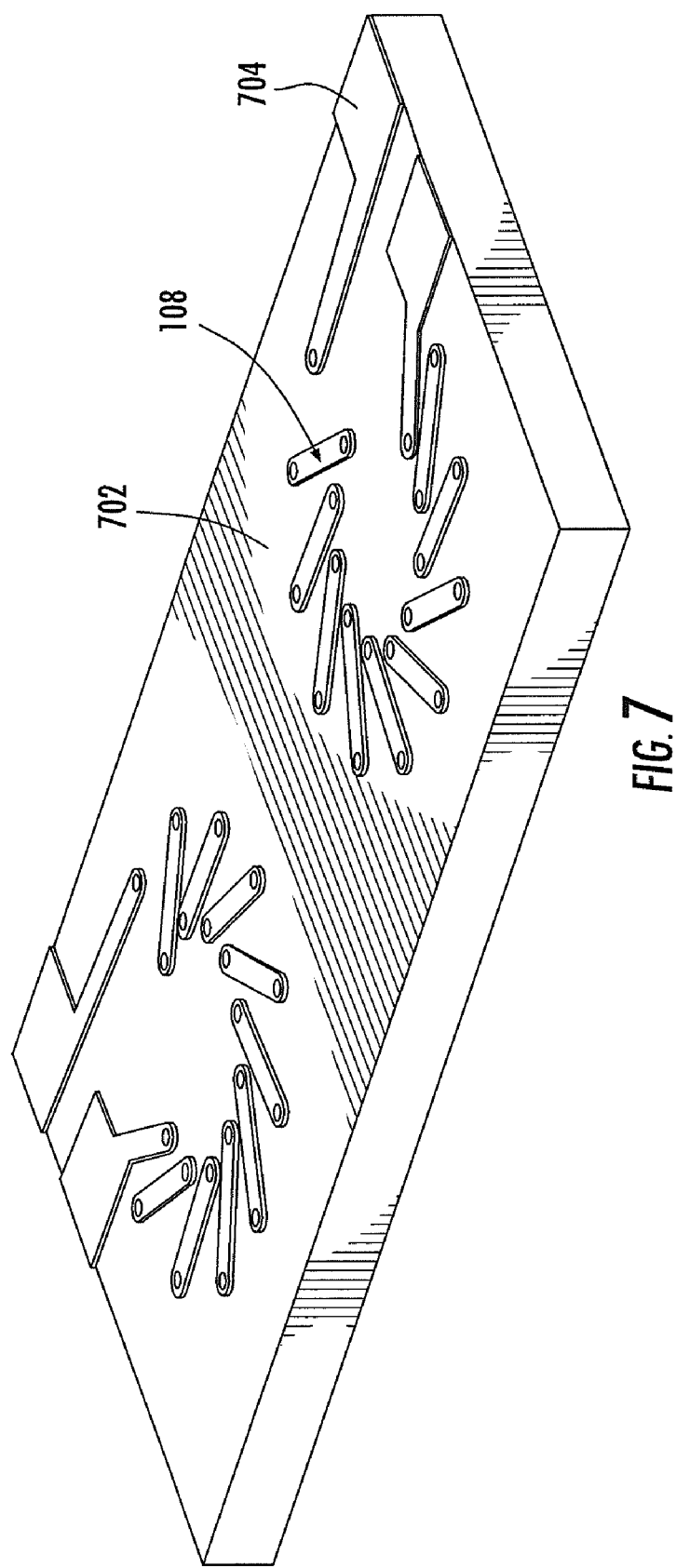

Referring now to FIG. 7, an exemplary top substrate header 702 of a multiple toroidal inductive device is illustrated. In the present embodiment, the header 702 comprises a plurality of windings 108 and one or more electronic component receiving pads 704. It will be appreciated that the features of the top substrate header 702 in FIG. 7 may be utilized in conjunction with any of the aforementioned embodiments, including without limitation, single-toroidal, partially wired, and/or wireless embodiments.

The exemplary top substrate 702 of the present embodiment possesses yet another advantage over prior art wound inductive devices. Namely, portions of the windings 104, 204 can be printed in combination with one or more electronic component receiving pads 704. These electronic component receiving pads 704 are then utilized to mount e.g. surface mountable electronic components (e.g. chip capacitors, resistors, integrated circuits and the like) between individual windings 108 of the toroidal inductive devices 100, 200. This allows for integrated inductive devices that utilize more than just toroidal cores and offer integrated customer solutions. This also obviates the need for discrete capacitors/resistors. Further, an RLC matching network or other such circuitry may be embedded in the PCB or other substrate. For instance, many well known magnetic circuits utilized in, for example, Gigabit Ethernet circuit topologies utilize what is known in the industry colloquially as a "Bob Smith" termination. These terminations typically utilize a plurality of resistors tied in parallel to a grounded capacitor. See, e.g., U.S. Pat. No. 5,736,910 to Townsend, et al. issued Apr. 7, 1998 entitled "Modular jack connector with a flexible laminate capacitor mounted on a circuit board", which is incorporated herein by reference in its entirety. By offering mounting locations for these circuit elements directly onto the substrate header 702, an integrated magnetics solution can be provided for a minimal addition of cost.

Other Toroidal Structure Inductive Devices—

In another embodiment, a flattened toroidal core (not shown) may be utilized rather than the traditionally shaped toroidal core 110, 210 of the exemplary embodiments of FIGS. 1-7 above. The flattened toroidal core may be utilized in all of the above-mentioned embodiments including, without limitation, partially wired, wireless, single toroidal and multi-toroidal embodiments. A flattened toroidal core (has the advantage of being thinner and thus enabling the use of thinner PCB's and higher density vias. A flattened toroidal core also has the advantage of having an increased surface area (over that of a traditionally toroidal core). The increased surface area can advantageously be used to accommodate more traces and more trace configurations (including e.g., crossed traces), as well as allowing for varied distances between circuit pathways. Further, a flattened toroidal core may be partially integrated, wherein signal conditioning circuitry is placed on the core surface.

Non-Toroidal Inductive Devices—

In yet another embodiment, the cavities, winding vias, and wired center cores (where appropriate) of the above-mentioned inductive devices may be adapted to receive one or more magnetically permeable cores (not shown) which are not toroidal in shape. Some examples of the non-toroidal cores include without limitation: E-type cores, cylindrical rods, "C" or "U" type cores, EFD or ER style cores, binocular cores and pot cores. However, it is recognized that toroidal cores, such as those described with regards to FIGS. 1-6 herein (see toroidal cores 110, 210), have many advantages as a result of the geometry of these cores. Namely, the toroidal geometry provides the inductive device with a space- and power-efficient device with a comparatively low EMI signature.

High Frequency Coupling—

Figure 8:
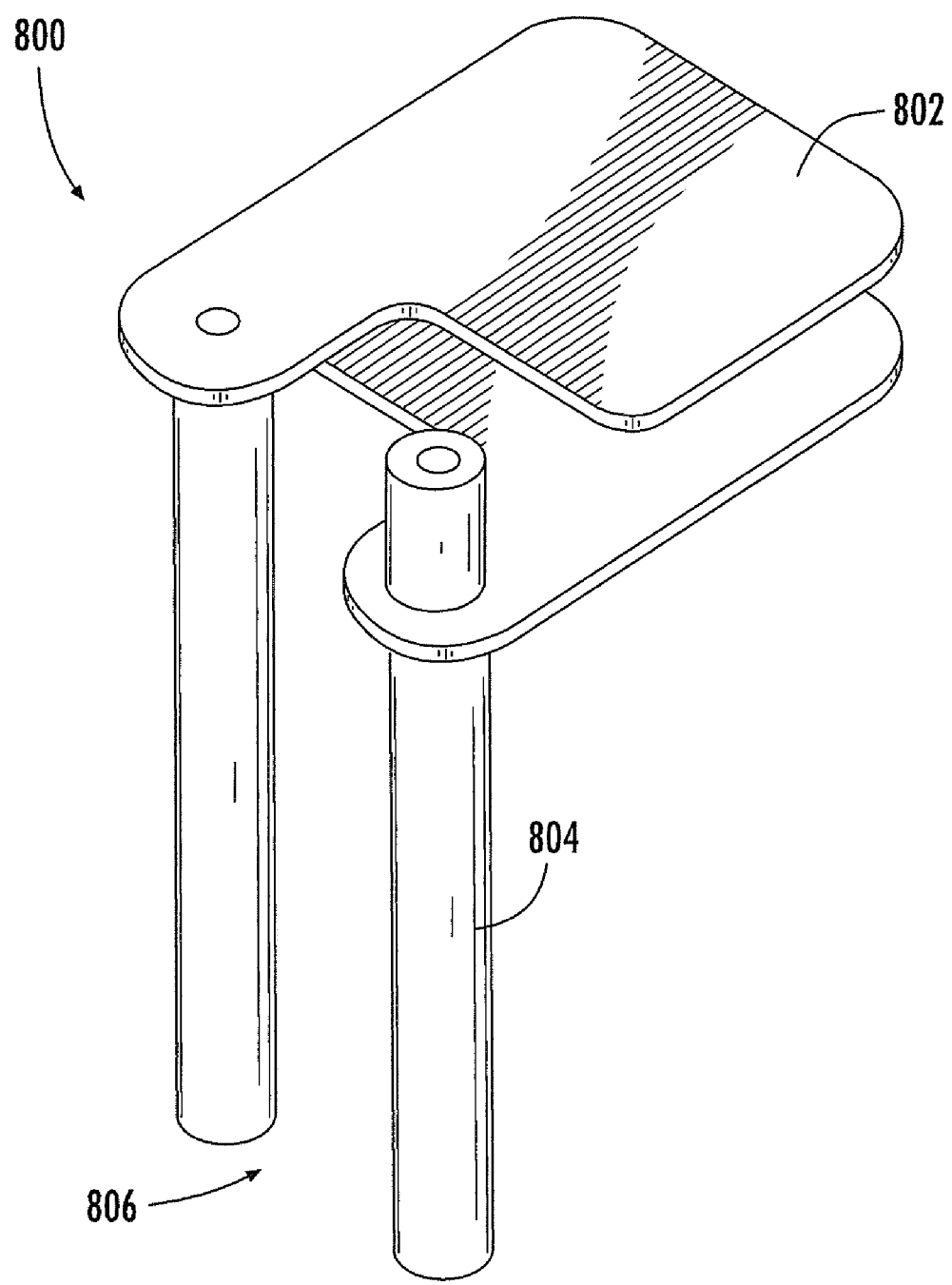
FIG. 8 is a perspective view illustrating an exemplary capacitive structure for use in an inductive device in accordance with the principles of the present invention.
Figure 8A:
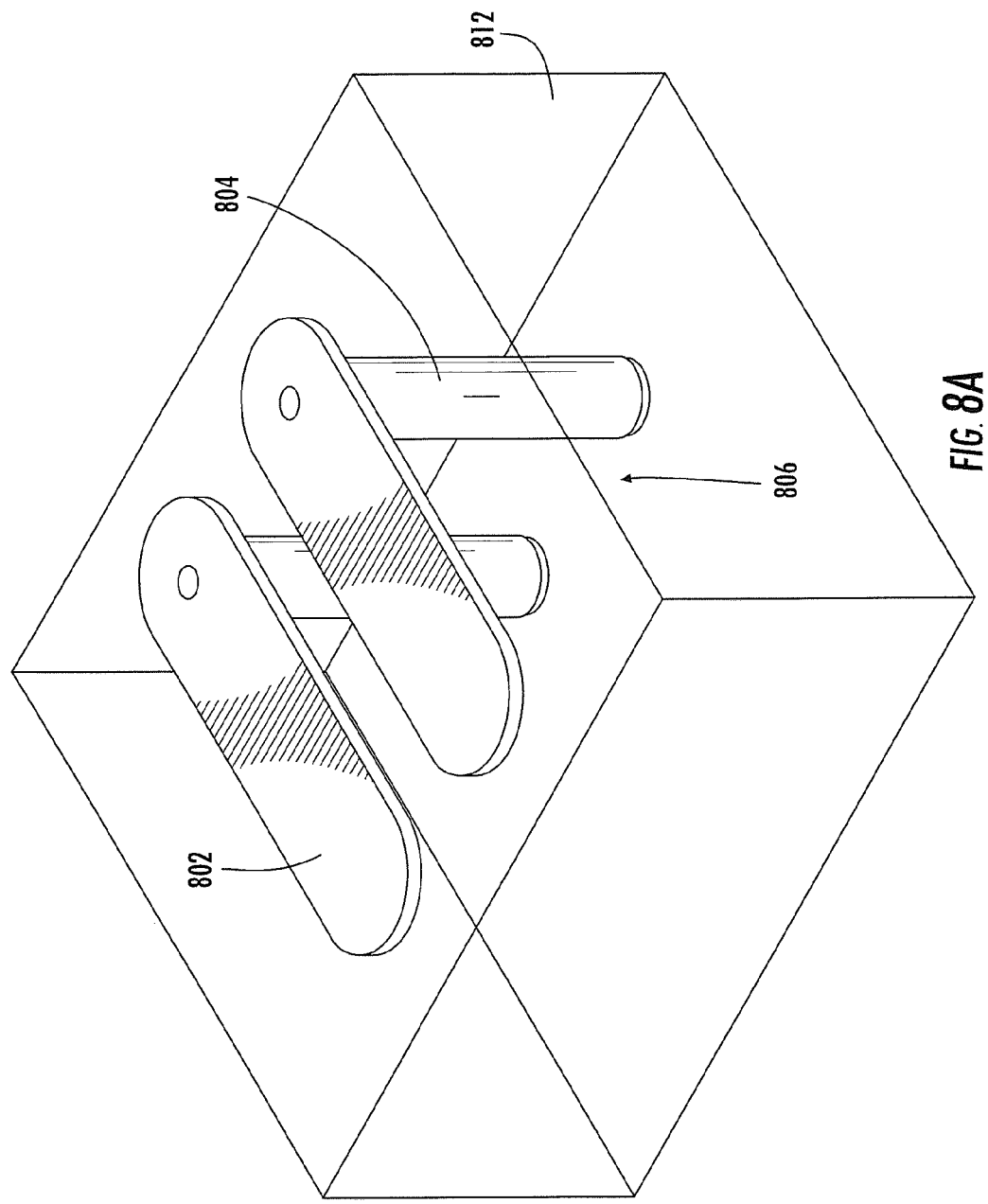
FIG. 8a is a perspective view illustrating an exemplary capacitive structure disposed within a header of an inductive device.
Figure 8B:
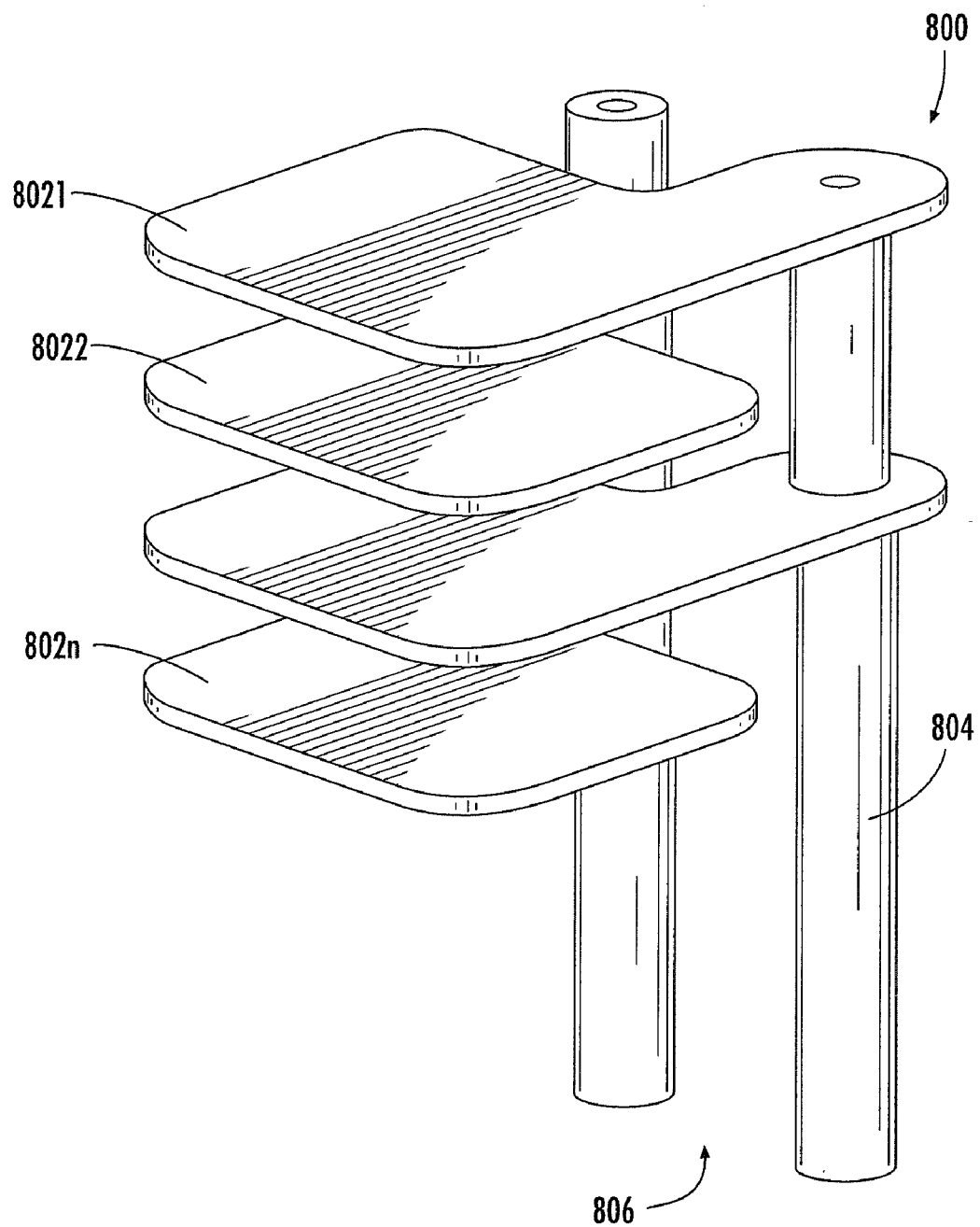
FIG. 8b is a perspective view illustrating yet another exemplary capacitive structure for use in an inductive device comprising parallel, multi-layered capacitive pads.

As illustrated in FIGS. 8-8b, a plurality of winding traces may be disposed proximate one another, yet in different layers of the header or associated substrate of the device 100, 200. Such a configuration may be useful, e.g., for high-frequency coupling of signals. It is appreciated that the embodiments of FIGS. 8-8b may be used with any of the above-described embodiments of the inductive device 100, 200, including without limitation, multi-toroidal, single toroidal, wireless, and partially wired embodiments.

Specifically, the ground (G), positive (+), and negative (−) windings of a coupled transformer may be disposed in different layers of the header or substrate (e.g., FR-4 PCB or the like) and separated by a dielectric. The windings and dielectric can then be used to form capacitive structures 800, as well as providing inductive (magnetic) field coupling between the different windings.

This configuration is similar to methods used for crosstalk reduction and compensation within the field of modular connectors, for example, U.S. Pat. No. 6,332,810 to Bareel issued Dec. 25, 2001 and entitled "Modular telecommunication jack-type connector with crosstalk reduction", incorporated herein by reference in its entirety, which discloses a modular jack connector having a crosstalk compensation arrangement which is comprised of parallel metallic plates (P4, P6) connected to a spring beam contact portion (S4, S6) of the terminals. According to that invention, the plates are metallic surfaces mounted in parallel to form physical capacitors with the purpose of reducing the well known crosstalk effect and more particularly the Near End CrossTalk, or NEXT, between the wires of different pairs. As another example, U.S. Pat. No. 6,409,547 to Reede issued Jun. 25, 2002 and entitled "Modular connectors with compensation structures", also incorporated herein by reference in its entirety, discloses a modular connector system including a plug and a jack both arranged for high frequency data transmission. The connector system includes several counter-coupling or compensation structures, each having a specific function in cross-talk reduction. The compensation structures are designed to offset and thus electrically balance frequency-dependent capacitive and inductive coupling. One described compensation structure, located near contact points and forms conductive paths between connector terminals of the jack and connector terminals of the plug, comprises several parallel capacitive plates. According to that invention, the plates are placed on the rear side of cantilever spring contacts and outside the path taken by the current that conveys the high frequency signal from the contact point of plug to jack to the compensating structures in of the high frequency signal paths from plug to jack.

In FIG. 8, an exemplary capacitive structure 800 to be placed within a header or substrate is illustrated. The layers of the header substrate on which windings may be disposed in this embodiment comprise capacitive plates 802. Each capacitive plate 802 is physically attached to a separate winding 804 of a winding pair 806. The windings 804 may be the outer windings of the bottom header (i.e. 106 in FIG. 1f), or may be the outer or inner windings of the top header (i.e. 102 and 122 respectively in FIG. 1f). It is also appreciated that the windings 804 may be exemplary of the inner windings of the bottom header in the wireless embodiment (i.e. 116 in FIG. 1f).

The capacitive plates 802 of the embodiment in FIG. 8 are placed substantially parallel to one another in a layered configuration so as to create the aforementioned inductive (magnetic) field coupling between the winding pair 806 (comprised of windings 804). The capacitive plates 802 are designed with a preselected overlap which maximizes the capacitance between the plates, and hence the amount of high-frequency energy coupling between the contacts. Further, the selection of the size and dimensions of the capacitive plates 802, as well as their distance relative to one another and/or to a dielectric, is calculated and adjusted in order to obtain the best compensation. The capacitive plates 802 may be comprised of metal or metal alloys, or any other suitably conductive material.

The embodiment of FIG. 8a illustrates the placement of the capacitive plates 802 in a non-layered parallel pair. Rather, the capacitive plates 802 of FIG. 8a are placed on the same plane as one another, yet are parallel, thus creating the advantageous capacitive field intended to promote high frequency coupling of the winding pair 806 (comprised of windings 804) from which the capacitive plates 802 extend.

FIG. 8a further depicts the placement of the capacitive structures 800 within the body of a header or substrate 812. As discussed above, the header or substrate may comprise, without limitation, a top header, bottom header, or PCB.

Further, as depicted in FIG. 8b, any number of capacitive plates 802 may be layered in a capacitive structure 800 to increase the high frequency coupling of the winding pair 806. This is accomplished by placing a certain number of capacitive plates 802 on the winding 804 such that a sufficient amount of space is created to accommodate a dielectric and another capacitive plate at desired distances from one another (which may vary plate-to-plate if desired as well). Then, a set number of capacitive plates 802 are placed on the other winding 804 of the winding pair 806 in the same manner as those of the first winding 804. The placement of the capacitive plates 802 on the first and second winding 804 will be offset such that those of the first winding 804 fall between those of the second winding 804, thereby creating a structure having capacitive plates 8021, 8022 ... 802n. When the windings 804 of the winding pair 806 are placed near each other, a large surface area of the capacitive structure 800 is created thus providing increased high frequency coupling.

Jacketed Windings—

In addition to physical and manufacturing considerations, the electrical performance of the inductive device may be considered. One means by which the electrical performance of is gauged is the high-potential (hi-pot) test. For providing adequate insulation, thus a higher withstand, co-owned U.S. Pat. No. 6,225,560 to Machado issued May 1, 2001 and entitled "Advanced electronic microminiature package and method" incorporated herein by reference in its entirety, discloses a jacketed, insulated wire for use as at least one winding of a toroidal transformer. For example, the jacketed wires may be utilized consistent with partially wired embodiments of the present invention.

Underfill—

Additionally, the above-mentioned embodiments of the device may utilize standard underfill or vacuum underfill techniques to increase withstand and prevent flashover. To enable the inductive devices described herein to withstand the application of high potential voltages (Hi-Pot) between adjacent conductive elements, each conductive element must be effectively insulated with a dielectric material to inhibit electrical arcing.

Exemplary conductive elements found within the disclosed inductive devices are: extended vias formed on upper, lower or other variants of headers, BGA interconnects between upper and lower headers, stencil printed and reflowed solder interconnects between upper and lower headers, conductive epoxy interconnects between the upper and lower headers, conductive winding elements formed on the headers, and conductive winding elements formed on the cores, and the like.

A myriad of processes can be employed to enable electrical isolation of the aforementioned and similar conductive elements. One such process commonly known in the semiconductor electronics packaging art is colloquially known as "underfill". The underfill material is comprised of an epoxy base resin which is typically mixed with solid particulates consisting of ceramic, silicon dioxide or other similar ubiquitous compounds. Underfill materials have many formulations to affect specific properties such as coefficient of thermal expansion, heat transfer, and capillary flow characteristics required for each unique application. There also exist multiple well known methods of applying underfills as disclosed herein; however these are exemplary methods which do not limit the use of other known methods to the disclosed inductive devices.

One such common method of application is to utilize capillary forces between the underfill material and the headers to pull or wick the material into a defined separation or "gap" such as between the headers after assembly. The material is dispensed proximate the separation and flows throughout the separation via means of capillary forces, thereby fully encapsulating all exposed conductive elements disposed within the separation. The assembly is then exposed to elevated temperatures which cross-links and cures the epoxy resin.

Another common method of underfill application is known as "B-Stage Curing". This method of application involves silk screening or stencil printing the underfill on a substrate, such as a header. The substrate is equipped with electrically conductive interconnect structures, typically terminated in a layer of solder. It can be appreciated by one of ordinary skill in the electronics packaging arts that a substrate may actually contain multiple singular components arranged in a unified panelized array thereby enabling high volume processing. The printed substrate is then exposed to a specific temperature which partially cures and solidifies the polymer layer whereby it is tack free, but not fully cured. The coated substrate can then be handled with ease and progresses to the component placement process whereby components are placed atop the partially cured polymer layer and are aligned with their corresponding electrical interconnects disposed on the top layer of the substrate. Once component placement is complete the assembly is exposed to a solder reflow process wherein the partially cured underfill liquefies, flowing around the conductive elements disposed within the separation. As the ambient temperature is further increased, the solder structures liquefy, forming a solder joint between the electrical interconnects on the components with the corresponding electrical interconnects disposed on the substrate. As the temperature is reduced the solder solidifies and the underfill material subsequently fully cross-links and cures around the conductive elements thereby forming an epoxy coating around all conductive elements.

Another such process of applying the underfill material to an assembly is to employ a process known as vacuum underfilling. Typically, this process is performed as a final processes step after the headers and components have been soldered or joined together. The assembly is placed in a chamber wherein the air is substantially evacuated via means of a vacuum pump or similar device. The underfill material is then dispensed proximate and sometimes within the separation between headers, then the air is allowed back into the chamber thereby forcing the underfill into all interstices within the assembly via differential air pressure.

Another exemplary method of encapsulating conductive elements within a dielectric coating is the use of a vapor phase deposition process. These processes are common in the electronic and semiconductor arts wherein the assembly is exposed to a chemical gas which is modified via pyrolytic or electromagnetic means, and subsequently deposited on the assembly. One such process is the application of a Parylene coating wherein a dimer hydrocarbon polymer is vaporized under vacuum creating a hydrocarbon dimer gas. The resultant dimer gas is then pyrolized modifying its structure to a monomer. The monomer is subsequently deposited on the entirety of the inductive device structure as a continuous polymeric film thereby encapsulating all elements (conductive and non-conductive) in a dielectric material. The salient benefits of this process are the resultant high dielectric strength of the deposited polymeric film, the high volume manufacturing capacity of the process, and the ability of the gas to penetrate all interstices of the structure, thereby creating a void free continuous coating on all conductive elements, irrespective of their geometry.

Exemplary Inductor or Inductive Device Applications—

Inductors and inductive devices, such as those previously described with respect to FIGS. 1-7, can be used extensively in a variety of analog and signal processing circuits. Inductors and inductive device in conjunction with capacitors and other components form tuned circuits which can emphasize or filter out specific signal frequencies (e.g., DSL filters). The various embodiments of the invention may readily be adapted for any number differing inductor or inductive device applications. These applications can range from the use of larger inductors for use in power supplies, to smaller inductances utilized to prevent radio frequency interference from being transmitted between various devices in a network. The inductors or inductive devices of the present invention may also be readily adapted for use as common-mode choke coils or inductive reactors which are useful in a wide range of prevention of electromagnetic interference (EMI) and radio frequency interference (RFI) applications.

Smaller inductor/capacitor combinations can also be utilized in tuned circuits used in radio reception and/or broadcasting. Two (or more) inductors which have a coupled magnetic flux may form a transformer which is useful in applications that require e.g. isolation between devices. The inductors and inductive devices of the present invention may also be employed in electrical power and/or data transmission systems, where they are used to intentionally depress system voltages or limit fault current, etc. Inductors and inductive devices, and their applications, are well known in the electronic arts and as such will not be discussed further herein.

In another aspect, the apparatus and methods described herein can be adapted to forming components for miniature motors, such as a miniature squirrel-cage induction motor. As is well known, such an induction motor uses a rotor "cage" formed of substantially parallel bars disposed in a cylindrical configuration. The vias and winding portions previously described may be used to form such a cage, for example, and or the field windings (stator) of the motor as well. Since the induction motor has no field applied to the rotor windings, no electrical connections to the rotor (e.g., commutators, etc.) are required. Hence, the vias and winding portions can form their own electrically interconnected yet electrically separated conduction path for current to flow within (as induced by the moving stator field).

Methods of Manufacture of Wireless Inductive Devices—

Methods of manufacturing of the wireless inductive devices 100, 200 described above with regard to FIG. 1-1o are now described in detail. It is presumed for purposes of the following discussion that the headers 102, 108 are provided by way of any number of well known manufacturing processes including e.g., LTCC co-firing, formation of multilayer fiber-based headers, etc., although these materials and formation processes are in no way limiting on the invention.

It will also be recognized that while the following descriptions are cast in terms of the embodiments previously described herein, the methods of the present invention are generally applicable to the various other configurations and embodiments of inductive device disclosed herein with proper adaptation, such adaptation being within the possession of those of ordinary skill in the electrical device manufacturing field.

Figure 9A:
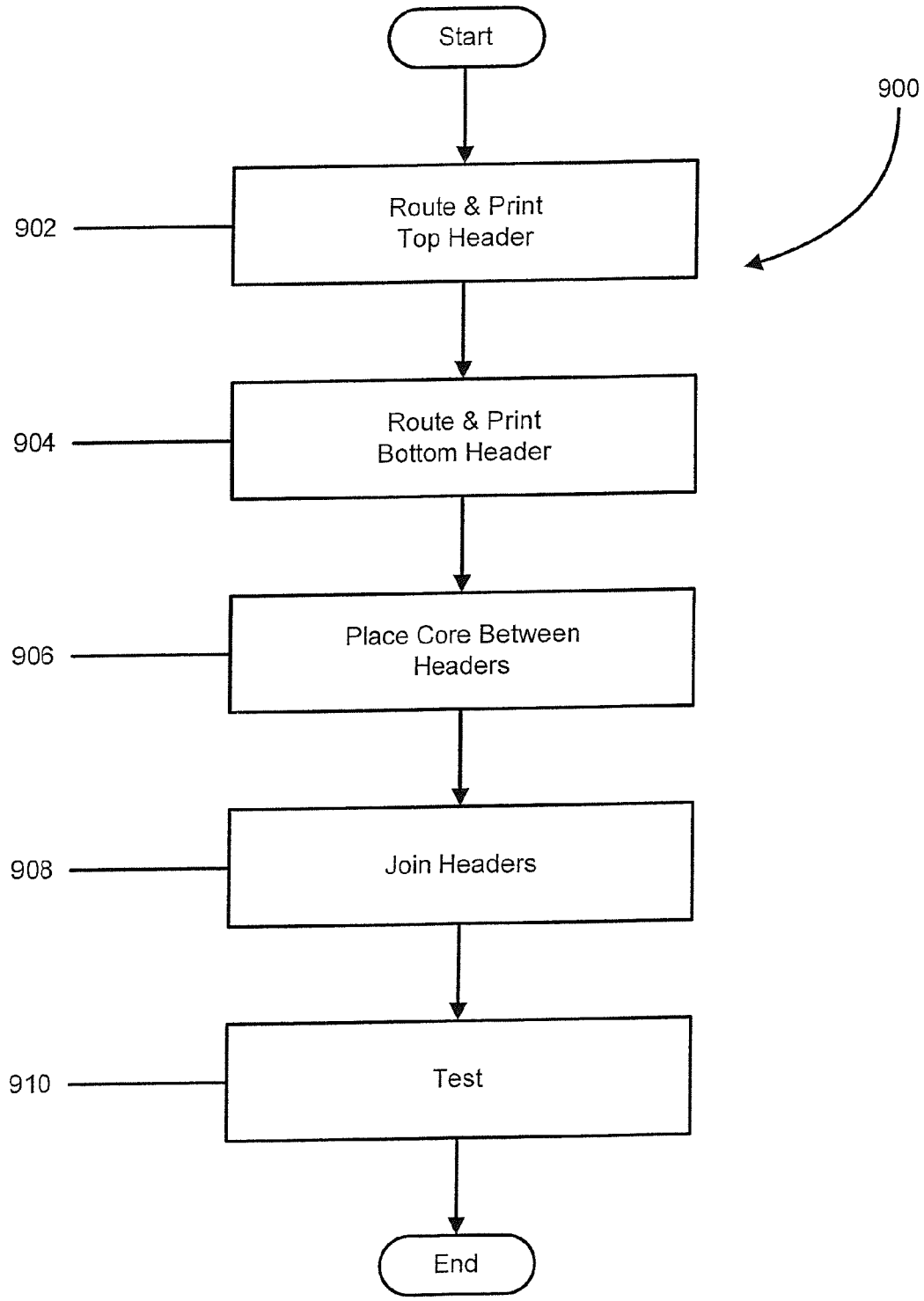
FIG. 9a is a logical flow diagram illustrating a first exemplary method for manufacturing a wire-less inductive device produced in accordance with the principles of the present invention.

Referring now to FIG. 9a, a first exemplary method 900 of manufacturing a wire-less inductive device (such as that shown in FIG. 1) is shown and described in detail. In step 902, the top header is routed and printed in order to form the top portion of the windings for the inductive device. The routing and printing of substrates, such as fiber-glass based substrates, are well known. In a first exemplary process for the routing and printing of the top header, vias are typically drilled with tiny drill bits made of solid tungsten carbide or another suitable material. The drilling is typically performed by an automated drilling machine which places the vias in precise locations. In certain embodiments where very small vias are required, drilling with mechanical bits can be costly due to high rates of wear and breakage. In these cases, the vias may be 'evaporated' via the use of lasers as is well-known in the art. Other techniques of providing vias (including at the time of molding or formation of the parent substrate/header) may be used as well.

The walls of these drilled or formed holes, for substrates with 2 or more layers, are then plated with copper or another material or alloy to form plated-through-holes that electrically connect the conducting layers of the header substrate thereby forming the portions of the windings resident between the top and bottom surface of the header. In one embodiment, the material used to form the plated portions of the through-holes is extended past the surface of the header. The top windings 104 can be printed using any number of well-known additive or subtractive processes. The three most common of the subtractive processes utilized are: (1) silk screen printing which typically uses an etch-resistant ink to protect the copper plating on the substrate—subsequent etching processes remove the unwanted copper plating; (2) photoengraving, which uses a "photo mask" and a chemical etching process to remove the copper foil from the substrate; and (3) PCB milling, that uses a 2 or 3 axis mechanical milling system to mill away the copper layers from the substrate, however this latter process is not typically used for mass produced products. So-called additive processes such as laser direct structuring can also be utilized. These processes are well known to those of ordinary skill and readily applied in the present invention given this disclosure, and as such will not be discussed further herein.

In step 904, the bottom header is routed and printed, similar to those processing steps discussed with regards to step 902 above. At step 906, the core is placed between the top and bottom headers.

At step 908, the top and bottom headers are joined thereby forming windings about the placed core. Many possibilities for the joining of the top and bottom headers exist. One exemplary method comprises adding ball grid array ("BGA") type solder balls on the inner and outer vias of e.g. the bottom header. The top header is then placed (and optionally clamped) on top of the bottom header and a solder reflow process such as an IR reflow process utilized to join the top and bottom headers. For example, a stencil print process and reflow can be used, as could an ultrasonic welding technique, or even use of conductive adhesives (thereby obviating reflow).

At step 910, the joined assembly is tested to ensure that proper connections have been made and the part functions as it should.

It will be appreciated that the aforementioned method of wireless toroidal inductive device assembly may be utilized for the formation of single as well as multiple toroidal devices with few adaptations. Further, it will be recognized that in the two-piece embodiment, requiring only one header, the steps for forming and joining the second header are obviated in favor of placing windings on the surface of the toroidal core or on a copper band which is run across the toroidal core.

Figure 9B:
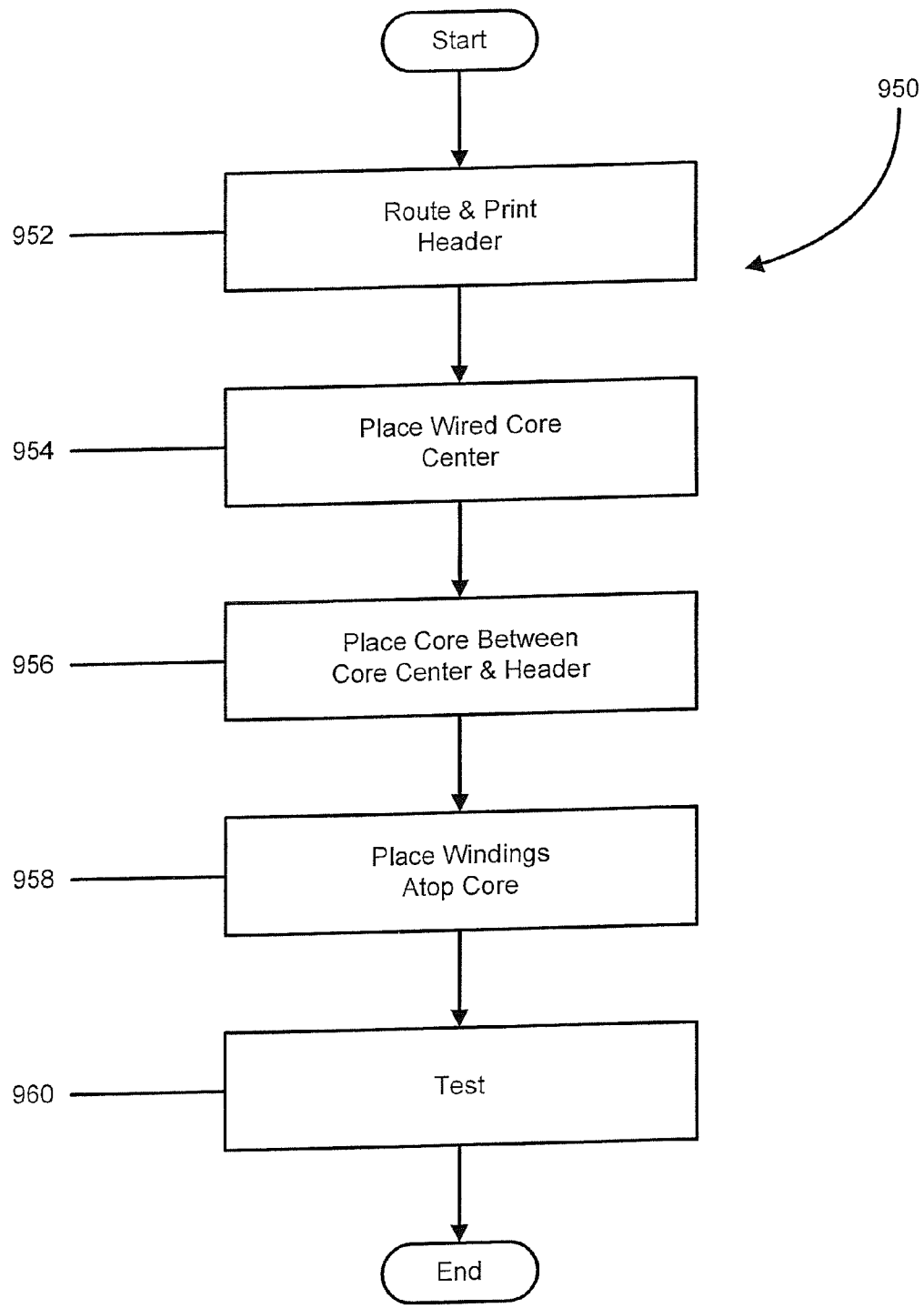
FIG. 9b is a logical flow diagram illustrating a second exemplary method for manufacturing a partially wired inductive device produced in accordance with the principles of the present invention.
Figure 10:
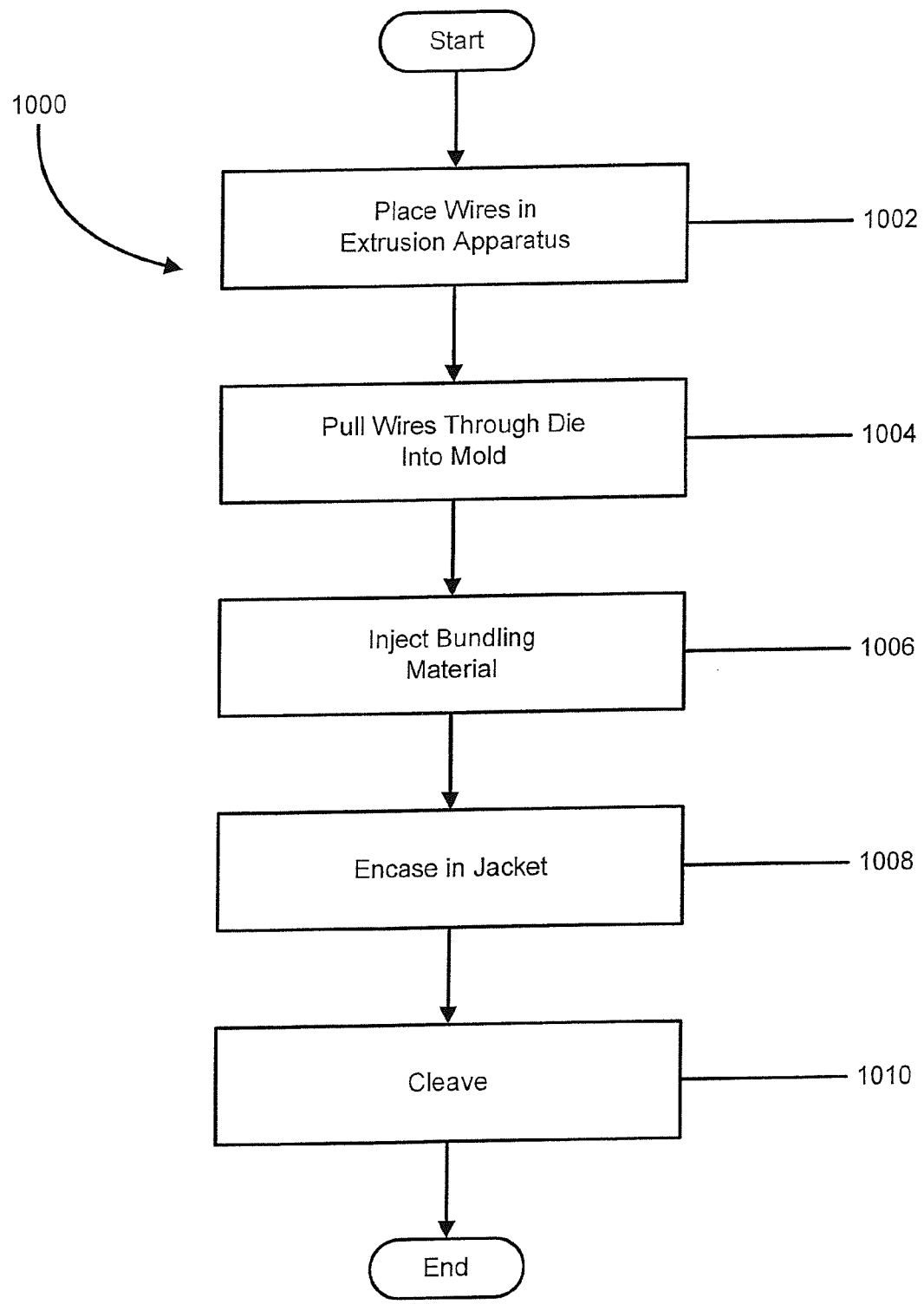

Referring now to FIG. 9b, a second exemplary method 950 of manufacturing a partially wired inductive device 200 (such as that shown in FIG. 2) is disclosed and described. At step 952, the header is routed and printed similar to step 902 previously discussed above with the exception that only outer winding vias are drilled/formed, plated, and/or extended, there is no need for inner winding vias in this embodiment.

At step 954 a wired core center is placed in a cavity of the header. The wired core center is connected to windings distributed on the header. The manufacture of the wired core center will be described in detail below.

At step 956, the core is placed within a cavity of the header.

Per step 958, the top windings are next placed atop the core. The windings may be either placed directly on the surface of the core, or may be placed on a copper band which is then placed atop the core.

At step 960, the assembly is optionally tested and is then ready for mounting on a customer's product such as a printed circuit board within a communications system, etc.

Methods of Manufacture Wired Core Centers—

Figure 10:
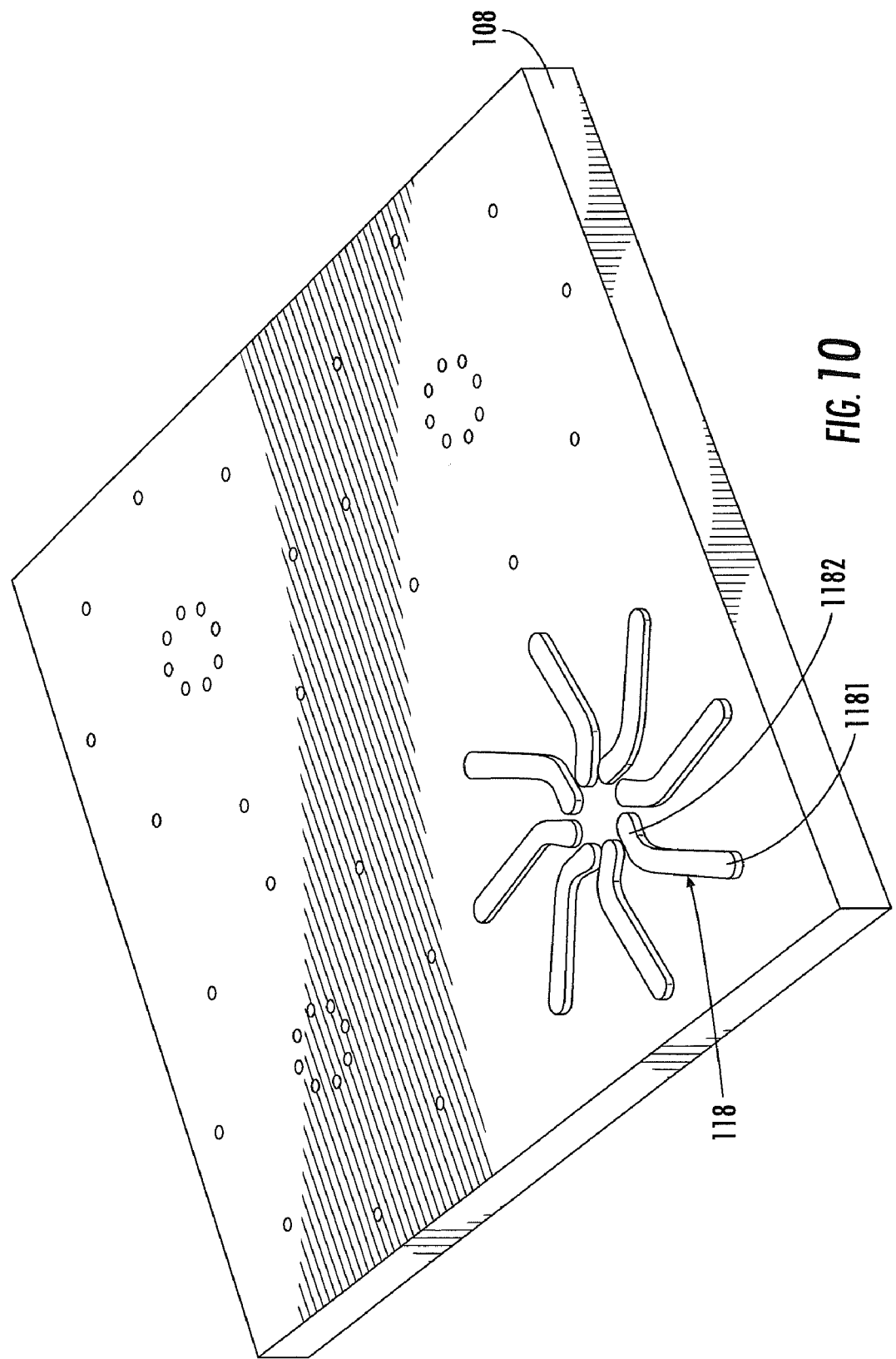
FIG. 10 is a logical flow diagram illustrating an exemplary method for manufacturing a wired core center for use in a partially wired inductive device in accordance with the principles of the present invention.

An exemplary method 1000 of manufacturing the wired core centers 202 of partially wired inductive devices 200 (described above with regard to FIG. 2-2f) is now described in detail as illustrated in FIG. 10.

As per step 1002, the magnet wires are first placed in an extrusion apparatus.

In step 1004, the wires are pulled through a die and into a mold. The mold will determine the placement of the wires with respect to one another, for example, the mold may form the wires into concentric circles within the bundle, or in another example, the mold may form the wires into a precisely spaced arrangement. It will be appreciated that a multiplicity of configurations of the wires may be formed depending on the mold structure. For example, as previously discussed, placing the wires in closer (or farther) proximity to one another enable the modification of the electrical characteristics of the device due to capacitive effects.

At step 1006, bundling material is injected into the mold containing the smaller diameter wires. The bundling material may be plastic or any other suitable material of appropriate character.

At step 1008, the bundled wires are encased in a jacket. The jacket may be of the material described above, or may comprise a material further adapted to increase withstand testing.

Finally, at step 1010, the jacketed, bundled wires are cleaved or sewn into small cylindrical portions which will be placed into the toroidal core of an inductive device.

It will further be appreciated that the exemplary devices 100, 200 described herein are amenable to mass-production methods. For example, in one embodiment, a plurality of devices are formed in parallel using a common header material sheet or assembly. These individual devices are then singulated from the common assembly by, e.g., dicing, cutting, breaking pre-made connections, etc. In one variant, the top and bottom headers 104, 106 of each device are formed within common sheets or layers of, e.g., LTCC or FR-4, and the termination pads are disposed on the exposed bottom or top surfaces of each device (such as via a stencil plating or comparable procedure). The top and bottom header "sheets" are then immersed in an electroplate solution to plate out the vias, and the winding portions 108/208 formed on all devices simultaneously. The toroid cores are then inserted between the sheets, and the two sheets reflowed or otherwise bonded as previously described, thereby forming a number of devices in parallel. The devices are then singulated, forming a plurality of individual devices. This approach allows for a high degree of manufacturing efficiency and process consistency, thereby lowering manufacturing costs and attrition due to process variations.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A method of manufacturing an inductive device, said method comprising:
    providing at least three substrates comprising a top substrate, a bottom substrate and one or more middle substrates, at least one of said at least three substrates comprised of an exterior surface which is at least partly copper plated, with said at least one substrate having one or more windings formed thereon;
    disposing a plurality of conductors in the at least one of said three substrates, said conductors disposed so as to extend from said exterior copper plated surface and substantially through at least one or more said substrates;
    disposing a magnetically permeable core at least partly between two or more of said at least three substrates;
    disposing a second magnetically permeable core at least partly between two or more of said at least three substrates; and
    disposing an incorporated electronic component onto at least one of said at least three substrates;

wherein said second magnetically permeable core in combination with said at least three substrates, said conductors, said incorporated electronic component, and said magnetically permeable core, form a complete filter circuit.

2. The method of claim 1, further comprising forming the one or more windings and said plurality of conductors in said at least one substrate such that said conductors are physically separated from said magnetically permeable core when said inductive device is assembled.

3. The method of claim 1, wherein said incorporated electronic component comprises a capacitive structure, said capacitive structure formed at least in part by disposing a plurality of capacitive surfaces on said at least one of said plurality of substrates, said plurality of capacitive surfaces being placed substantially parallel to one another.

4. A method of manufacturing an inductive device, said method comprising:
  providing a pair of substrates, each comprised of an exterior surface which is at least partly plated, with copper or a copper alloy, each of said substrates having one or more windings formed thereon;
  incorporating an electronic component onto at least one of said pair of substrates;
  disposing a plurality of conductors, at least a portion of said plurality of conductors extending from said exterior plated surface and substantially through said substrate;
  disposing one or more magnetically permeable core(s) at least partly between said pair of substrates; and
  disposing a second magnetically permeable core, said second magnetically permeable core in combination with said substrates, said conductors, said incorporated electronic component, and other ones of said one or more magnetically permeable core(s), forming a complete filter circuit;
  wherein said pair of substrates are spaced apart a first distance, said one or more windings in combination with said one or more magnetically permeable core(s) and said conductors forming said inductive device.

5. The method of claim 4, further comprising forming the one or more windings and said plurality of conductors such that said plurality of conductors are physically separated from said one or more magnetically permeable core(s).

6. The method of claim 4, further comprising applying an insulative coating to said one or more magnetically permeable cores to improve electrical isolation between the one or more cores and adjacent ones of said conductors.

7. The method of claim 4, further comprising forming at least one through-hole via in said pair of substrates.

8. The method of claim 4, wherein said incorporated electronic component is modeled into at least one of said pair of substrates.

9. The method of claim 4, wherein said incorporated electronic component comprises a discrete electronic component mounted on a discrete mounting location on at least one of said pair of substrates.

10. The method of claim 9, wherein said one or more magnetically permeable core(s) comprise non-toroidal magnetically permeable cores.

11. The method of claim 4, wherein said one or more magnetically permeable core(s) comprise non-toroidal magnetically permeable cores.

12. The method of claim 4, further comprising applying a vapor phase deposited insulative coating on at least a portion of said conductors to improve electrical isolation between the one or more cores and adjacent ones of said conductors.

13. A method of manufacturing a partially wired inductive device, said method comprising:
  providing a plurality of substrates, each of said substrates having one or more conductive pathways disposed thereon;
  molding a bundle of magnet wires to form a wired core center;
  disposing said molded bundle of magnet wires at least partly between said plurality of printable substrates; and
  disposing a magnetically permeable core at least partly between said plurality of printable substrates.

14. The method of claim 13, further comprising forming a plurality of outer winding vias onto each of said plurality of substrates.

15. The method of claim 14, further comprising disposing a plurality of extended conductors onto said substrates, at least a portion of said plurality of extended conductors interconnecting said plurality of substrates.

16. The method of claim 14, wherein said plurality of outer winding vias are formed such that said outer winding vias are in electrical communication with said wired core center via said one or more conductive pathways formed on said plurality of substrates.

17. A method of manufacturing an integrated inductive device electronics assembly, said method comprising:
  obtaining a plurality of substrates, at least two of said substrates each comprised of an exterior surface which is at least partly plated with copper or a copper alloy, said at least two substrates having one or more windings formed thereon;
  wherein an electronic component receiving pad is disposed on at least one of said plurality of substrates;
  disposing an electronic component onto said electronic component receiving pad;
  disposing a plurality of conductors, at least a portion of said plurality of conductors formed to extend from said exterior plated surface and substantially through said respective substrate; and
  disposing a plurality of magnetically permeable cores at least partly between said at least two substrates;
  wherein said at least two substrates are spaced apart a first distance, with said one or more windings, said plurality of magnetically permeable cores, said electronic component, and said conductors collectively comprising said integrated inductive device electronics assembly.

18. The method of claim 17, wherein said integrated inductive device electronics assembly comprises a modular jack.

19. The method of claim 18, wherein said integrated inductive device electronics assembly comprises a gigabit ethernet (GBE) electronic circuit.

20. The method of claim 19, further comprising forming through hole vias in said at least two substrates.

21. The method of claim 20, wherein at least a portion of said plurality of magnetically permeable cores comprise non-toroidal magnetically permeable cores.

22. The method of claim 21, further comprising applying a vapor phase deposited insulative coating to improve electrical isolation between the plurality of cores and adjacent ones of said conductors.

* * * * *